United States Patent
Kwong et al.

(10) Patent No.: US 9,190,623 B2
(45) Date of Patent: Nov. 17, 2015

(54) ORGANIC ELECTROLUMINESCENT MATERIALS AND DEVICES

(71) Applicant: Universal Display Corporation, Ewing, NJ (US)

(72) Inventors: Raymond Kwong, Shatin (HK); Chuanjun Xia, Lawrenceville, NJ (US); Jason Brooks, Philadelphia, PA (US); Siu Tung Lam, Apleichau (HK); Chi Hang Lee, Chaiwan (HK)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 330 days.

(21) Appl. No.: 13/682,504

(22) Filed: Nov. 20, 2012

(65) Prior Publication Data

US 2014/0138627 A1 May 22, 2014

(51) Int. Cl.
   *H01L 51/50* (2006.01)
   *H01L 51/00* (2006.01)

(52) U.S. Cl.
   CPC ........ *H01L 51/5004* (2013.01); *H01L 51/0059* (2013.01); *H01L 51/0061* (2013.01); *H01L 51/0072* (2013.01); *H01L 51/0067* (2013.01); *H01L 51/5012* (2013.01); *H01L 2251/552* (2013.01)

(58) Field of Classification Search
   None
   See application file for complete search history.

(56) References Cited

U.S. PATENT DOCUMENTS

| | | |
|---|---|---|
| 4,769,292 A | 9/1988 | Tang et al. |
| 5,061,569 A | 10/1991 | VanSlyke et al. |
| 5,247,190 A | 9/1993 | Friend et al. |
| 5,703,436 A | 12/1997 | Forrest et al. |
| 5,707,745 A | 1/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |

(Continued)

FOREIGN PATENT DOCUMENTS

| | | |
|---|---|---|
| EP | 0650955 | 5/1995 |
| EP | 1725079 | 11/2006 |

(Continued)

OTHER PUBLICATIONS

Adachi, Chihaya et al., "Organic Electroluminescent Device Having a Hole Conductor as an Emitting Layer," Appl. Phys. Lett., 55(15): 1489-1491 (1989).

(Continued)

*Primary Examiner* — Gregory Clark
(74) *Attorney, Agent, or Firm* — Duane Morris LLP

(57) ABSTRACT

Novel devices containing organic compounds containing electron donor and acceptor characteristics and that act as emissive dopants are provided. The energy ratio obtained by dividing the T1 energy of the emissive dopant by $\Delta E_{HOMO\text{-}LUMO}$ for the same emissive dopant is at least 0.7 and the first emissive dopant has an energy difference calculated by subtracting the T1 energy of the first emissive dopant from $\Delta E_{HOMO\text{-}LUMO}$ for the first emissive dopant and the energy difference is at smaller than or equal to 1.00 eV for the novel compounds. The compounds exhibit delayed fluorescence properties when incorporated into OLED devices.

26 Claims, 7 Drawing Sheets

(56) References Cited

U.S. PATENT DOCUMENTS

| | | |
|---|---|---|
| 6,294,398 B1 | 9/2001 | Kim et al. |
| 6,303,238 B1 | 10/2001 | Thompson et al. |
| 6,337,102 B1 | 1/2002 | Forrest et al. |
| 6,468,819 B1 | 10/2002 | Kim et al. |
| 6,528,187 B1 | 3/2003 | Okada |
| 6,687,266 B1 | 2/2004 | Ma et al. |
| 6,717,358 B1* | 4/2004 | Liao et al. ............ 313/504 |
| 6,835,469 B2 | 12/2004 | Kwong et al. |
| 6,921,915 B2 | 7/2005 | Takiguchi et al. |
| 7,087,321 B2 | 8/2006 | Kwong et al. |
| 7,090,928 B2 | 8/2006 | Thompson et al. |
| 7,154,114 B2 | 12/2006 | Brooks et al. |
| 7,250,226 B2 | 7/2007 | Tokito et al. |
| 7,279,704 B2 | 10/2007 | Walters et al. |
| 7,332,232 B2 | 2/2008 | Ma et al. |
| 7,338,722 B2 | 3/2008 | Thompson et al. |
| 7,393,599 B2 | 7/2008 | Thompson et al. |
| 7,396,598 B2 | 7/2008 | Takeuchi et al. |
| 7,431,968 B1 | 10/2008 | Shtein et al. |
| 7,445,855 B2 | 11/2008 | Mackenzie et al. |
| 7,534,505 B2 | 5/2009 | Lin et al. |
| 2002/0034656 A1 | 3/2002 | Thompson et al. |
| 2002/0134984 A1 | 9/2002 | Igarashi |
| 2002/0158242 A1 | 10/2002 | Son et al. |
| 2003/0138657 A1 | 7/2003 | Li et al. |
| 2003/0151042 A1 | 8/2003 | Hueschen |
| 2003/0152802 A1 | 8/2003 | Tsuboyama et al. |
| 2003/0175553 A1 | 9/2003 | Thompson et al. |
| 2003/0230980 A1 | 12/2003 | Forrest et al. |
| 2004/0036077 A1 | 2/2004 | Ise |
| 2004/0137267 A1 | 7/2004 | Igarashi et al. |
| 2004/0137268 A1 | 7/2004 | Igarashi et al. |
| 2004/0174116 A1 | 9/2004 | Lu et al. |
| 2005/0025993 A1 | 2/2005 | Thompson et al. |
| 2005/0112407 A1 | 5/2005 | Ogasawara et al. |
| 2005/0238919 A1 | 10/2005 | Ogasawara |
| 2005/0244673 A1 | 11/2005 | Satoh et al. |
| 2005/0260441 A1 | 11/2005 | Thompson et al. |
| 2005/0260449 A1 | 11/2005 | Walters et al. |
| 2006/0008670 A1 | 1/2006 | Lin et al. |
| 2006/0202194 A1 | 9/2006 | Jeong et al. |
| 2006/0240279 A1 | 10/2006 | Adamovich et al. |
| 2006/0251923 A1 | 11/2006 | Lin et al. |
| 2006/0263635 A1 | 11/2006 | Ise |
| 2006/0280965 A1 | 12/2006 | Kwong et al. |
| 2007/0190359 A1 | 8/2007 | Knowles et al. |
| 2007/0278938 A1 | 12/2007 | Yabunouchi et al. |
| 2008/0015355 A1 | 1/2008 | Schafer et al. |
| 2008/0018221 A1 | 1/2008 | Egen et al. |
| 2008/0106190 A1 | 5/2008 | Yabunouchi et al. |
| 2008/0124572 A1 | 5/2008 | Mizuki et al. |
| 2008/0220265 A1 | 9/2008 | Xia et al. |
| 2008/0297033 A1 | 12/2008 | Knowles et al. |
| 2009/0008605 A1 | 1/2009 | Kawamura et al. |
| 2009/0009065 A1 | 1/2009 | Nishimura et al. |
| 2009/0017330 A1 | 1/2009 | Iwakuma et al. |
| 2009/0030202 A1 | 1/2009 | Iwakuma et al. |
| 2009/0039776 A1 | 2/2009 | Yamada et al. |
| 2009/0045730 A1 | 2/2009 | Nishimura et al. |
| 2009/0045731 A1 | 2/2009 | Nishimura et al. |
| 2009/0101870 A1 | 4/2009 | Prakash et al. |
| 2009/0108737 A1 | 4/2009 | Kwong et al. |
| 2009/0115316 A1 | 5/2009 | Zheng et al. |
| 2009/0165846 A1 | 7/2009 | Johannes et al. |
| 2009/0167162 A1 | 7/2009 | Lin et al. |
| 2009/0179554 A1 | 7/2009 | Kuma et al. |
| 2010/0314615 A1* | 12/2010 | Mizuki et al. ............ 257/40 |

FOREIGN PATENT DOCUMENTS

| | | |
|---|---|---|
| EP | 2034538 | 3/2009 |
| JP | 200511610 | 1/2005 |
| JP | 2007123392 | 5/2007 |
| JP | 2007254297 | 10/2007 |
| JP | 2008074939 | 4/2008 |
| WO | 0139234 | 5/2001 |
| WO | 0202714 | 1/2002 |
| WO | 0215645 | 2/2002 |
| WO | 03040257 | 5/2003 |
| WO | 03060956 | 7/2003 |
| WO | 2004093207 | 10/2004 |
| WO | 2004107822 | 12/2004 |
| WO | 2005014551 | 2/2005 |
| WO | 2005019373 | 3/2005 |
| WO | 2005030900 | 4/2005 |
| WO | 2005089025 | 9/2005 |
| WO | 2005123873 | 12/2005 |
| WO | 2006009024 | 1/2006 |
| WO | 2006056418 | 6/2006 |
| WO | 2006072002 | 7/2006 |
| WO | 2006082742 | 8/2006 |
| WO | 2006098120 | 9/2006 |
| WO | 2006100298 | 9/2006 |
| WO | 2006103874 | 10/2006 |
| WO | 2006114966 | 11/2006 |
| WO | 2006132173 | 12/2006 |
| WO | 2007002683 | 1/2007 |
| WO | 2007004380 | 1/2007 |
| WO | 2007063754 | 6/2007 |
| WO | 2007063796 | 6/2007 |
| WO | 2008056746 | 5/2008 |
| WO | 2008101842 | 8/2008 |
| WO | 2008132085 | 11/2008 |
| WO | 2009000673 | 12/2008 |
| WO | 2009003898 | 1/2009 |
| WO | 2009008311 | 1/2009 |
| WO | 2009018009 | 2/2009 |
| WO | 2009050290 | 4/2009 |
| WO | 2009021126 | 5/2009 |
| WO | 2009062578 | 5/2009 |
| WO | 2009063833 | 5/2009 |
| WO | 2009066778 | 5/2009 |
| WO | 2009066779 | 5/2009 |
| WO | 2009086028 | 7/2009 |
| WO | 2009100991 | 8/2009 |

OTHER PUBLICATIONS

Adachi, Chihaya et al., "Nearly 100% Internal Phosphorescence Efficiency in an Organic Light Emitting Device," J. Appl. Phys., 90(10): 5048-5051 (2001).

Adachi, Chihaya et al., "High-Efficiency Red Electrophosphorescence Devices," Appl. Phys. Lett., 78(11)1622-1624 (2001).

Aonuma, Masaki et al., "Material Design of Hole Transport Materials Capable of Thick-Film Formation in Organic Light Emitting Diodes," Appl. Phys. Lett., 90:183503-1-183503-3.

Baldo et al., Highly Efficient Phosphorescent Emission from Organic Electroluminescent Devices, Nature, vol. 395, 151-154, (1998).

Baldo et al., Very high-efficiency green organic light-emitting devices based on electrophosphorescence, Appl. Phys. Lett, vol. 75, No. 3, 4-6 (1999).

Gao, Zhiqiang et al., "Bright-Blue Electroluminescence From a Silyl-Substituted ter-(phenylene-vinylene) derivative," Appl. Phys. Lett., 74(6): 865-867 (1999).

Guo, Tzung-Fang et al., "Highly Efficient Electrophosphorescent Polymer Light-Emitting Devices," Organic Electronics, 115-20 (2000).

Hamada, Yuji et al., "High Luminance in Organic Electroluminescent Devices with Bis(10-hydroxybenzo[h]quinolinato) beryllium as an Emitter, " Chem. Lett., 905-906 (1993).

Holmes, R.J. et al., "Blue Organic Electrophosphorescence Using Exothermic Host-Guest Energy Transfer," Appl. Phys. Lett., 82(15):2422-2424 (2003).

Hu, Nan-Xing et al., "Novel High Tg Hole-Transport Molecules Based on Indolo[3,2-b]carbazoles for Organic Light-Emitting Devices," Synthetic Metals, 111-112:421-424 (2000).

Huang, Jinsong et al., "Highly Efficient Red-Emission Polymer Phosphorescent Light-Emitting Diodes Based on Two Novel Tris(1-phenylisoquinolinato-C2,N)iridium(III) Derivates," Adv. Mater, 19:739-743 (2007).

(56) References Cited

OTHER PUBLICATIONS

Huang, Wei-Sheng et al., "Highly Phosphorescent Bis-Cyclometalated Iridium Complexes Containing Benzoimidazole-Based Ligands," Chem. Mater, 16(12):2480-2488 (2004).
Hung, L.S. et al., "Anode Modification in Organic Light-Emitting Diodes by Low-Frequency Plasma Polymerization of CHF3," Appl. Phys. Lett, 78(5):673-675 (2001).
Ikai, Masamichi and Tokito, Shizuo, "Highly Efficient Phosphorescence From Organic Light-Emitting Devices with an Exciton-Block Layer," Appl. Phys. Lett., 79(2):156-158 (2001).
Ikeda, Hisao et al., "P-185 Low-Drive-Voltage OLEDs with a Buffer Layer Having Molybdenum Oxide," SID Symposium Digest, 37:923-926 (2006).
Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).
Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).
Kido, Junji et al., 1,2,4-Triazole Derivative as an Electron Transport Layer in Organic Electroluminescent Devices, Jpn. J. Appl. Phys., 32:L917-L920 (1993).
Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino) triphenylamine (m-MTDATA), as Hole-Transport Materials," Adv. Mater., 6(9):677-679 (1994).
Kwong, Raymond C. et al., "High Operational Stability of Electrophosphorescent Devices," Appl. Phys. Lett., 81(1) 162-164 (2002).
Lamansky, Sergey et al., "Synthesis and Characterization of Phosphorescent Cyclometalated Iridium Complexes," Inorg. Chem., 40(7):1704-1711 (2001).
Lee, Chang-Lyoul et al., "Polymer Phosphorescent Light-Emitting Devices Doped with Tris(2-phenylpyridine) Iridium as a Triplet Emitter," Appl. Phys. Lett., 77(15)2280-2282 (2000).
Lo, Shih-Chun et al., "Blue Phosphorescence from Iridium(III) Complexes at Room Temperature," Chem. Mater., 18 (21)5119-5129 (2006).
Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).
Mi, Bao-Xiu et al., "Thermally Stable Hole-Transporting Material for Organic Light-Emitting Diode an Isoindole Derivative," Chem. Mater., 15(16):3148-3151 (2003).
Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).
Niu, Yu-Hua et al., "Highly Efficient Electrophosphorescent Devices with Saturated Red Emission from a Neutral Osmium Complex," Chem. Mater., 17(13):3532-3536 (2005).
Noda, Tetsuya and Shirota,Yasuhiko, "5,5'-Bis(dimesitylboryl)-2,2'-bithiophene and 5,5"-Bis(dimesitylboryl)-2,2'5',2"-terthiophene as a Novel Family of Electron-Transporting Amorphous Molecular Materials," J. Am. Chem. Soc., 120 (37):9714-9715 (1998).
Okumoto, Kenji et al., "Green Fluorescent Organic Light-Emitting Device with External Quantum Efficiency of Nearly 10%," Appl. Phys. Lett., 89:063504-1-063504-3 (2006).
Palilis, Leonidas C., "High Efficiency Molecular Organic Light-Emitting Diodes Based on Silole Derivatives and Their Exciplexes," Organic Electronics, 4:113-121 (2003).
Paulose, Betty Marie Jennifer S. et al., "First Examples of Alkenyl Pyridines as Organic Ligands for Phosphorescent Iridium Complexes," Adv. Mater., 16(22):2003-2007 (2004).
Ranjan, Sudhir et al., "Realizing Green Phosphorescent Light-Emitting Materials from Rhenium(I) Pyrazolato Diimine Complexes," Inorg. Chem., 42(4):1248-1255 (2003).
Sakamoto, Youichi et al., "Synthesis, Characterization, and Electron-Transport Property of Perfluorinated Phenylene Dendrimers," J. Am. Chem. Soc., 122(8):1832-1833 (2000).
Salbeck, J. et al., "Low Molecular Organic Glasses for Blue Electroluminescence," Synthetic Metals, 91209-215 (1997).
Shirota, Yasuhiko et al., "Starburst Molecules Based on p-Electron Systems as Materials for Organic Electroluminescent Devices," Journal of Luminescence, 72-74:985-991 (1997).
Sotoyama, Wataru et al., "Efficient Organic Light-Emitting Diodes with Phosphorescent Platinum Complexes Containing NCN-Coordinating Tridentate Ligand," Appl. Phys. Lett., 86:153505-1-153505-3 (2005).
Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
T. Östergård et al., "Langmuir-Blodgett Light-Emitting Diodes of Poly(3-Hexylthiophene) Electro-Optical Characteristics Related to Structure," Synthetic Metals, 87:171-177 (1997).
Takizawa, Shin-ya et al., "Phosphorescent Iridium Complexes Based on 2-Phenylimidazo[1,2- α]pyridine Ligands Tuning of Emission Color toward the Blue Region and Application to Polymer Light-Emitting Devices," Inorg. Chem., 46(10):4308-4319 (2007).
Tang, C.W. and VanSlyke, S.A., "Organic Electroluminescent Diodes," Appl. Phys. Lett., 51(12):913-915 (1987).
Tung, Yung-Liang et al., "Organic Light-Emitting Diodes Based on Charge-Neutral Ru II PHosphorescent Emitters," Adv. Mater., 17(8)1059-1064 (2005).
Van Slyke, S. A. et al., "Organic Electroluminescent Devices with Improved Stability," Appl. Phys. Lett, 69 (15):2160-2162 (1996).
Wang, Y. et al., "Highly Efficient Electroluminescent Materials Based on Fluorinated Organometallic Iridium Compounds," Appl. Phys. Lett., 79(4):449-451 (2001).
Wong, Keith Man-Chung et al., A Novel Class of Phosphorescent Gold(III) Alkynyl-Based Organic Light-Emitting Devices with Tunable Colour, Chem. Commun., 2906-2908 (2005).
Wong, Wai-Yeung, "Multifunctional Iridium Complexes Based on Carbazole Modules as Highly Efficient Electrophosphors," Angew. Chem. Int. Ed., 45:7800-7803 (2006).

* cited by examiner

Formula I

ORGANIC ELECTROLUMINESCENT MATERIALS AND DEVICES

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic compounds having strong electron donor and weak electron acceptor characteristics within the same molecule. These compounds display delayed fluorescence characteristics when incorporated into OLED devices.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted $Ir(ppy)_3$, which has the following structure:

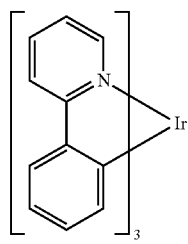

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

A first device is provided. The first device comprises a first organic light emitting device, further comprising an anode, a cathode, and an emissive layer, disposed between the anode and the cathode, comprising a first emissive dopant. The first emissive dopant is organic and non-metal containing, and comprises an electron donor and an electron acceptor moiety. The first emissive dopant has a calculated HOMO energy higher than or equal to −4.70 eV and a calculated LUMO energy higher than or equal to −1.20 eV. The first emissive dopant has an energy ratio calculated by dividing the T1 energy of the first emissive dopant by $\Delta E_{HOMO-LUMO}$ for the first emissive dopant, and wherein the energy ratio is at least 0.70. The first emissive dopant also has an energy difference calculated by subtracting the T1 energy of the first emissive dopant from $\Delta E_{HOMO-LUMO}$ for the first emissive dopant and the energy difference is at smaller than or equal to 1.00 eV.

In one aspect, the energy difference is smaller than or equal to 0.90 eV.

In one aspect, the energy the energy ratio is at least 0.73 and the energy difference is at smaller than or equal to 0.90 eV.

In one aspect, the energy ratio is at least 0.73.

In one aspect, the first emissive dopant has the formula:

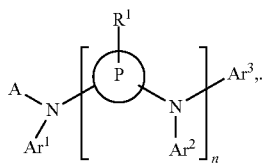

Formula I

In the compound of Formula I, A represents an aromatic carbocyclic or heterocyclic moiety with at least two fused aromatic carbocyclic or heterocyclic rings, and ring P is an aromatic carbocyclic or heterocyclic ring. $Ar^1$, $Ar^2$, and $Ar^3$ are aryl or heteroaryl, and are optionally further substituted. Rings A, $Ar^1$, $Ar^2$, and $Ar^3$ are optionally fused. $R^1$ represents mono-, di-, tri-, or tetra-substitution, or no substitution. $R^1$ is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, and n is an integer from 1 to 10.

In one aspect, A has the formula:

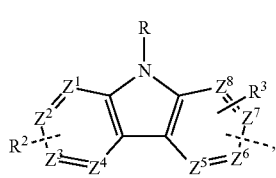

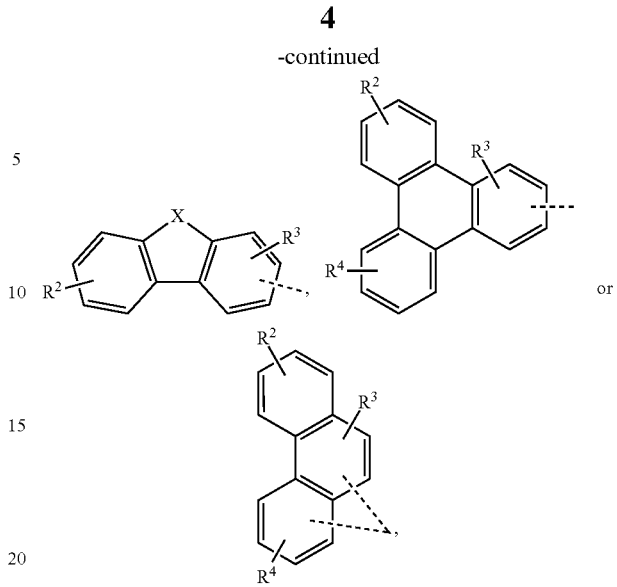

wherein X is O, S, or Se, $Z^1$ to $Z^8$ independently comprise C or N, and the total number of N in $Z^1$ to $Z^8$ is at most 1. R is selected from the group consisting of alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof. $R^2$ represents mono-, di-, tri-, or tetra-substitution, or no substitution, $R^3$ represents mono-, di- or tri-substitution, or no substitution, and $R^4$ represents mono-, di-, tri-, or tetra-substitution, or no substitution. $R^2$, $R^3$, and $R^4$ are independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, the first emissive dopant has the formula:

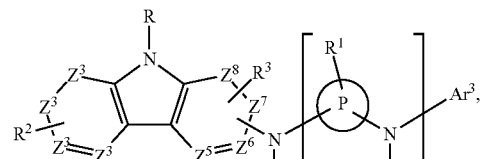

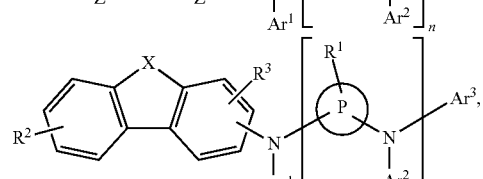

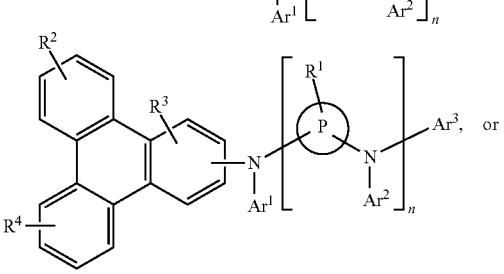

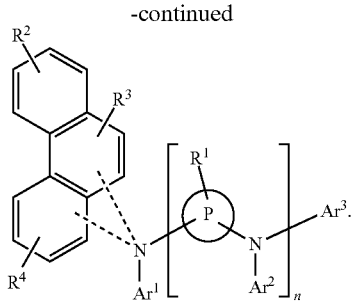

In one aspect, Ar¹, Ar², and Ar³ are independently selected from the group consisting of phenyl and triphenylene. In one aspect n is 2.

In one aspect, ring P Ar¹, Ar², and Ar³ are phenyl. In one aspect, X is NR and wherein R is aryl or heteroaryl. In one aspect, X is O. In one aspect, X is S.

In one aspect, the first emissive dopant is selected from the group consisting of:

Compound 1

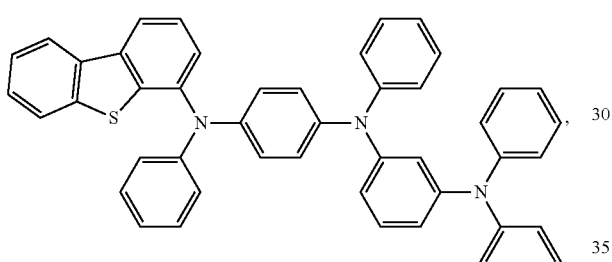

Compound 2

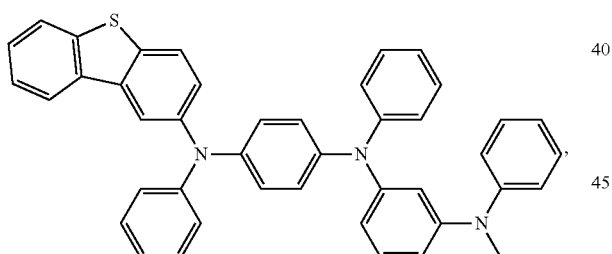

Compound 3

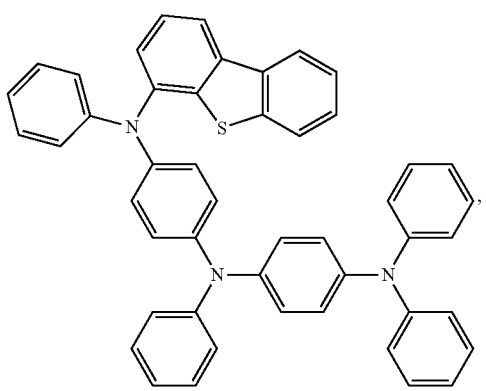

Compound 4

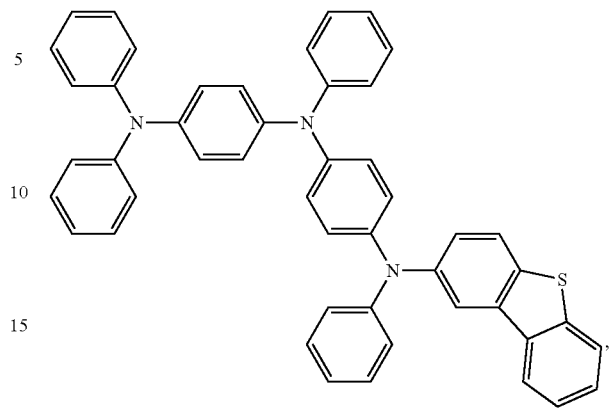

Compound 5

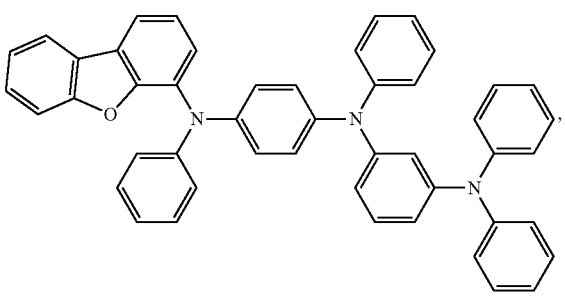

Compound 6

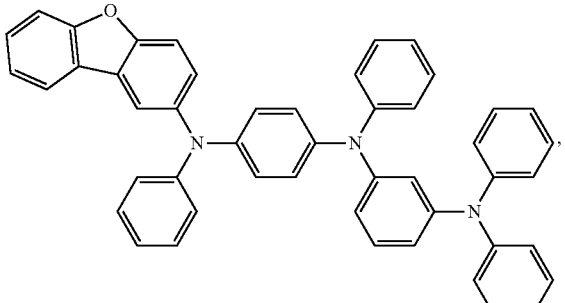

Compound 7

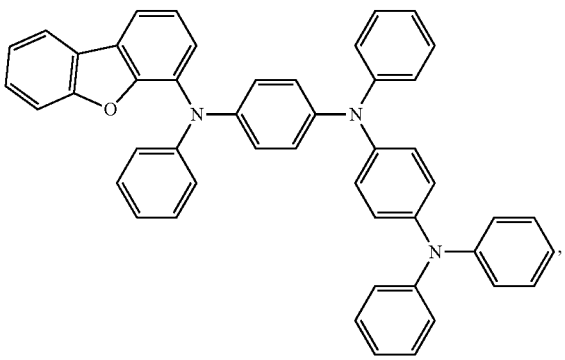

Compound 8
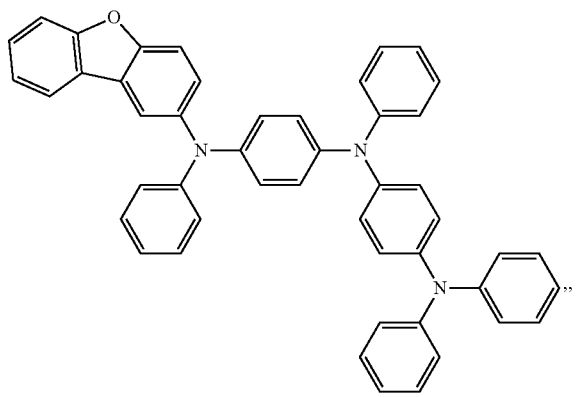
Compound 9
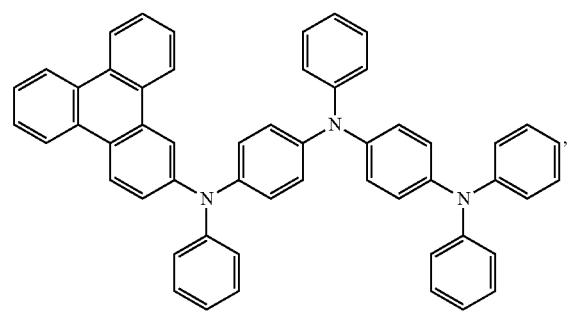
Compound 10
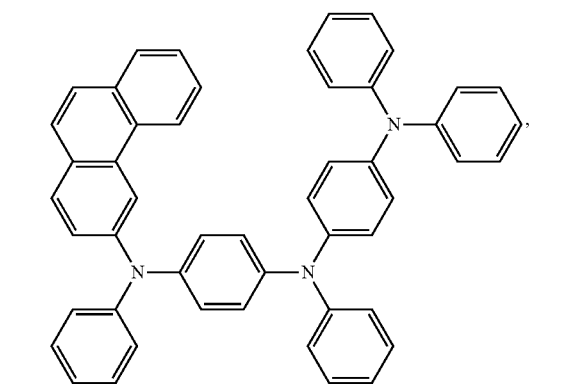
Compound 11
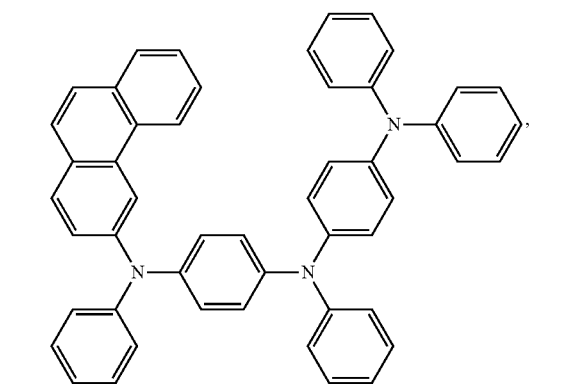
Compound 12
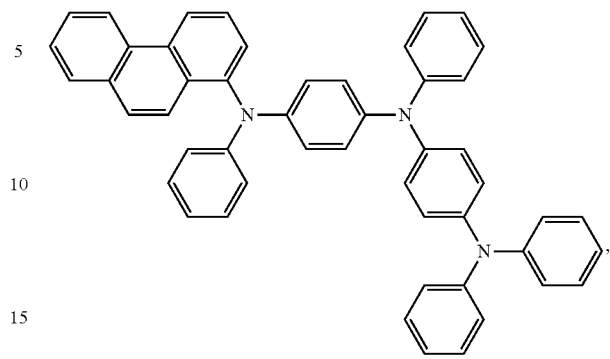
Compound 13
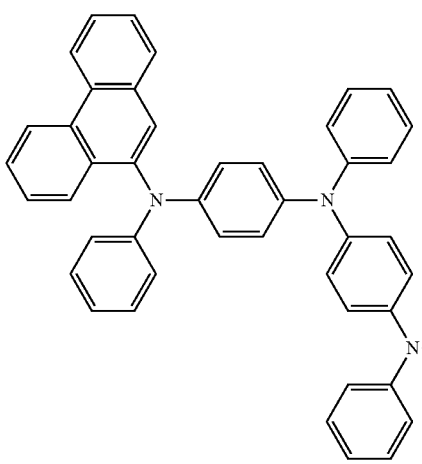
Compound 14
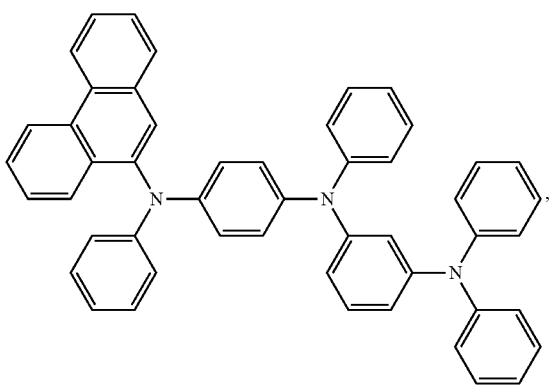

Compound 20
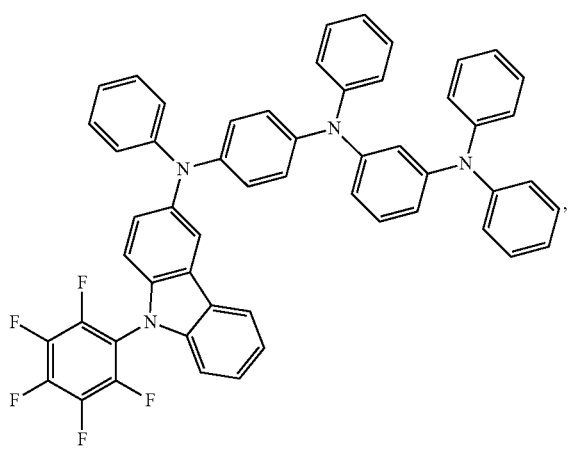
Compound 43
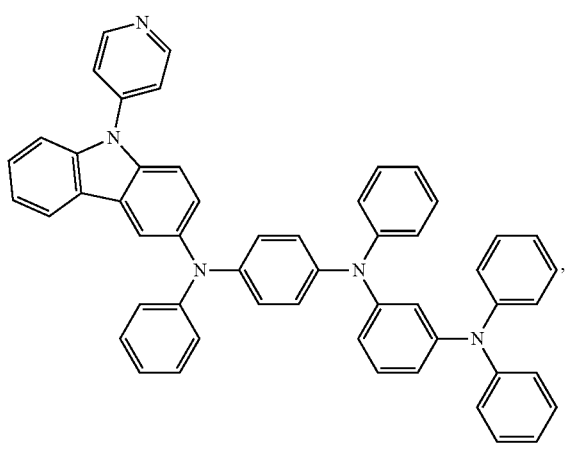
Compound 41
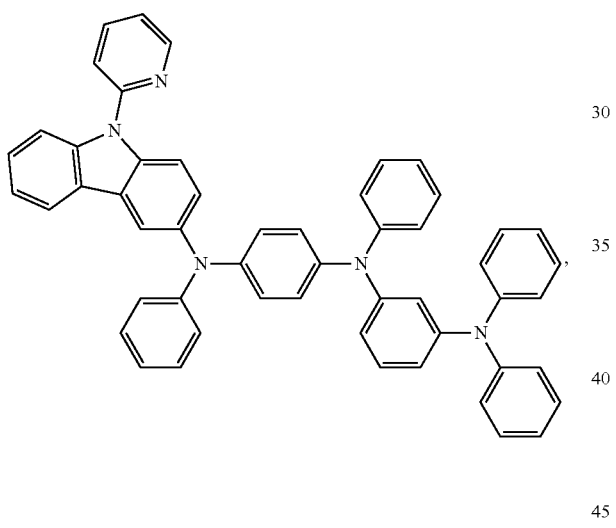
Compound 44
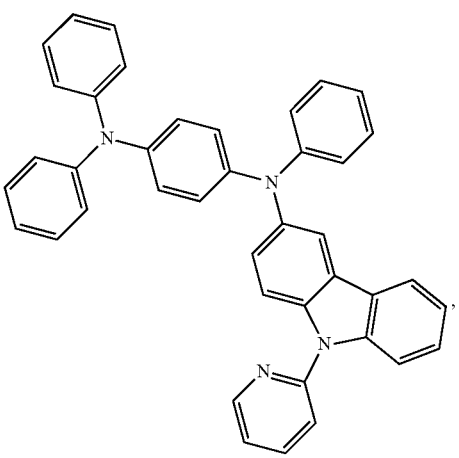
Compound 42
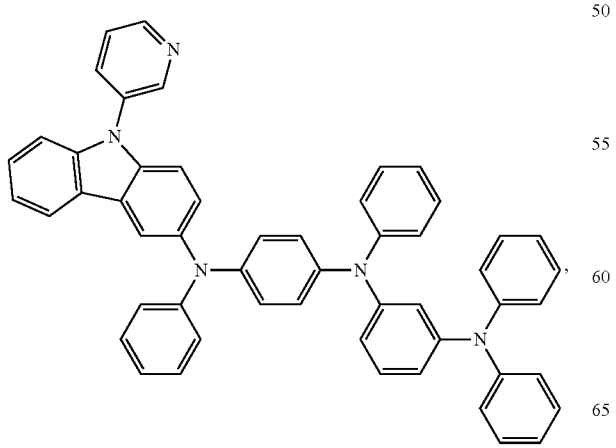
Compound 48
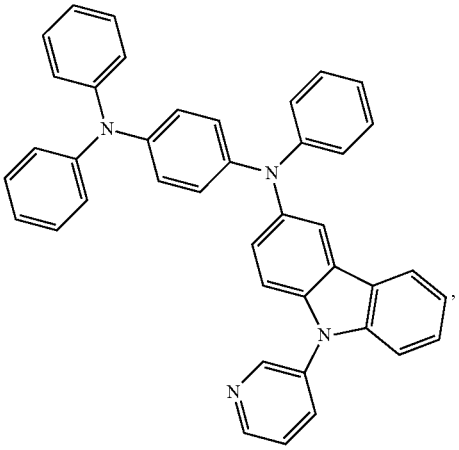

Compound 51
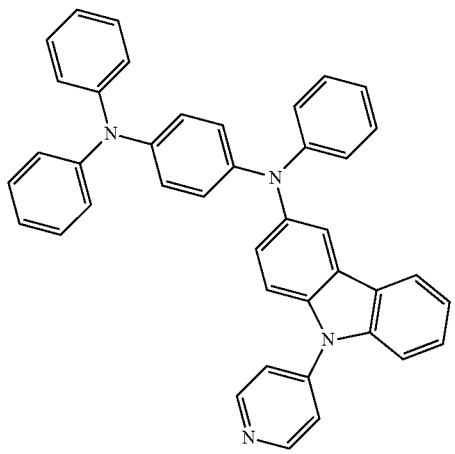
Compound 54
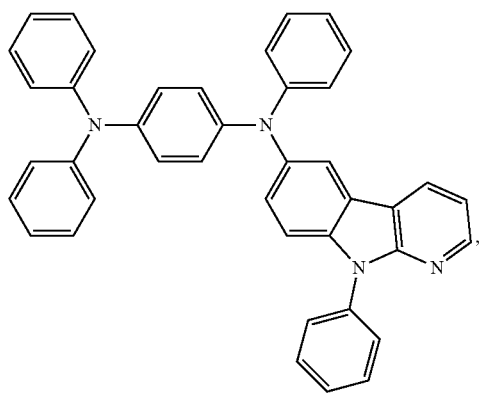
Compound 59
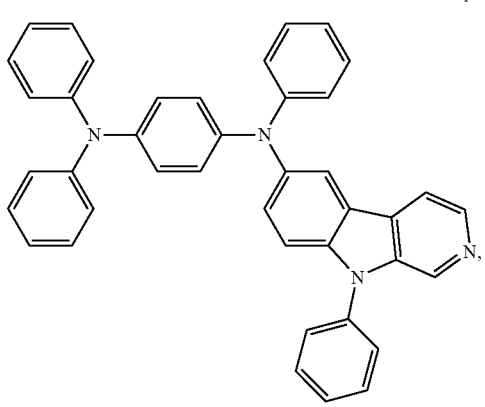
Compound 62
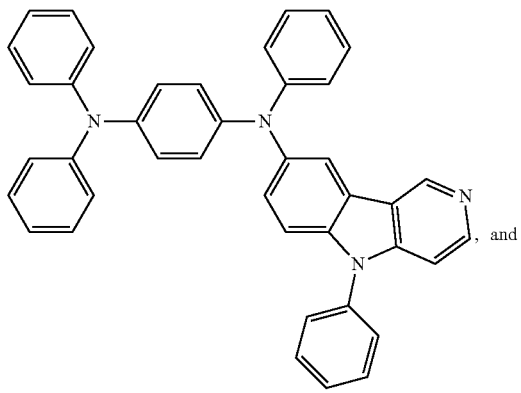
, and
Compound 64
In one aspect, the compound is selected from the group consisting of:
Compound 28

Compound 29

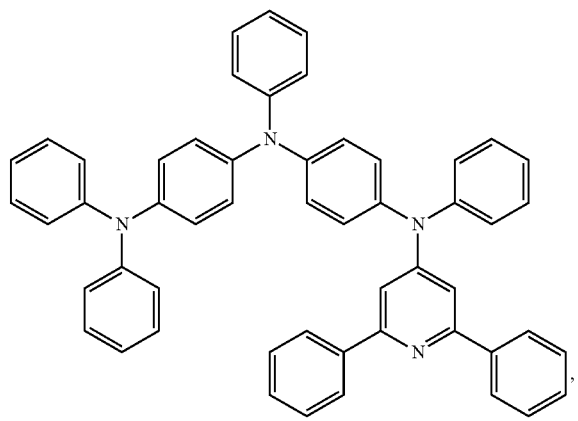

Compound 30

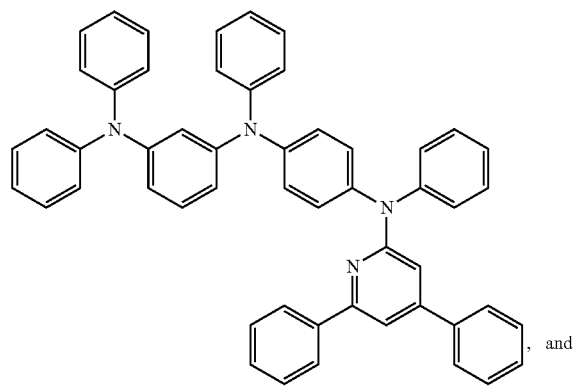
, and

Compound 57

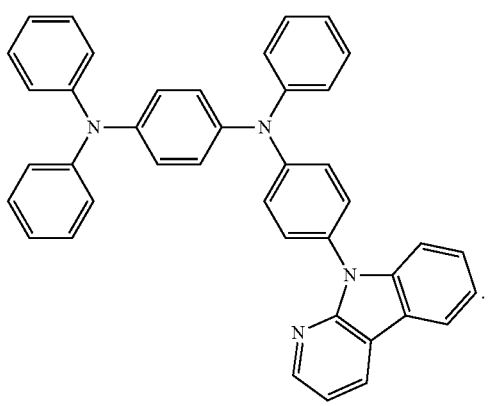

Compound 15

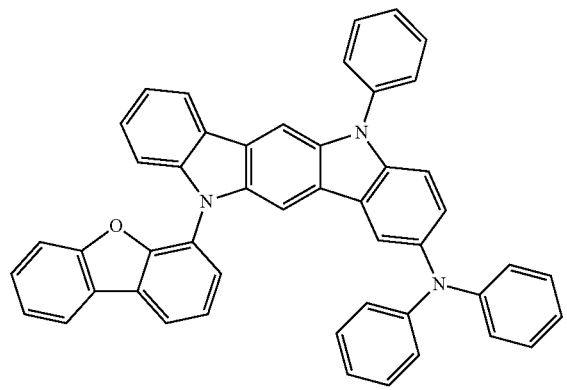

Compound 16

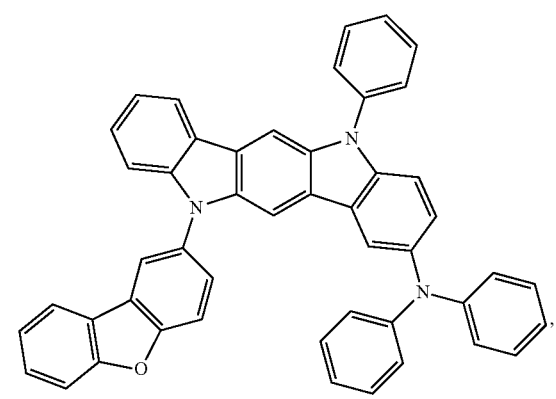
,

Compound 17

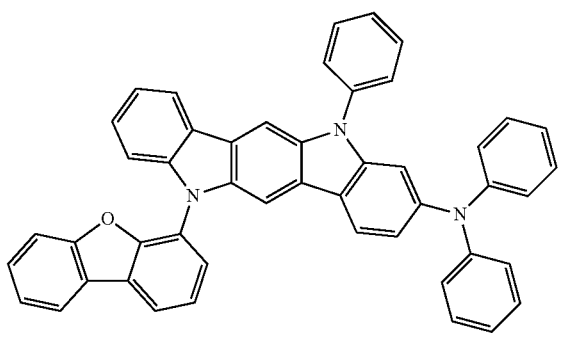
,

Compound 18

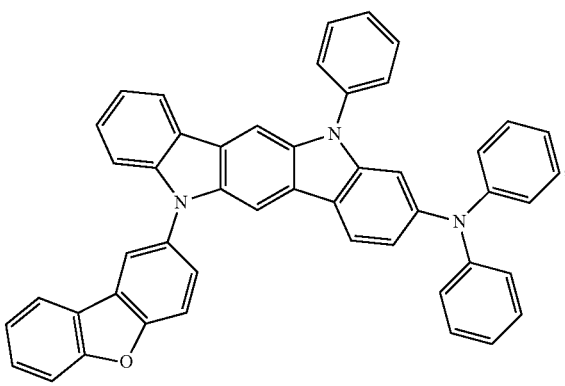
,

In one aspect, the first device emits a luminescent radiation at room temperature when a voltage is applied across the organic light emitting device, wherein the luminescent radiation comprises a delayed fluorescence process.

In one aspect, ring A, $Ar^1$, $Ar^2$ or $A^3$ fuse to form at least one carbazole moiety.

In one aspect, the first emissive dopant is selected from the group consisting of:

Compound 19
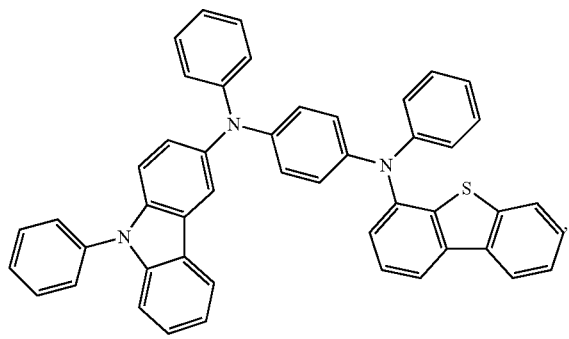
Compound 21
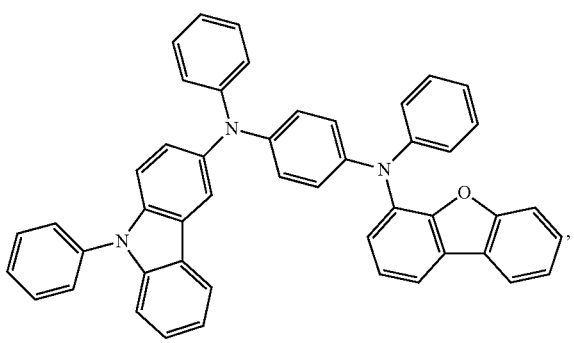
Compound 22
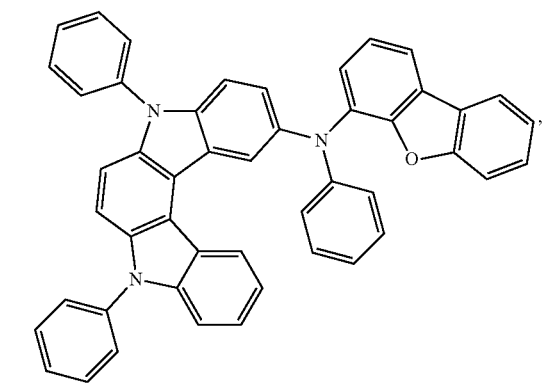
Compound 23
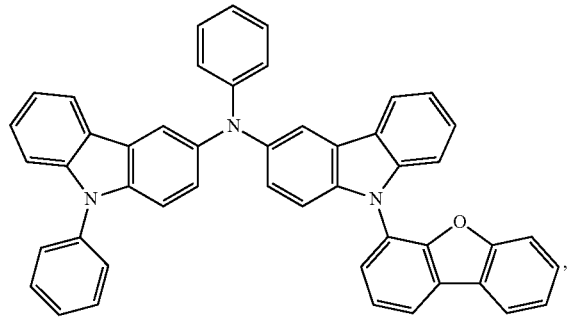
Compound 24
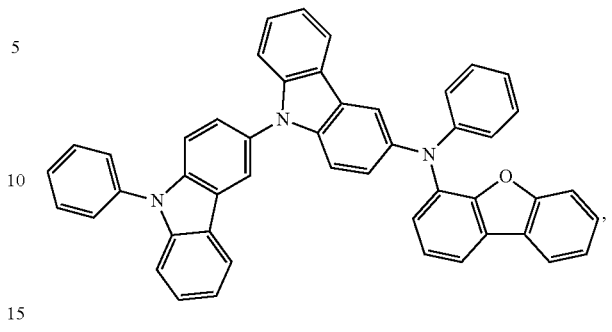
Compound 25
Compound 26
Compound 27
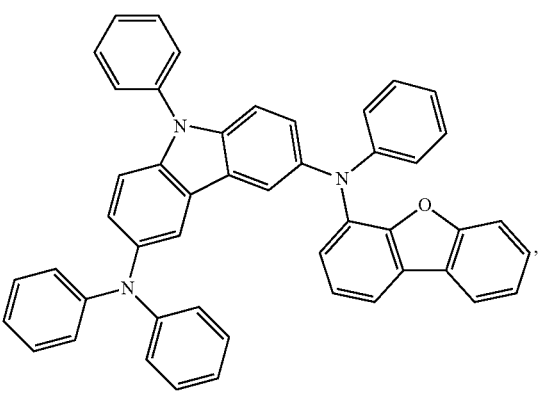

Compound 31
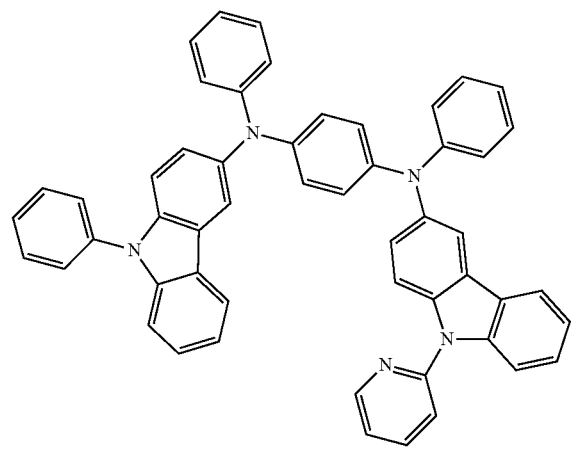
Compound 32
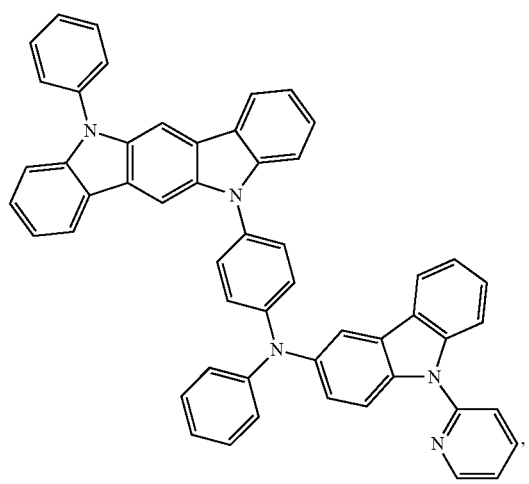
Compound 33
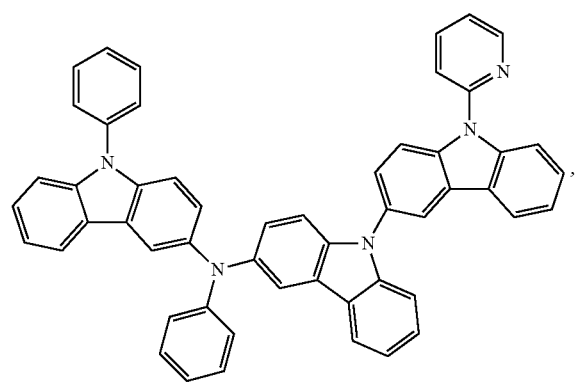
Compound 34
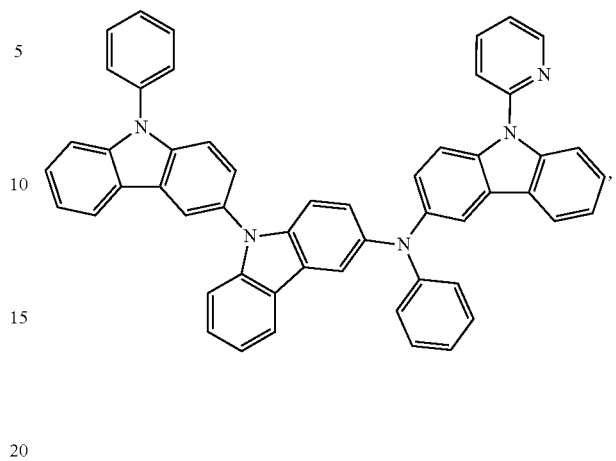
Compound 35
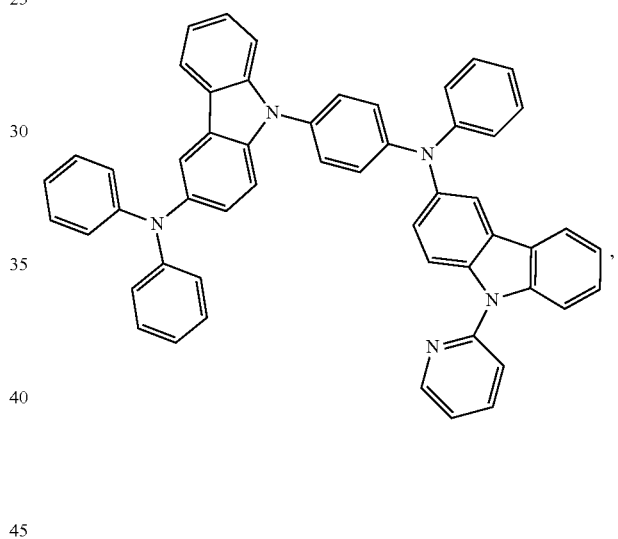
Compound 36
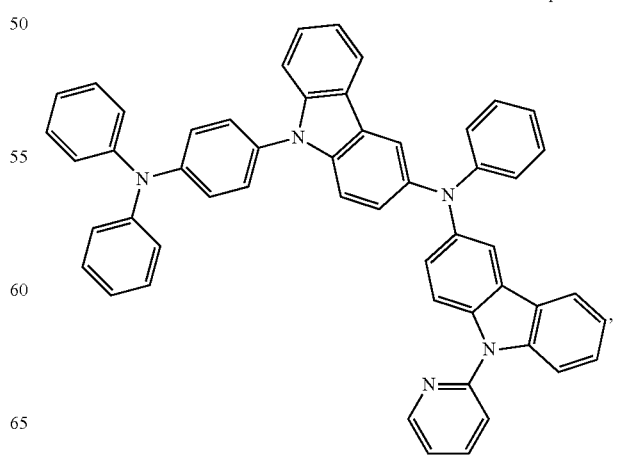

Compound 37
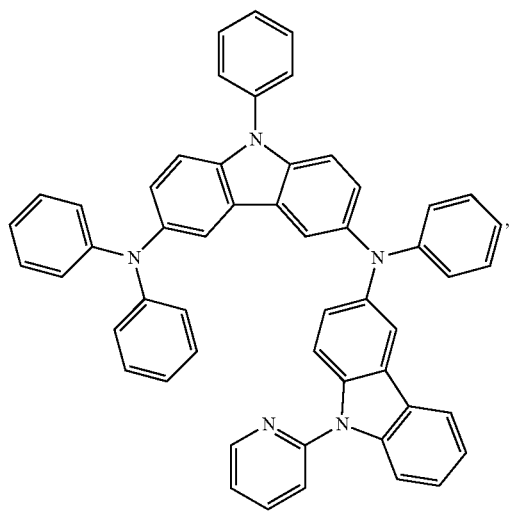
Compound 38
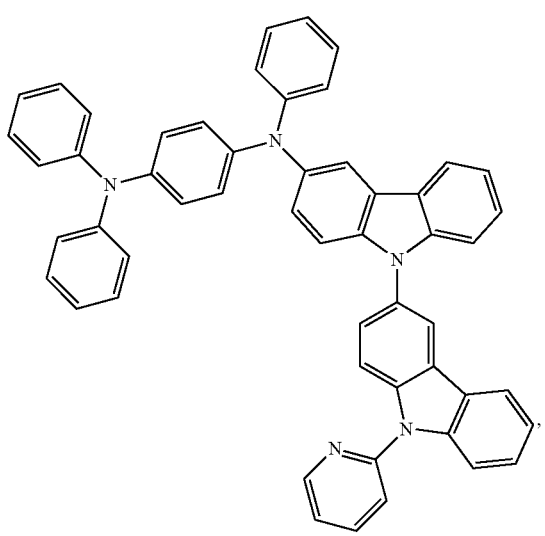
Compound 39
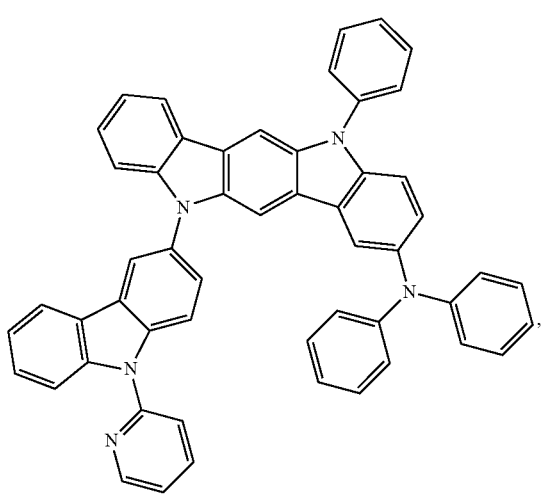
Compound 40
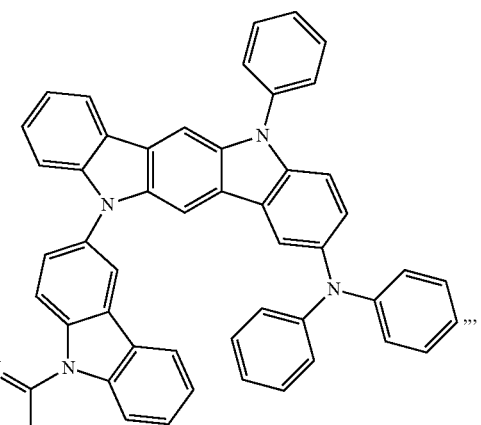
Compound 45
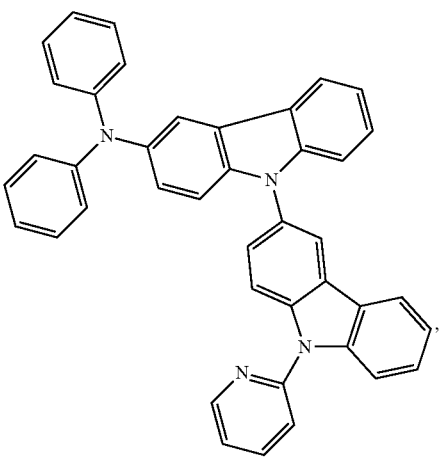
Compound 46
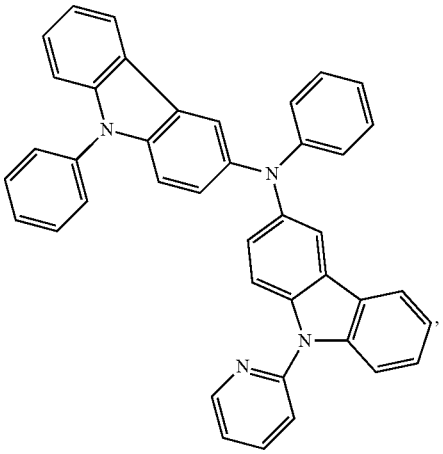

Compound 47
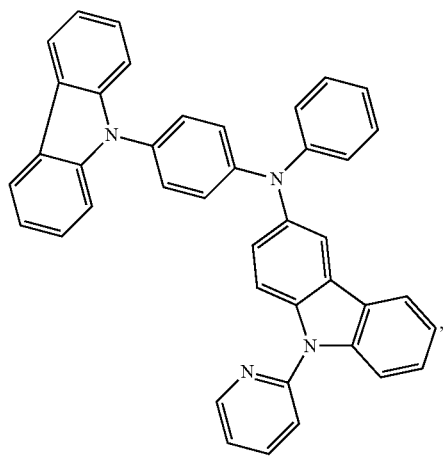
Compound 52
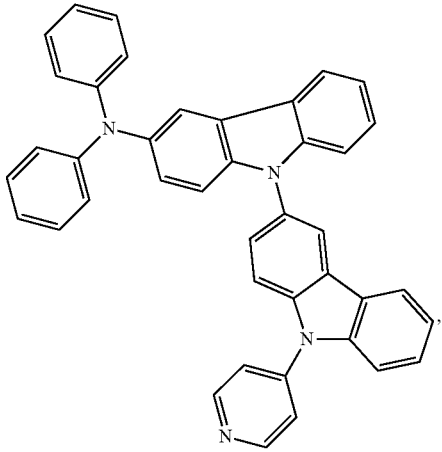
Compound 49
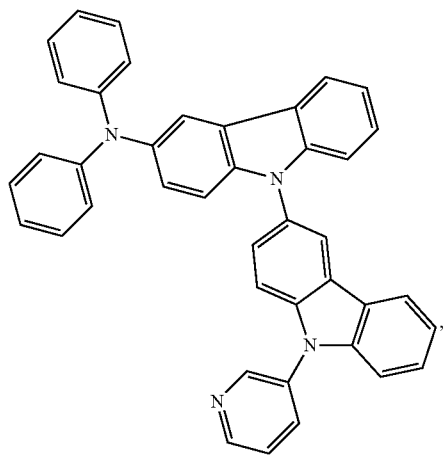
Compound 53
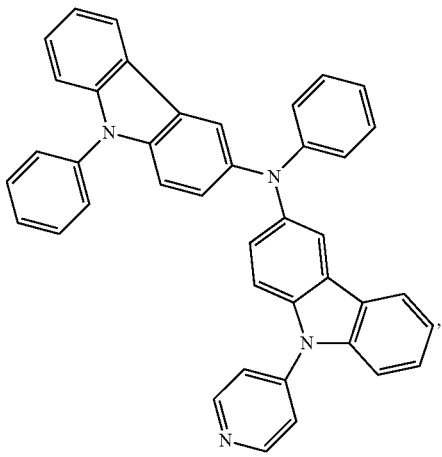
Compound 50
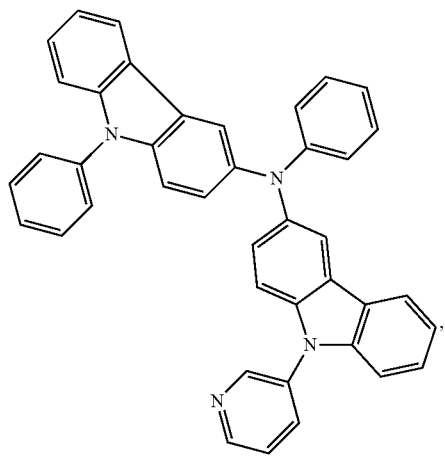
Compound 55
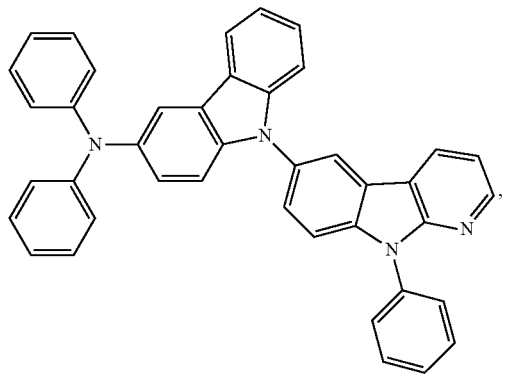

Compound 56
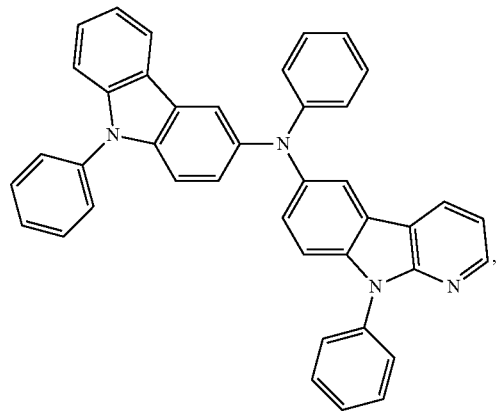
Compound 61
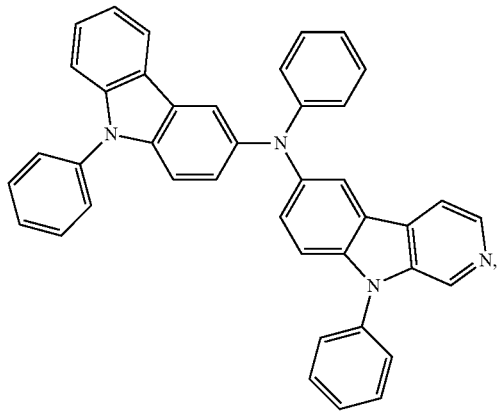
Compound 58
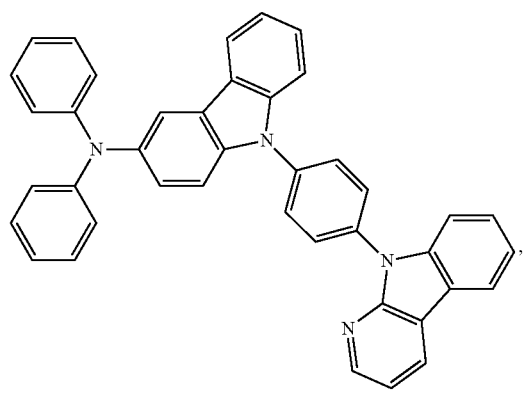
Compound 63
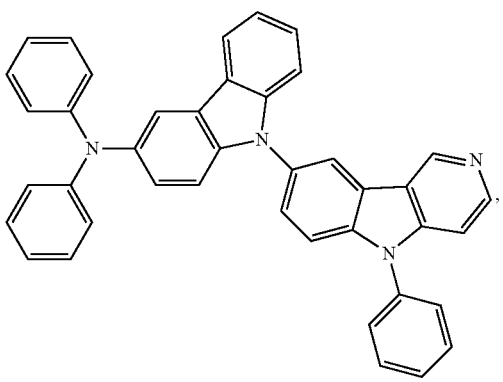
Compound 60
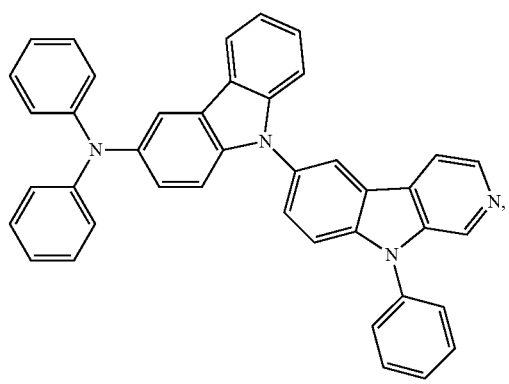
Compound 65
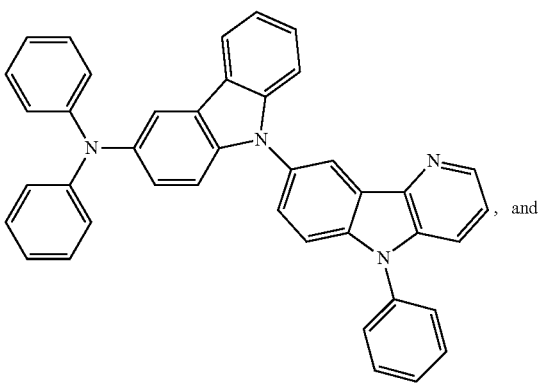
, and -continued Compound 66

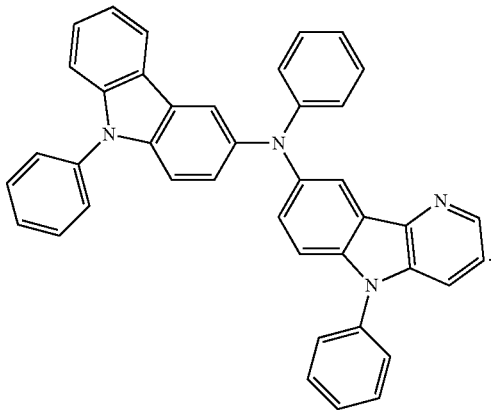

In one aspect, the emissive layer further comprises a first phosphorescent emitting material.

In one aspect, wherein the emissive layer further comprises a second phosphorescent emitting material.

In one aspect, first emissive dopant emits a white light at room temperature when a voltage is applied across the organic light emitting device.

In one aspect, the first emissive dopant emits a blue light having a peak wavelength between about 400 nm to about 500 nm.

In one aspect, the first emissive dopant emits a yellow light having a peak wavelength between about 530 nm to about 580 nm.

In one aspect, the first device comprises a second organic light-emitting device, wherein the second organic light emitting device is stacked on the first organic light emitting device.

In one aspect, the first device is a consumer product. In one aspect, the first device is an organic light-emitting device. In one aspect, the first device comprises a lighting panel.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
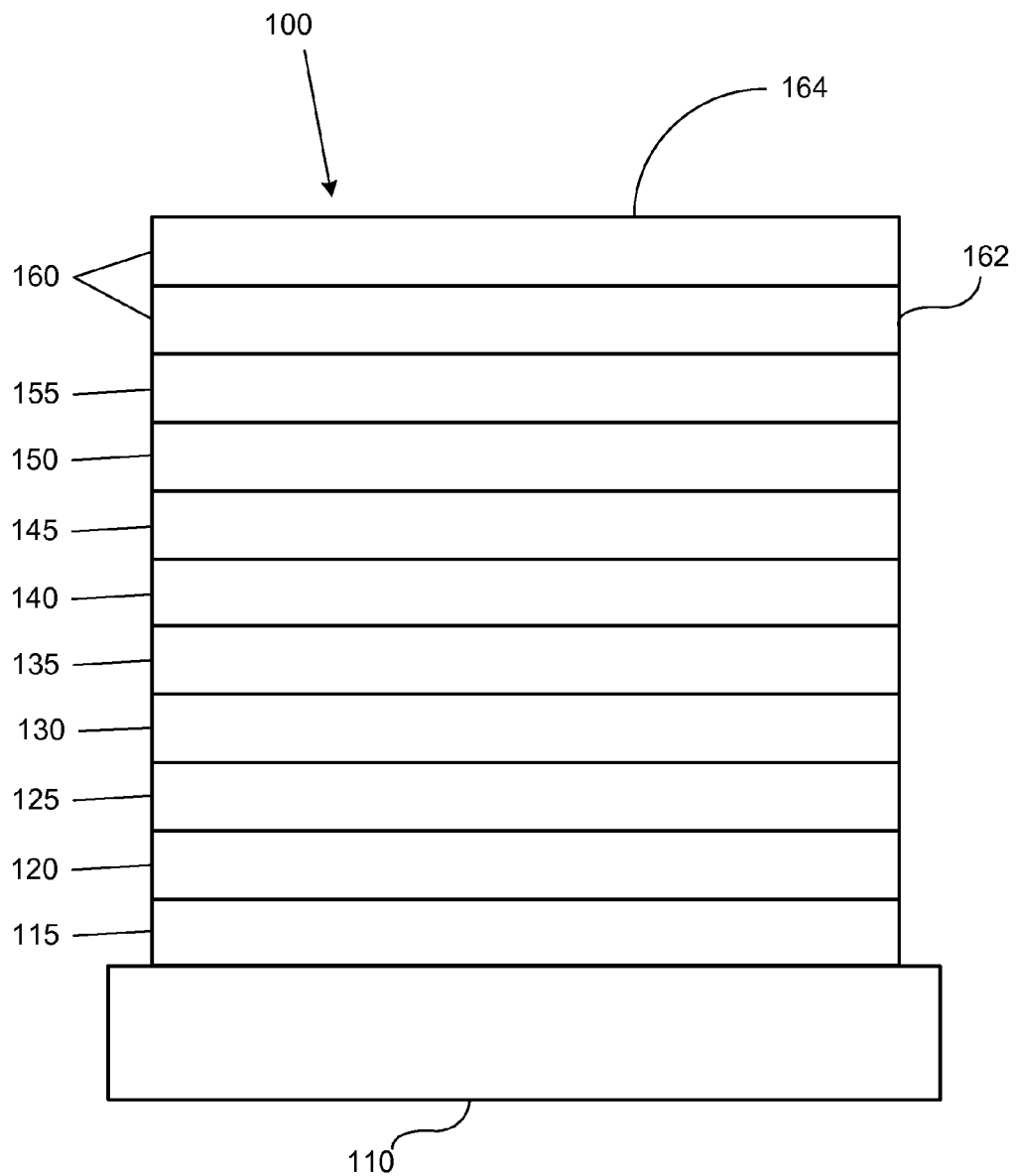
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
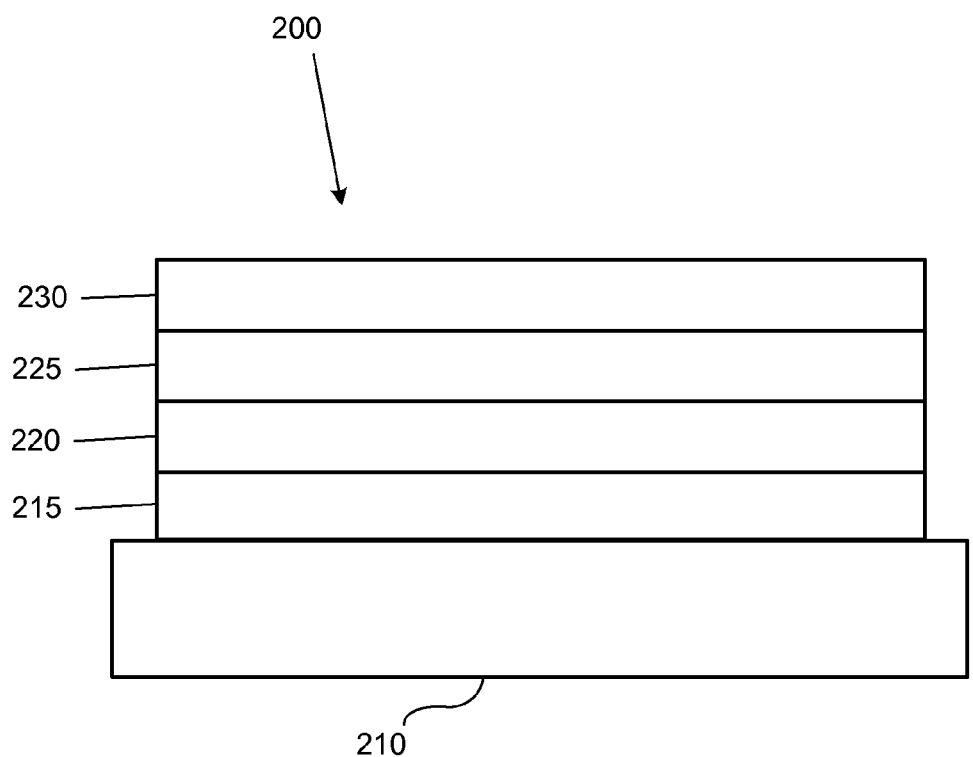
FIG. 2 shows an inverted organic light emitting device that does not have a separate electron transport layer.
Figure 3:
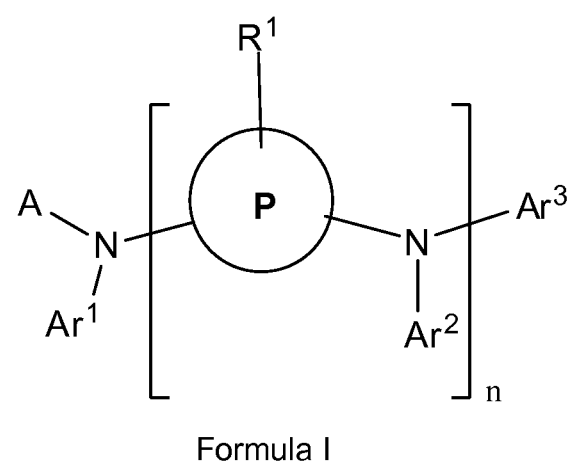
FIG. 3 shows a compound of Formula I.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the thermal population between the triplet states and the singlet excited states. Compounds that are capable of generating E-type delayed fluorescence are required to have very small singlet-triplet gaps. Thermal energy can activate the transition from the triplet state back to the singlet state. This type of delayed fluorescence is also known as thermally activated delayed fluorescence (TADF). A distinctive feature of TADF is that the delayed component increases as temperature rises due to the increased thermal energy. If the reverse intersystem crossing rate is fast enough to minimize the non-radiative decay from the triplet state, the fraction of back populated singlet excited states can potentially reach 75%. The total singlet fraction can be 100%, far exceeding the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap ($\Delta E_{S-T}$). Organic, non-metal containing, donor-acceptor luminescent materials may be able to achieve this. The emission in these materials is often characterized as a donor-acceptor charge-transfer (CT) type emission. The spatial separation of the HOMO and LUMO in these donor-acceptor type compounds often results in small $\Delta E_{S-T}$. These states may involve CT states. Often, donor-acceptor luminescent materials are constructed by connecting an electron donor moiety such as amino- or carbazole-derivatives and an electron acceptor moiety such as N-containing six-membered aromatic rings.

A first device is provided. The first device comprises a first organic light emitting device, further comprising an anode, a cathode, and an emissive layer, disposed between the anode and the cathode, comprising a first emissive dopant. The first emissive dopant is organic and non-metal containing, and comprises an electron donor and an electron acceptor moiety. The first emissive dopant has a calculated HOMO energy higher than or equal to −4.70 eV and a calculated LUMO energy higher than or equal to −1.20 eV. The first emissive dopant has an energy ratio calculated by dividing the T1 energy of the first emissive dopant by $\Delta E_{HOMO-LUMO}$ for the first emissive dopant, and wherein the energy ratio is at least 0.70. The first emissive dopant also has an energy difference calculated by subtracting the T1 energy of the first emissive dopant from $\Delta E_{HOMO-LUMO}$ for the first emissive dopant with an energy difference that is smaller than or equal to 1.00 eV.

In one embodiment, the energy difference is smaller than or equal to 0.90 eV.

In one embodiment, the energy the energy ratio is at least 0.73 and the energy difference is at smaller than or equal to 0.90 eV.

In one embodiment, the energy ratio is at least 0.73.

In one embodiment, the first emissive dopant has the formula:

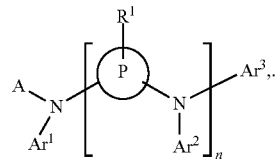

Formula I

In the compound of Formula I, A represents an aromatic carbocyclic or heterocyclic moiety with at least two fused aromatic carbocyclic or heterocyclic rings, and ring P is an aromatic carbocyclic or heterocyclic ring. $Ar^1$, $Ar^2$, and $Ar^3$ are aryl or heteroaryl, and are optionally further substituted. Rings A, $Ar^1$, $Ar^2$, and $Ar^3$ are optionally fused. $R^1$ represents mono-, di-, tri-, or tetra-substitution, or no substitution. $R^1$ is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, and n is an integer from 1 to 10.

In one embodiment, A has the formula:

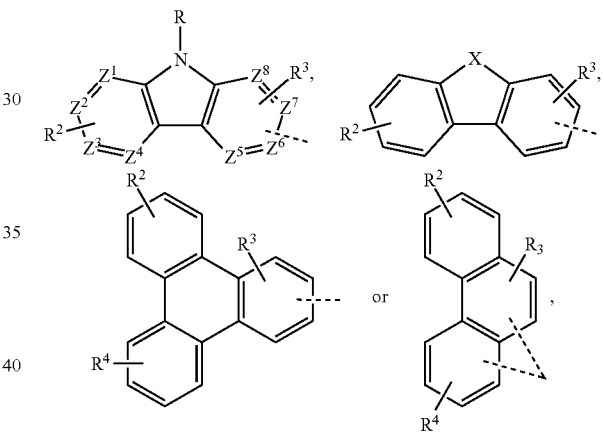

wherein X is O, S, or Se, $Z^1$ to $Z^8$ independently comprise C or N, and the total number of N in $Z^1$ to $Z^8$ is at most 1. R is selected from the group consisting of alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof. $R^2$ represents mono-, di-, tri-, or tetra-substitution, or no substitution, $R^3$ represents mono-, di- or tri-substitution, or no substitution, and $R^4$ represents mono-, di-, tri-, or tetra-substitution, or no substitution. $R^2$, $R^3$, and $R^4$ are independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one embodiment, the first emissive dopant has the formula:

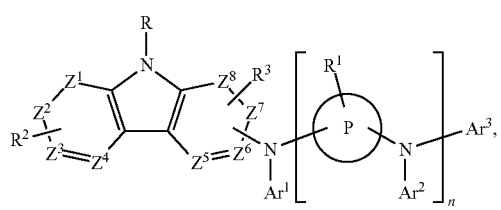

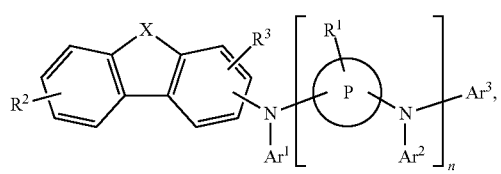

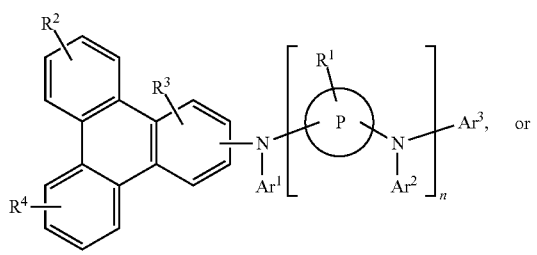

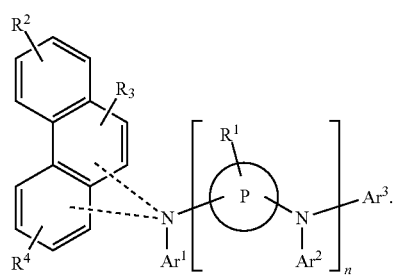

In one embodiment, Ar¹, Ar², and Ar³ are independently selected from the group consisting of phenyl and triphenylene. In one aspect n is 2.

In one embodiment, ring P Ar¹, Ar², and Ar³ are phenyl. In one embodiment, X is NR and wherein R is aryl or heteroaryl. In one aspect, X is O. In one embodiment, X is S.

In one embodiment, the first emissive dopant is selected from the group consisting of:

Compound 1

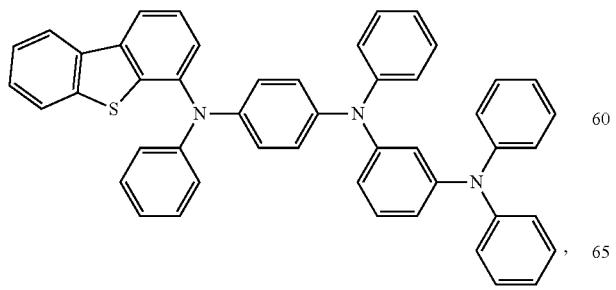

Compound 2

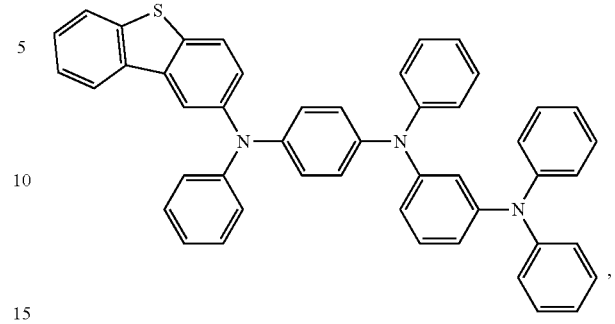

Compound 3

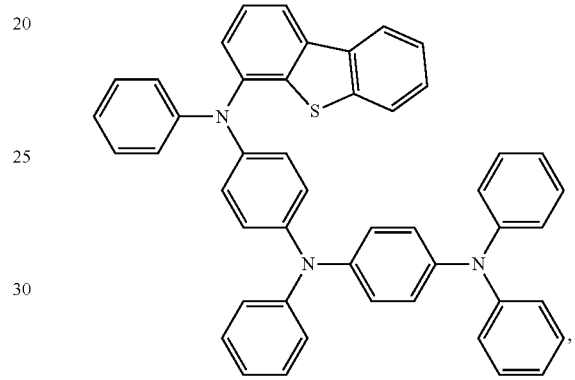

Compound 4

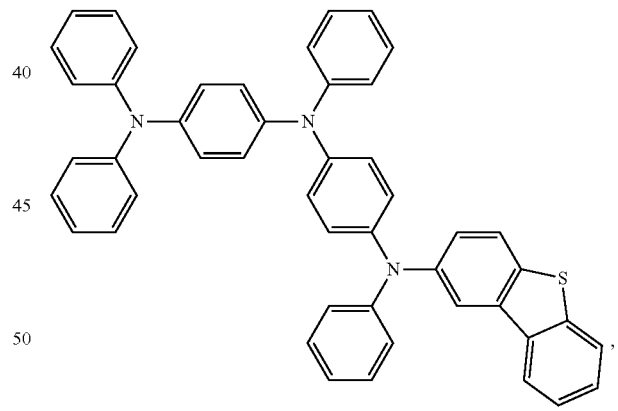

Compound 5

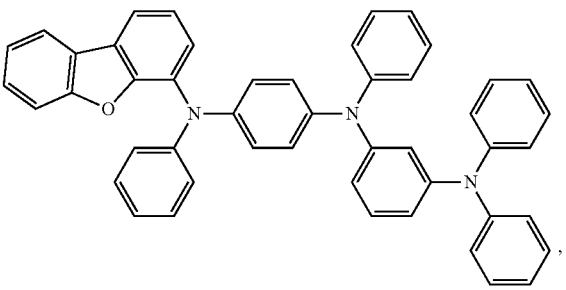

Compound 6
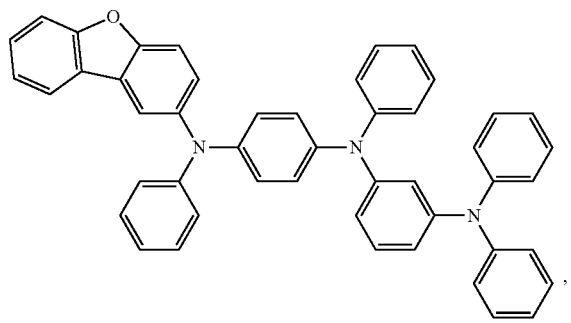
Compound 7
Compound 8
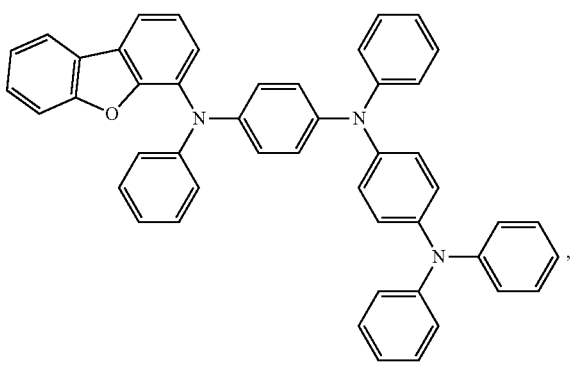
Compound 9
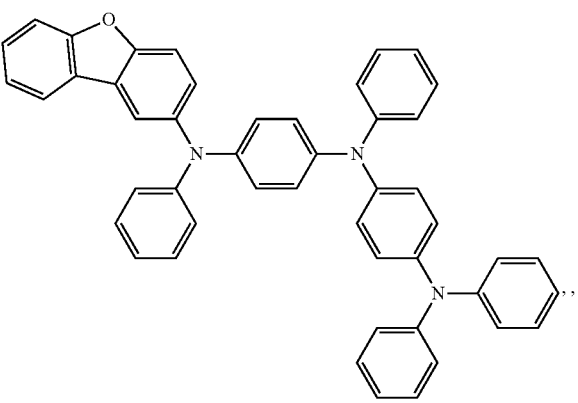
Compound 10
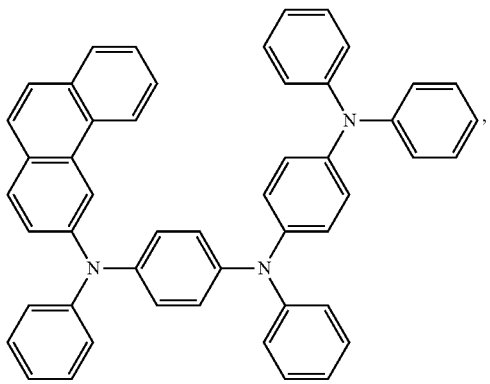
Compound 11
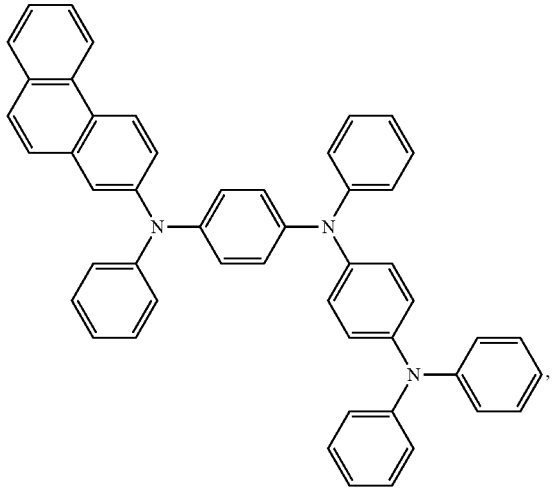
Compound 12
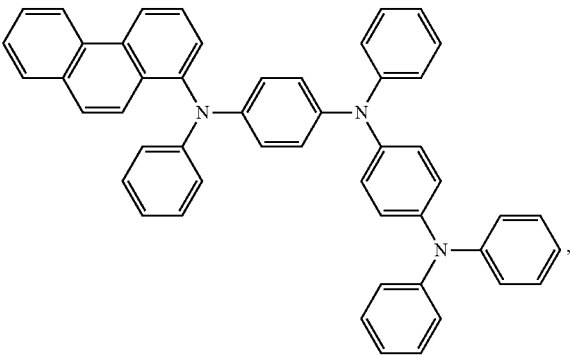

Compound 13
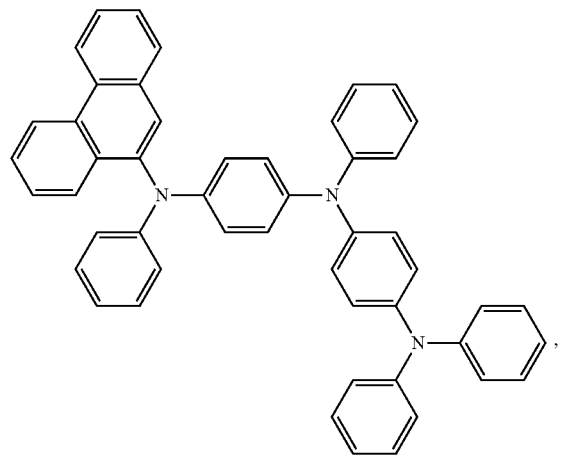
Compound 41
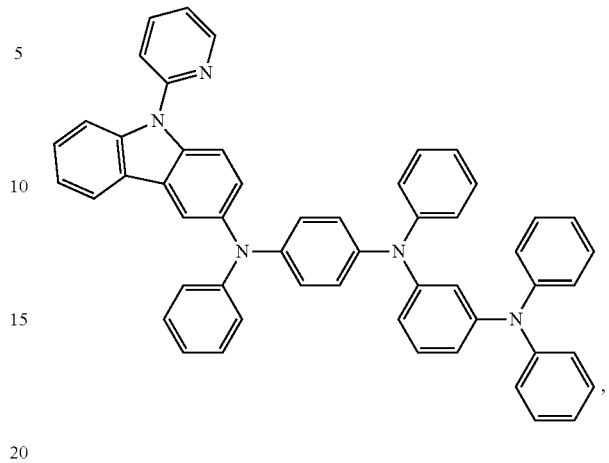
Compound 14
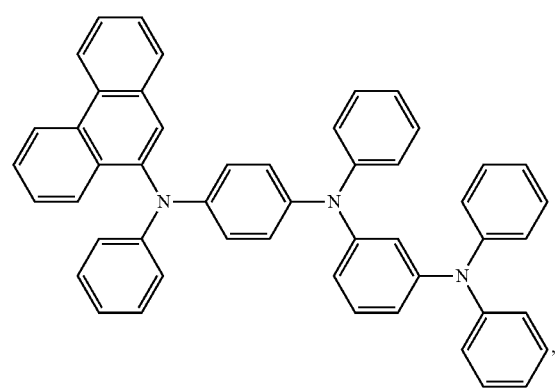
Compound 42
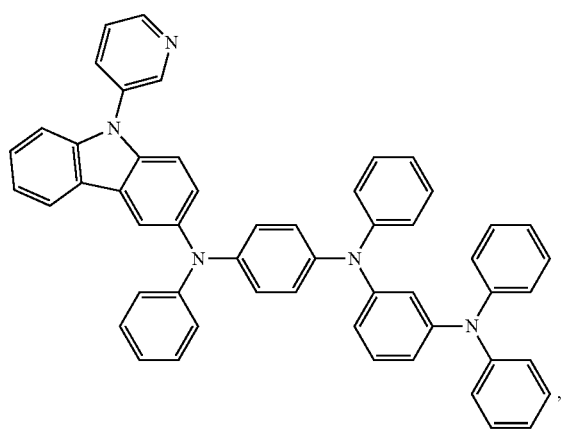
Compound 20
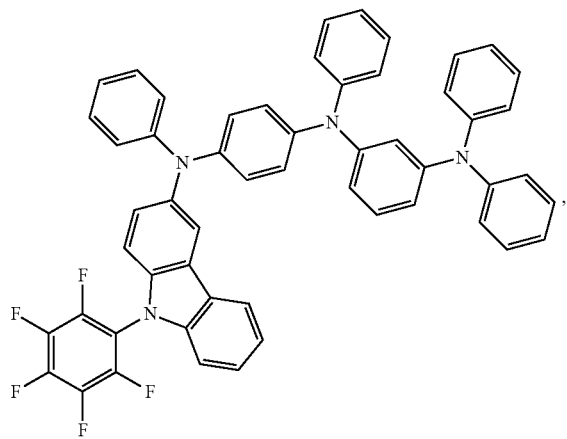
Compound 43
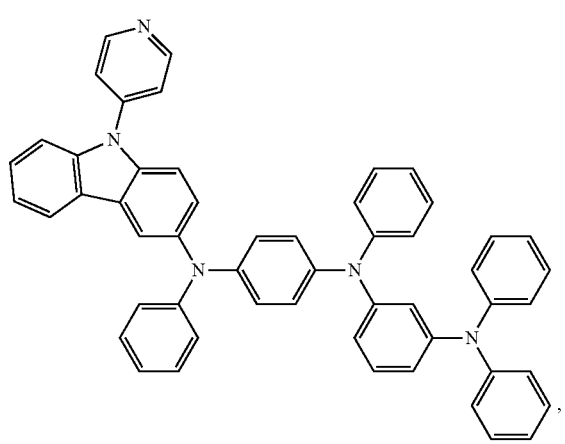

Compound 44
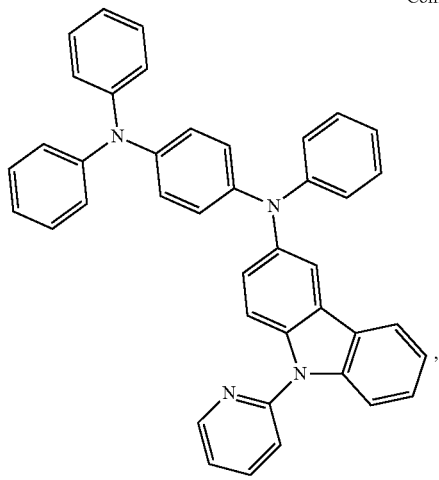
Compound 48
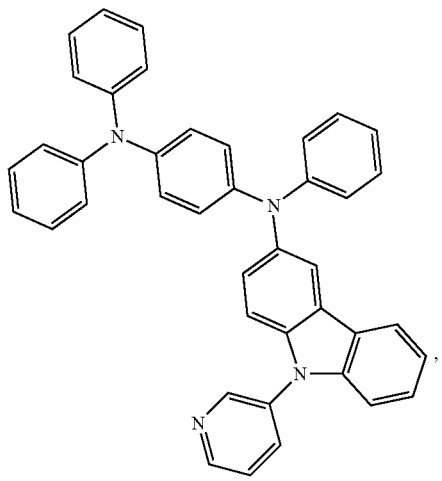
Compound 51
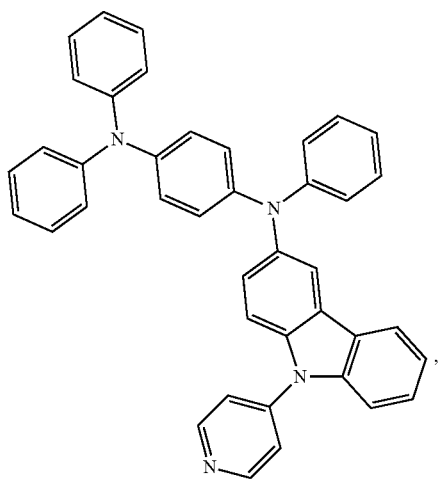
Compound 54
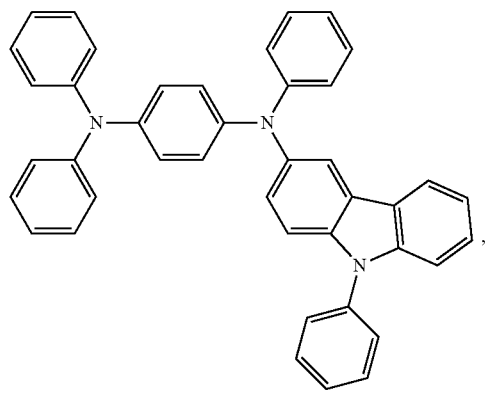
Compound 59
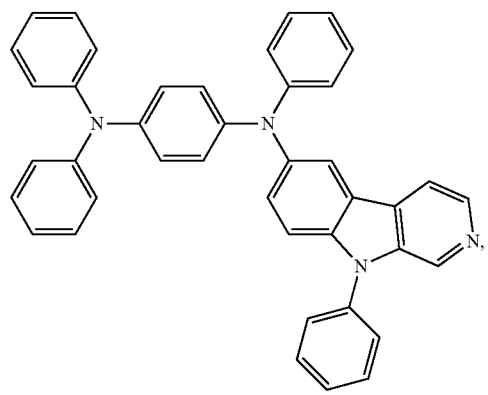
Compound 62
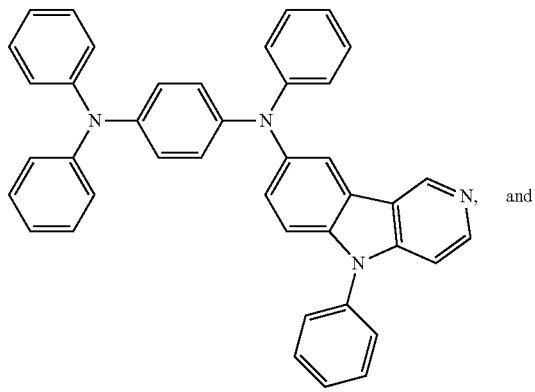
and Compound 64

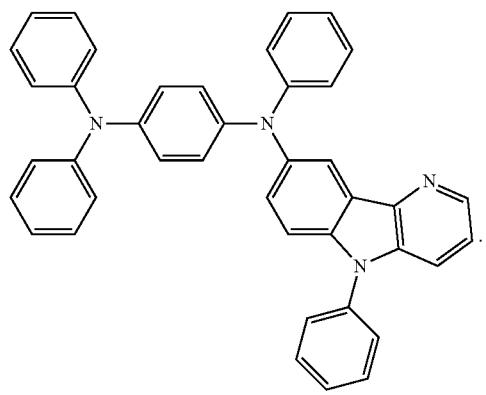

In one embodiment, the compound is selected from the group consisting of:

Compound 28

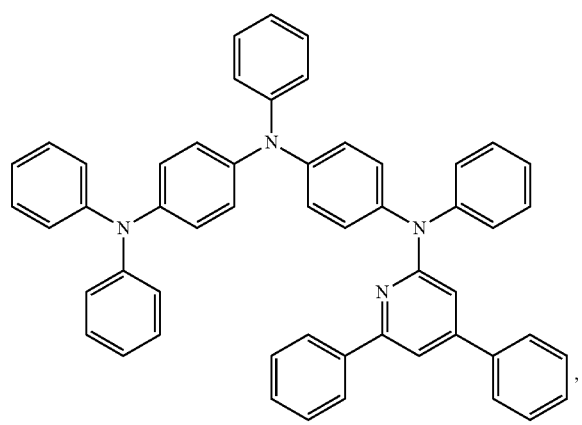

Compound 29

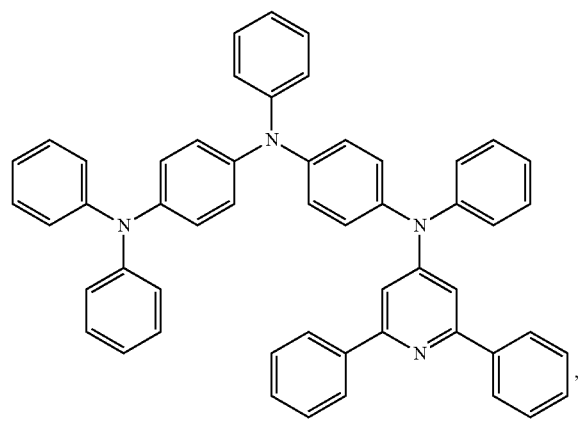

Compound 30

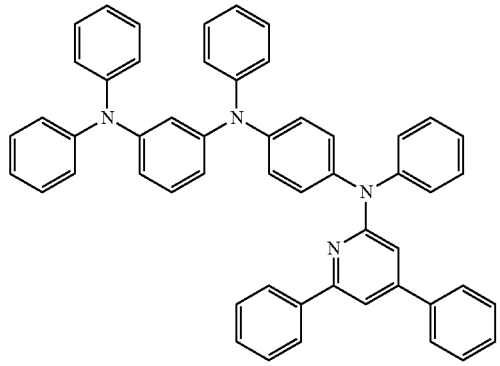
, and

Compound 57

.

Figure 4:
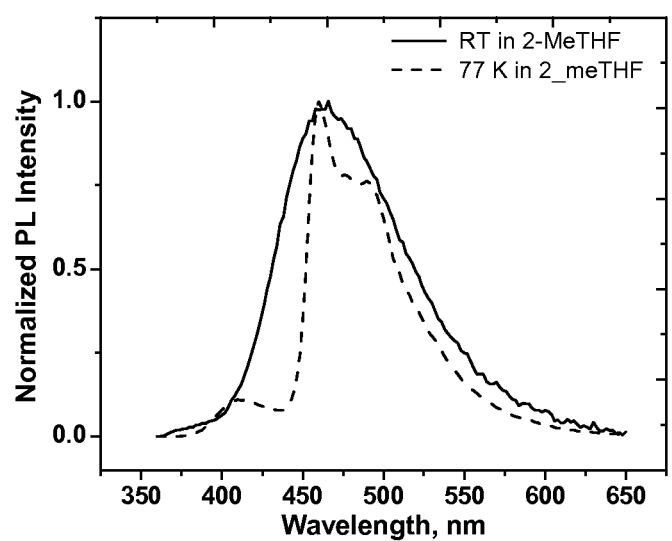
FIG. 4 shows the emission spectrum of Compound 1 in 2-methyltetrahydrofuran at room temperature and 77 K.
Figure 5:
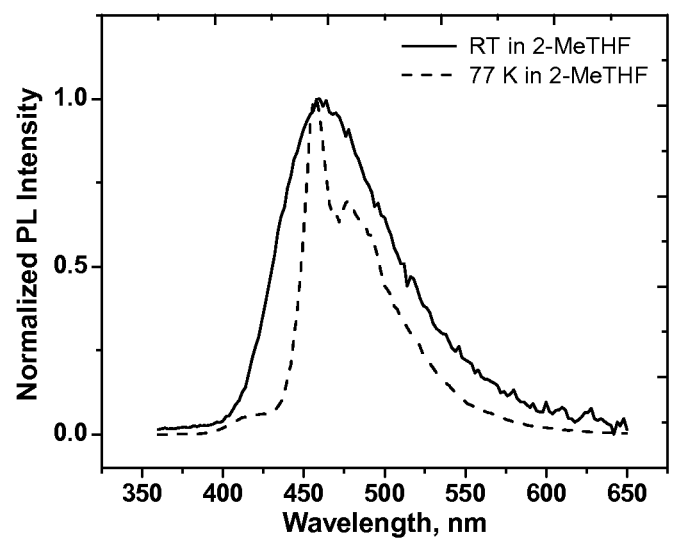
FIG. 5 shows the emission spectrum of Compound 2 in 2-methyltetrahydrofuran at room temperature and 77 K.
Figure 6:
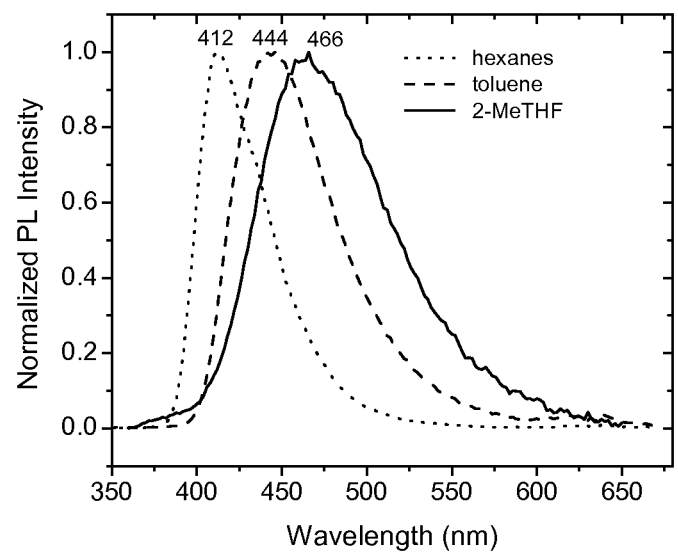
FIG. 6 shows effect of solvent on the room temperature emission spectrum of Compound 1.
Figure 7:
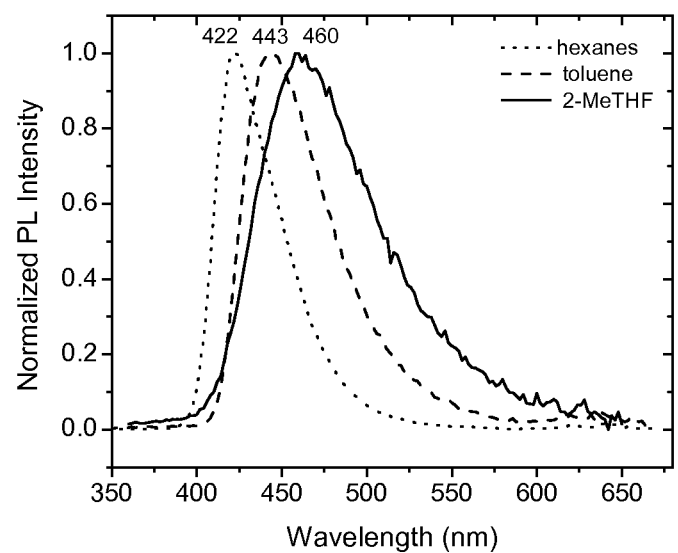
FIG. 7 shows effect of solvent on the room temperature emission spectrum of Compound 2.

In donor acceptor charge transfer emissive materials, the room temperature emission may arise from the charge transfer (CT) state. Compounds 1, 2, 5, 6, 8, 9, 13, and 14 were synthesized and showed a small (<0.2 eV) $\Delta E_{CT\text{-}T}$ (defined as the energy difference between the highest energy peak of the CT emission (measured in room temperature 2-methyltetrahydrofuran solution) and the highest energy peak of the triplet emission, which is measured in 2-methyltetrahydrofuran solution at 77 K. The acceptor portion of these compounds is dibenzothiophene, dibenzofuran, triphenylene or phenanthrene. Although dibenzothiophene, dibenzofuran, triphenylene and phenanthrene demonstrate reversible electrochemical reduction potentials, they are generally not considered as strong electron acceptors. However dibenzothiophene dibenzofuran and triphenylene have high triplet energies and have extensive electron delocalization that can stabilize charge when it is oxidized or reduced. Unexpectedly, it was discovered that by connecting dibenzothiophene dibenzofuran, triphenylene and phenanthrene with strong donors such as phenylenediamine derivatives (HOMO>4.7 eV), donor-acceptor systems with room temperature charge transfer emissions with very small $\Delta E_{CT-T}$ can be achieved. It is also possible that the $\Delta E_{CT-T}$ is a negative number if CT is of lower energy than the triplet. FIG. 4 and FIG. 5 show the photophysics of Compound 1 and Compound 2, respectively.

The results from compounds of Formula I, such as Compounds 1, 2, 5, 6, 8, 9, 13, and 14 show that donor acceptor CT compounds may be constructed with high triplet, weakly electron deficient groups as the electron acceptor part, provided that the donor is strongly donating. Phenylenediamine derivatives are strong donors and have been shown to be useful. Another benefit of the compounds of Formula I is that phenylenediamine derivatives can have high triplets. As such, the resulting donor acceptor CT compound can also have high triplet energies. This is important because donor acceptor CT compounds with emission in the blue region in the visible spectrum can be achieved. In order to enable the design of such strong-donor/weak-acceptor systems, Density Functional Theory (DFT) calculations can be used to predict properties (energy levels and triplet energy) hat will enable strong-donor/weak-acceptor systems with small energy differences between the triplet state and the CT emission state to be identified (Table 1). DFT calculations were performed using the Gaussian 09 software package with the B3LYP functional and 6-31g(d) basis set. Comparative compounds C1-C5 are also included to show the effect of strong acceptors (triazene and cyano) on the calculated energy levels.

The calculated HOMO and LUMO energies can be used to estimate the energy of the CT state since CT emission is determined by the donor and acceptor strength, i.e. where the HOMO and LUMO are localized, respectively. In order to have a donor-acceptor CT emission that meets the requirement described here, the triplet energy and the CT emission energy need to be close in energy or the CT emission should be of lower energy than the triplet. These requirements can be described by calculating the ratio of the T1 energy of the first emissive dopant by $\Delta E_{HOMO-LUMO}$ and/or subtracting the T1 energy of the first emissive dopant from $\Delta E_{HOMO-LUMO}$. In the first case, the T1/$\Delta E_{HOMO-LUMO}$ ratio should be large, and in the second case, the T1-$\Delta E_{HOMO-LUMO}$ value should be small.

There are different types of Comparative compounds:

Type 1 compounds are compounds with weak donors and strong acceptors such as Comparative Compound 1 and Comparative Compound 3 (HOMO lower than −4.70 eV and LUMO lower than −1.20 eV). This type of compounds may have donor acceptor charge transfer emission as demonstrated in Appl. Phys. Lett. 98, 083302 (2011) and J. Am. Chem. Soc., 2012, 134 (36), 14706. They may be able to achieve blue emission since the donor acceptor CT compound HOMO-LUMO gap may be relatively large and the triplet may be relatively high.

Type 2 compounds are compounds with strong donors and strong acceptors such as Comparative Compound 2 (HOMO higher than −4.70 eV and LUMO lower than −1.20 eV). This type of compound may have donor acceptor charge transfer emission as demonstrated in Chem. Commun., 2012, 48, 9580. They cannot achieve blue emission since the donor acceptor CT compound HOMO-LUMO gap is relatively small.

Type 3 compounds with weak donors and weak acceptors such as Comparative Compounds 4-5 (HOMO lower than −4.70 eV and LUMO higher than −1.20 eV). This type of compound does not have donor acceptor charge transfer emission as exemplified by the large energy difference between the triplet (490 nm) and the room temperature emission (407 nm) in Comparative Compound 5.

Compounds with CT emission based on strong donors and weak acceptors are preferred over Type 1 and Type 2 CT compounds because (i) blue emission may be achieved due to the relatively large HOMO-LUMO gap and high triplet energy and (ii) strong donor provides hole trapping which is important for confining charge in the emissive layer in order to obtain high OLED efficiency. Weak acceptors such dibenzothiophene, dibenzofuran, triphenylene, pyridine, azacarbazole and phenanthrene may be more stable in devices whereas strong acceptor such as cyano, nitro and heterocycles with multiple nitrogens may be less stable in devices.

Based on the DFT calculations and the observed CT character (such as the experimental demonstration of solvatochromism and/or a very small energy difference of triplet and CT emission state in Compounds 1-2, Compounds 5-10, Compounds 14-15 and Compound 47), it is predicted that compounds with CT emission based on strong donors and weak acceptors with calculated HOMO energy higher than or equal to −4.70 eV, a calculated LUMO energy higher than or equal to −1.20 eV, a T1(calculated)/$\Delta E_{HOMO-LUMO}$(calculated) energy ratio of at least 0.70, and $\Delta E_{HOMO-LUMO}$(calculated)-T1(calculated) energy difference of 1.00 eV or smaller combined to be particularly useful defining attributes for emissive dopants in OLEDs.

TABLE 1

Calculated Electronic Properties of Compounds of Formula I

| | Calculation | | | | | | |
|---|---|---|---|---|---|---|---|
| Cmpd | HOMO (eV) | LUMO (eV) | $\Delta E_{HOMO-LUMO}$ (eV) | T1 (nm) | T1 (eV) | T1/$\Delta E_{HOMO-LUMO}$ | $\Delta E_{HOMO-LUMO}$ − T1 (eV) |
| 1 | −4.64 | −0.98 | 3.66 | 442 | 2.83 | 0.77 | 0.83 |
| 2 | −4.63 | −0.99 | 3.64 | 436 | 2.87 | 0.79 | 0.77 |
| 3 | −4.5 | −0.99 | 3.51 | 448 | 2.79 | 0.79 | 0.72 |
| 4 | −4.5 | −1 | 3.5 | 449 | 2.78 | 0.80 | 0.72 |
| 5 | −4.64 | −0.95 | 3.69 | 446 | 2.80 | 0.76 | 0.89 |
| 6 | −4.63 | −1.13 | 3.5 | 459 | 2.72 | 0.78 | 0.78 |
| 7 | −4.63 | −0.95 | 3.68 | 448 | 2.79 | 0.76 | 0.89 |
| 8 | −4.62 | −1 | 3.62 | 437 | 2.86 | 0.79 | 0.76 |
| 9 | −4.52 | −0.92 | 3.6 | 473 | 2.64 | 0.73 | 0.96 |
| 10 | −4.5 | −0.99 | 3.51 | 496 | 2.52 | 0.72 | 0.99 |

TABLE 1-continued

Calculated Electronic Properties of Compounds of Formula I

| Cmpd | HOMO (eV) | LUMO (eV) | $\Delta E_{HOMO-LUMO}$ (eV) | T1 (nm) | T1 (eV) | T1/$\Delta E_{HOMO-LUMO}$ | $\Delta E_{HOMO-LUMO}$ − T1 (eV) |
|---|---|---|---|---|---|---|---|
| 11 | −4.5 | −0.99 | 3.51 | 496 | 2.52 | 0.72 | 0.99 |
| 12 | −4.49 | −1.12 | 3.37 | 488 | 2.56 | 0.76 | 0.81 |
| 13 | −4.48 | −1.15 | 3.33 | 501 | 2.50 | 0.75 | 0.83 |
| 14 | −4.63 | −1.12 | 3.51 | 499 | 2.51 | 0.71 | 1.00 |
| 15 | −4.59 | −1.14 | 3.45 | 485 | 2.58 | 0.75 | 0.87 |
| 16 | −4.58 | −1.16 | 3.42 | 489 | 2.56 | 0.75 | 0.86 |
| 17 | −4.69 | −1.13 | 3.56 | 486 | 2.57 | 0.72 | 0.99 |
| 18 | −4.7 | −1.15 | 3.55 | 487 | 2.57 | 0.72 | 0.98 |
| 19 | −4.52 | −0.93 | 3.59 | 444 | 2.82 | 0.78 | 0.77 |
| 20 | −4.59 | −1.11 | 3.48 | 439 | 2.85 | 0.82 | 0.63 |
| 21 | −4.48 | −0.89 | 3.59 | 452 | 2.77 | 0.77 | 0.82 |
| 22 | −4.62 | −1.01 | 3.61 | 473 | 2.64 | 0.73 | 0.97 |
| 23 | −4.47 | −1.18 | 3.29 | 447 | 2.80 | 0.85 | 0.49 |
| 24 | −4.62 | −0.95 | 3.67 | 447 | 2.80 | 0.76 | 0.87 |
| 25 | −4.62 | −1.1 | 3.52 | 430 | 2.91 | 0.83 | 0.61 |
| 26 | −4.67 | −0.9 | 3.77 | 446 | 2.80 | 0.74 | 0.97 |
| 27 | −4.61 | −0.91 | 3.7 | 445 | 2.81 | 0.76 | 0.89 |
| 28 | −4.62 | −1.17 | 3.45 | 453 | 2.76 | 0.80 | 0.69 |
| 29 | −4.66 | −0.99 | 3.67 | 447 | 2.80 | 0.76 | 0.87 |
| 30 | −4.65 | −1.2 | 3.45 | 454 | 2.75 | 0.80 | 0.70 |
| 31 | −4.32 | −0.9 | 3.42 | 448 | 2.79 | 0.82 | 0.63 |
| 32 | −4.61 | −1 | 3.61 | 468 | 2.67 | 0.74 | 0.94 |
| 33 | −4.4 | −1.06 | 3.34 | 450 | 2.78 | 0.83 | 0.56 |
| 34 | −4.41 | −0.93 | 3.48 | 446 | 2.80 | 0.81 | 0.68 |
| 35 | −4.59 | −1.03 | 3.56 | 425 | 2.94 | 0.83 | 0.62 |
| 36 | −4.45 | −0.87 | 3.58 | 449 | 2.78 | 0.78 | 0.80 |
| 37 | −4.46 | −0.88 | 3.58 | 458 | 2.73 | 0.76 | 0.85 |
| 38 | −4.4 | −1.1 | 3.3 | 441 | 2.83 | 0.86 | 0.47 |
| 39 | −4.54 | −1.04 | 3.5 | 489 | 2.56 | 0.73 | 0.94 |
| 40 | −4.51 | −1.04 | 3.47 | 488 | 2.56 | 0.74 | 0.91 |
| 41 | −4.46 | −0.95 | 3.51 | 440 | 2.84 | 0.81 | 0.67 |
| 42 | −4.53 | −1.01 | 3.52 | 440 | 2.84 | 0.81 | 0.68 |
| 43 | −4.58 | −1 | 3.58 | 441 | 2.83 | 0.79 | 0.75 |
| 44 | −4.53 | −0.93 | 3.6 | 438 | 2.85 | 0.79 | 0.75 |
| 45 | −4.64 | −1.09 | 3.55 | 424 | 2.95 | 0.83 | 0.60 |
| 46 | −4.55 | −0.89 | 3.66 | 445 | 2.81 | 0.77 | 0.85 |
| 47 | −4.84 | −1.02 | 3.82 | 418 | 2.99 | 0.78 | 0.83 |
| 48 | −4.56 | −1.01 | 3.55 | 443 | 2.82 | 0.79 | 0.73 |
| 49 | −4.66 | −1.15 | 3.51 | 425 | 2.94 | 0.84 | 0.57 |
| 50 | −4.58 | −0.95 | 3.63 | 449 | 2.78 | 0.77 | 0.85 |
| 51 | −4.59 | −1.01 | 3.58 | 443 | 2.82 | 0.79 | 0.76 |
| 52 | −4.68 | −1.18 | 3.5 | 425 | 2.94 | 0.84 | 0.56 |
| 53 | −4.63 | −0.97 | 3.66 | 449 | 2.78 | 0.76 | 0.88 |
| 54 | −4.57 | −1.13 | 3.44 | 460 | 2.72 | 0.79 | 0.72 |
| 55 | −4.66 | −1.33 | 3.33 | 428 | 2.92 | 0.88 | 0.41 |
| 56 | −4.59 | −1.06 | 3.53 | 465 | 2.69 | 0.76 | 0.84 |
| 57 | −4.65 | −1.00 | 3.65 | 436 | 2.87 | 0.79 | 0.78 |
| 58 | −4.70 | −1.18 | 3.52 | 425 | 2.94 | 0.84 | 0.58 |
| 59 | −4.60 | −1.17 | 3.43 | 469 | 2.67 | 0.78 | 0.76 |
| 60 | −4.69 | −1.37 | 3.32 | 435 | 2.87 | 0.87 | 0.45 |
| 61 | −4.63 | −1.09 | 3.54 | 472 | 2.65 | 0.75 | 0.89 |
| 62 | −4.58 | −0.97 | 3.61 | 442 | 2.83 | 0.78 | 0.78 |
| 63 | −4.67 | −1.17 | 3.5 | 425 | 2.94 | 0.84 | 0.56 |
| 64 | −4.51 | −1.11 | 3.4 | 466 | 2.68 | 0.79 | 0.72 |
| 65 | −4.61 | −1.30 | 3.31 | 434 | 2.88 | 0.87 | 0.43 |
| 66 | −4.52 | −1.03 | 3.49 | 472 | 2.65 | 0.76 | 0.84 |
| C1 | −5.32 | −1.78 | 3.54 | 445 | 2.81 | 0.79 | 0.73 |
| C2 | −4.68 | −2.2 | 2.48 | 612 | 2.04 | 0.82 | 0.44 |
| C3 | −5.43 | −1.59 | 3.84 | 415 | 3.01 | 0.78 | 0.83 |
| C4 | −4.71 | −0.61 | 4.1 | 437 | 2.86 | 0.70 | 1.24 |
| C5 | −4.76 | −1.2 | 3.56 | 450 | 2.78 | 0.78 | 0.78 |

The structures of comparative compounds C1 to C5 are as follows:

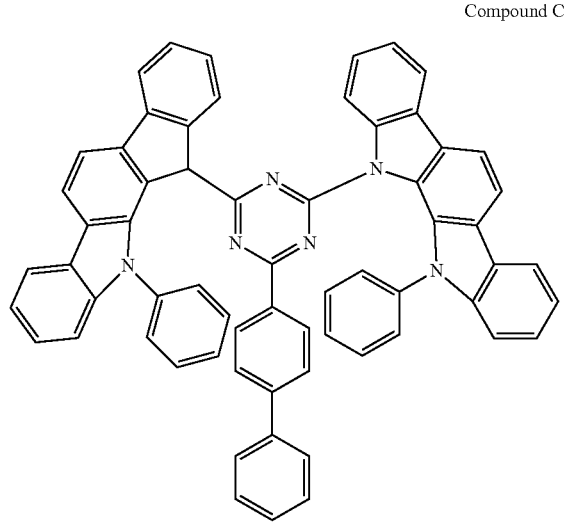
Compound C1

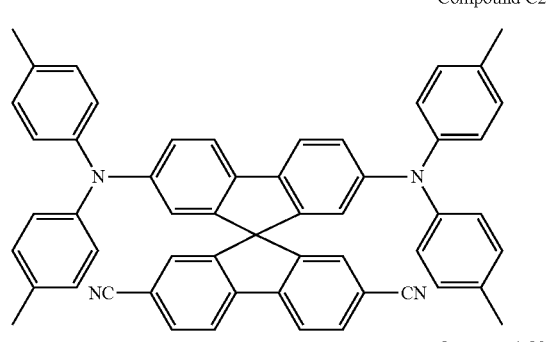
Compound C2

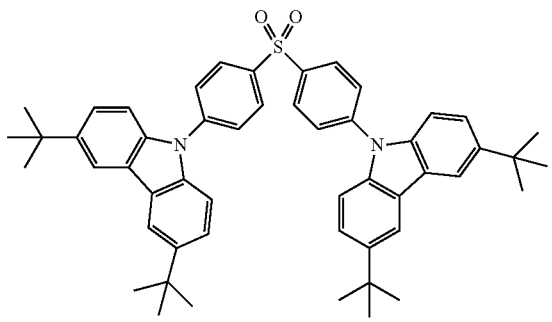
Compound C3

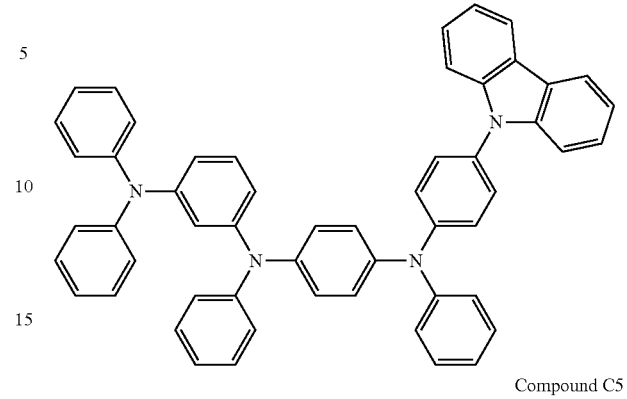
Compound C4

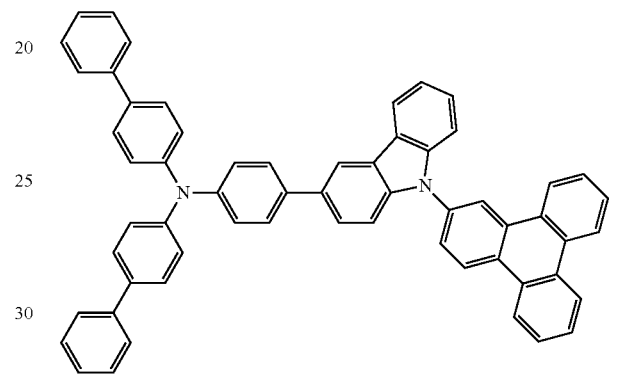
Compound C5

Table 2 shows the electrochemical and photophysical data for compounds of Formula I. HOMO and LUMO energies were calculated by $E_{ox}$ and $E_{red}$ from cyclic voltammetry using Fc/Fc$^+$ (HOMO=4.8 eV) in dimethylformamide at room temperature. Room temperature emission spectra were obtained in hexanes, toluene and 2-methyltetrahydrofuran (2-MeTHF). Experimental T1 was measured in 2-MeTHF at 77 K. Thin film emission at room temperature and quantum yield were measure in PMMA film doped with 5 weight % of the compound using a Hamamatsu C9920 absolute PL quantum yield measurement system with integrating sphere and a model C10027 photonic multi-channel analyzer. These compounds show strong solvatochromic Gaussian-shaped emission in room temperature solution, which is indicative of the donor-acceptor CT nature of the emissive state, and small CT-T1 energies, making them useful in OLED devices.

| | | | | Experimental | | | | | | |
|---|---|---|---|---|---|---|---|---|---|---|
| Cmpd | HOMO (eV) | LUMO (eV) | $\Delta E_{HOMO-LUMO}$ (eV) | CT Em in hexanes (nm) | CT Em in toluene (nm) | CT Em in 2-MeTHF (nm) | T1 in 2-MeTHF (nm) | CT – T1 (eV) | Thin film Em (nm) | Thin film Em QE (%) |
| 1 | −5.02 | −1.91 | 3.11 | 412 | 444 | 466 | 460 | −0.03 | 430 | 8 |
| 2 | −4.96 | −2.00 | 2.96 | 422 | 443 | 460 | 457 | −0.02 | 442 | 8 |
| 5 | −4.99 | −1.94 | 3.05 | 410 | 443 | 456 | 462 | 0.04 | 431 | 14 |
| 6 | −4.97 | −1.93 | 3.04 | 422 | 445 | 460 | 458 | −0.01 | 443 | 13 |
| 7 | −4.87 | −1.89 | 2.98 | not measured | not measured | not measured | not measured | not measured | 435 | 15 |
| 8 | −4.86 | −1.89 | 2.97 | not measured | not measured | 469 | 464 | −0.03 | 443 | 17 |

-continued

| | | | | Experimental | | | | | | |
|---|---|---|---|---|---|---|---|---|---|---|
| Cmpd | HOMO (eV) | LUMO (eV) | $\Delta E_{HOMO-LUMO}$ (eV) | CT Em in hexanes (nm) | CT Em in toluene (nm) | CT Em in 2-MeTHF (nm) | T1 in 2-MeTHF (nm) | CT – T1 (eV) | Thin film Em (nm) | Thin film Em QE (%) |
| 9 | −4.87 | −1.95 | 2.92 | not measured | not measured | 469 | 480 | 0.06 | 446 | 18 |
| 13 | −4.87 | −1.95 | 2.92 | 452 | 490 | 515 | 525 | 0.05 | 473 | 28 |
| 14 | −4.98 | −2.03 | 2.95 | 448 | 486 | 505 | 526 | 0.10 | 469 | 24 |

In one embodiment, the first device emits a luminescent radiation at room temperature when a voltage is applied across the organic light emitting device, wherein the luminescent radiation comprises a delayed fluorescence process.

In one embodiment, ring A, $Ar^1$, $Ar^2$ or $A^3$ fuse to form at least one carbazole moiety.

In one embodiment, the first emissive dopant is selected from the group consisting of:

Compound 15

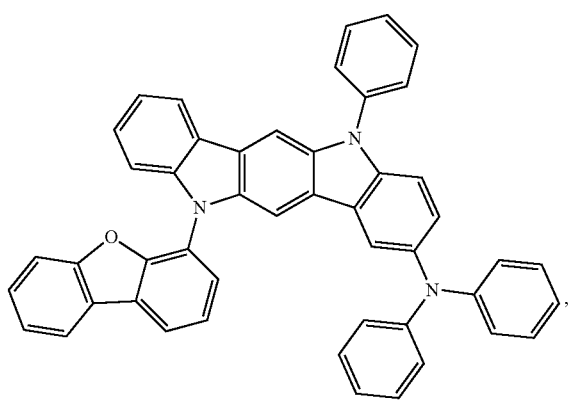

Compound 16

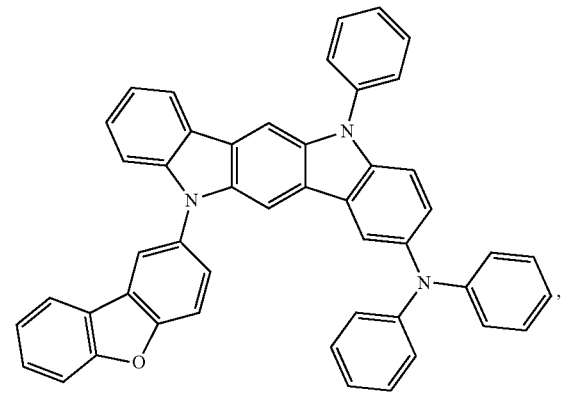

-continued

Compound 17

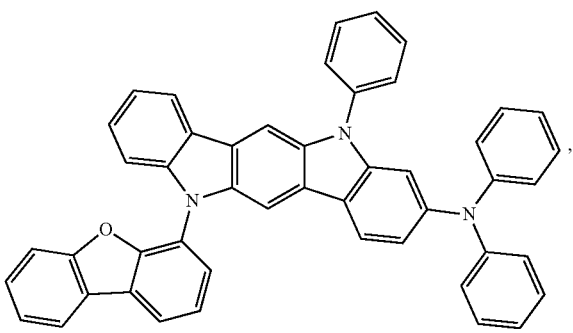

Compound 18

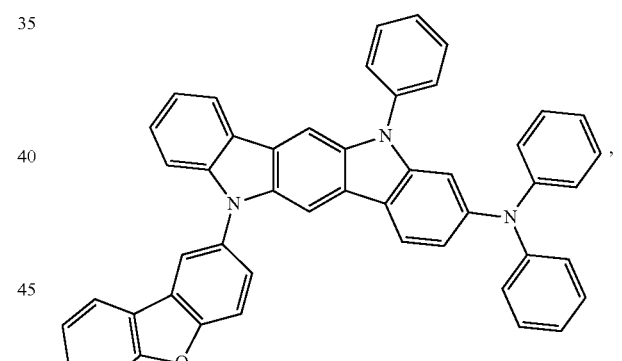

Compound 19

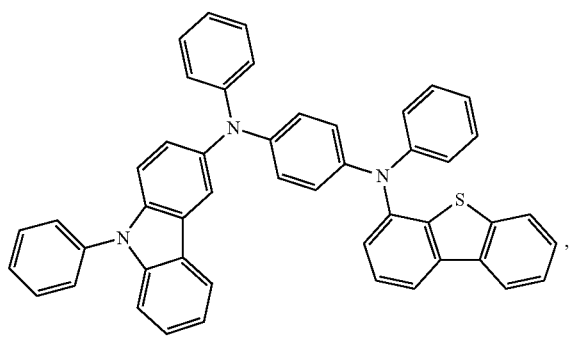

Compound 21
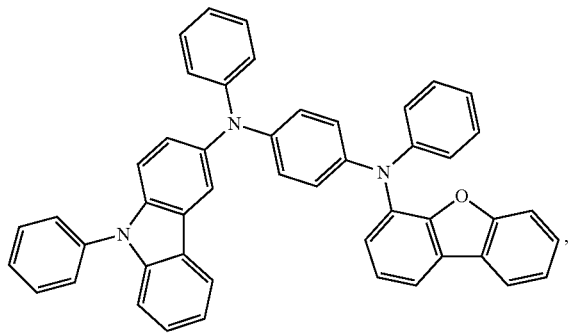
Compound 22
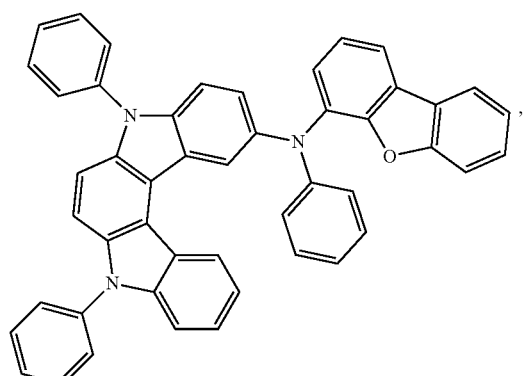
Compound 23
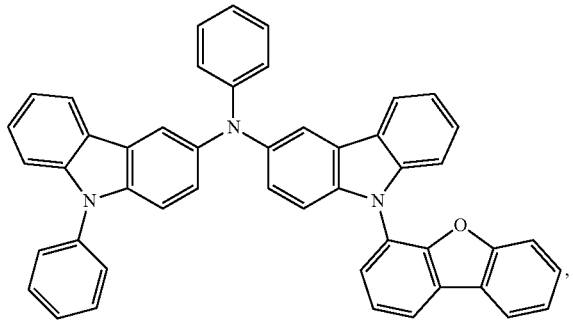
Compound 24
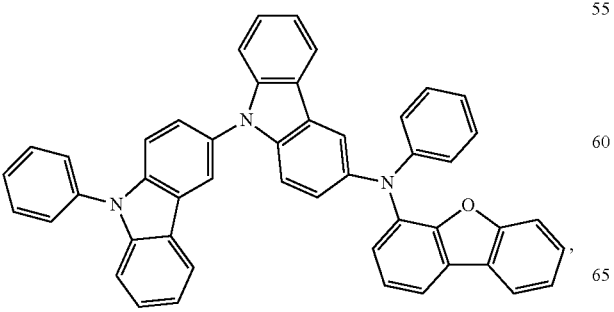
Compound 25
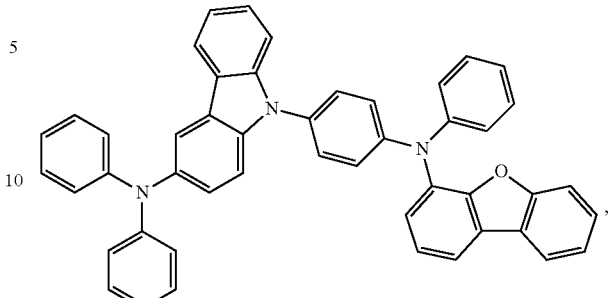
Compound 26
Compound 27
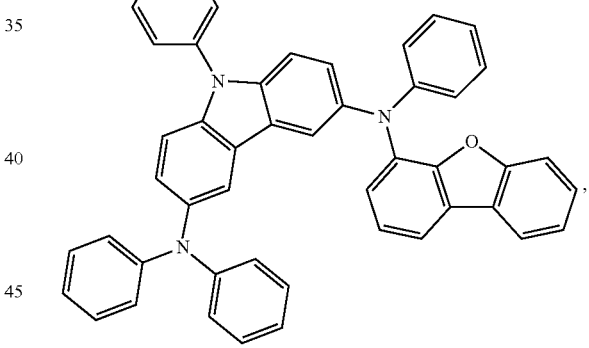
Compound 31
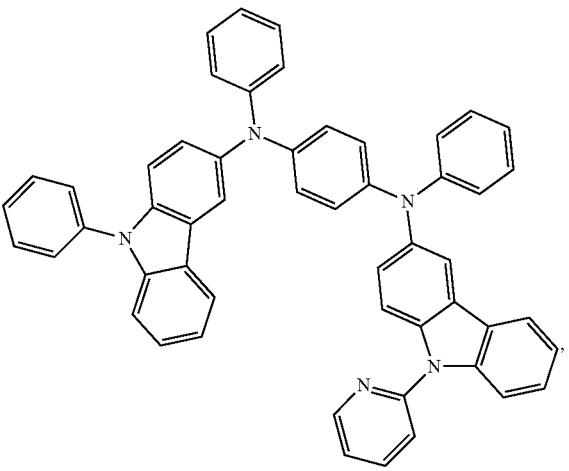

-continued
Compound 32
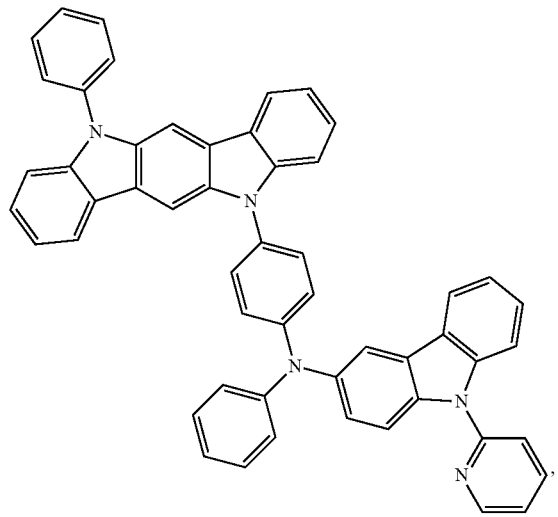
Compound 33
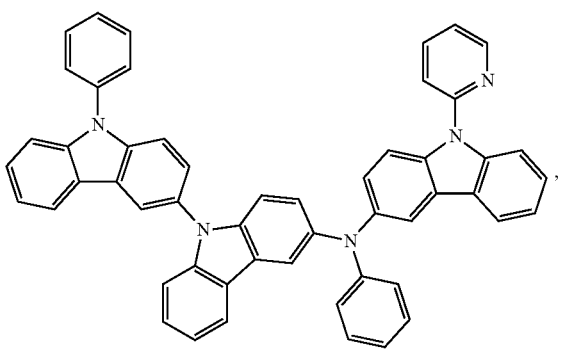
Compound 34
Compound 35
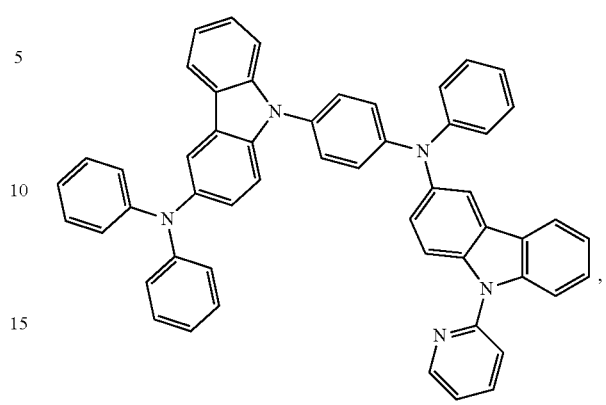
Compound 36
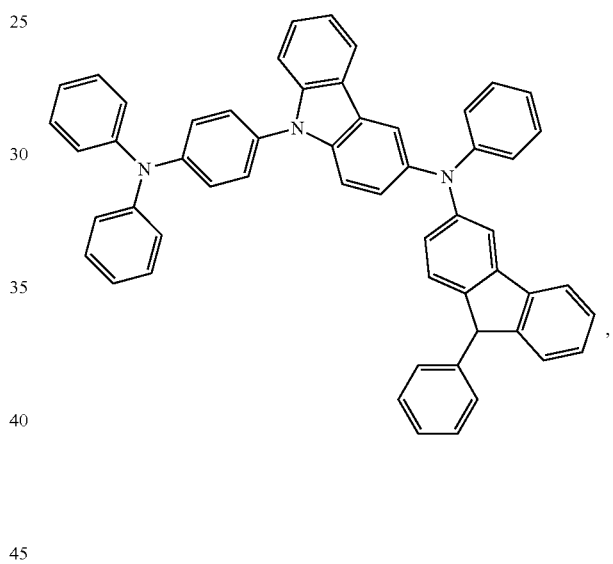
Compound 37
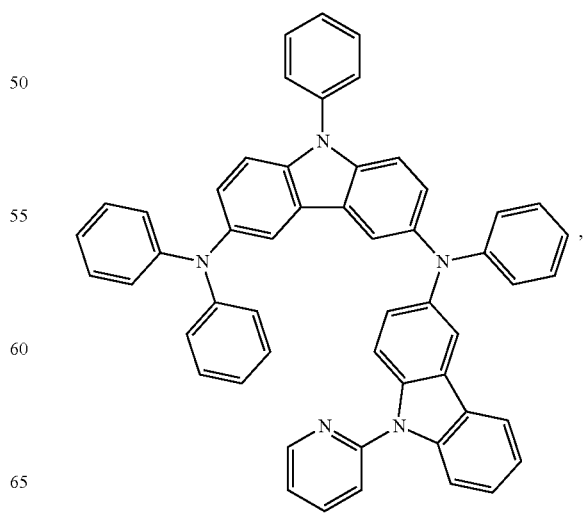

Compound 38
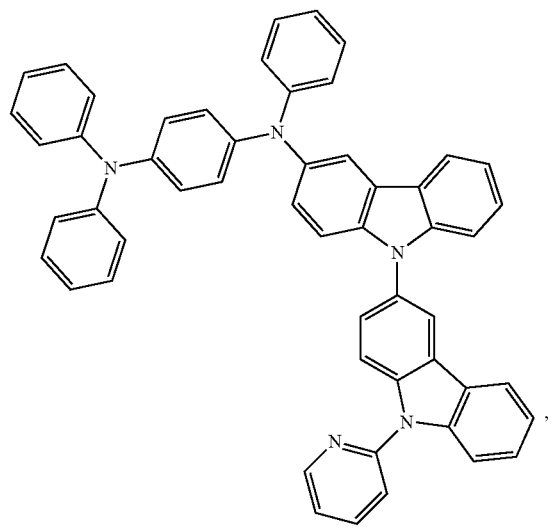
Compound 45
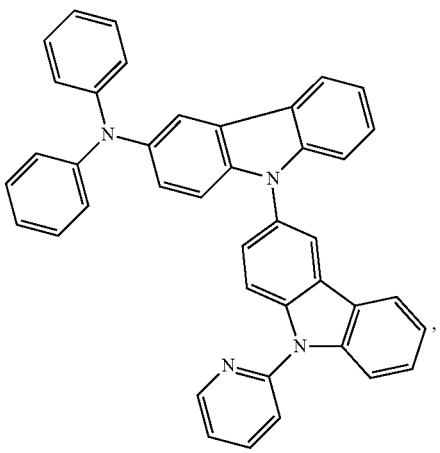
Compound 39
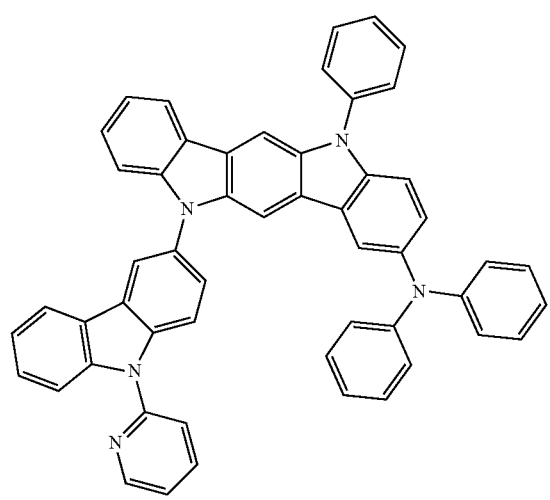
Compound 46
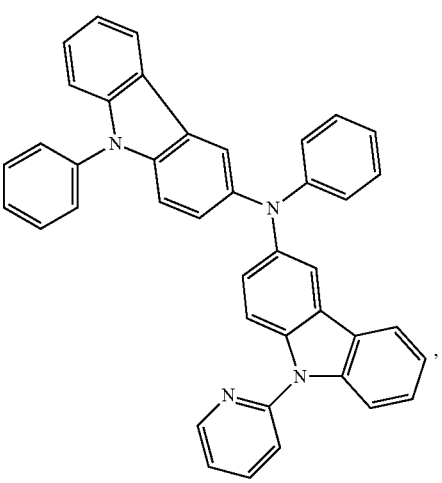
Compound 40
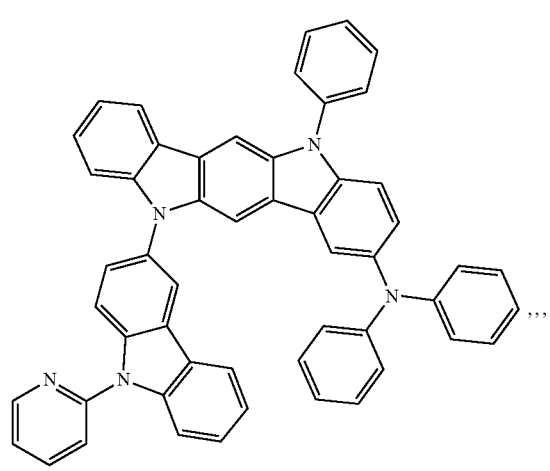
Compound 47
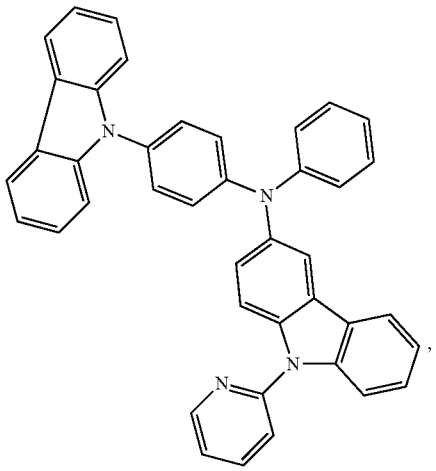

Compound 49
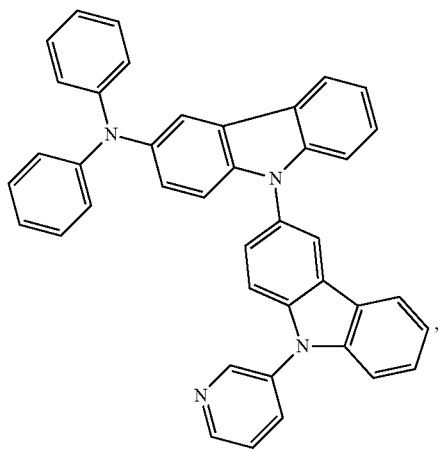
Compound 50
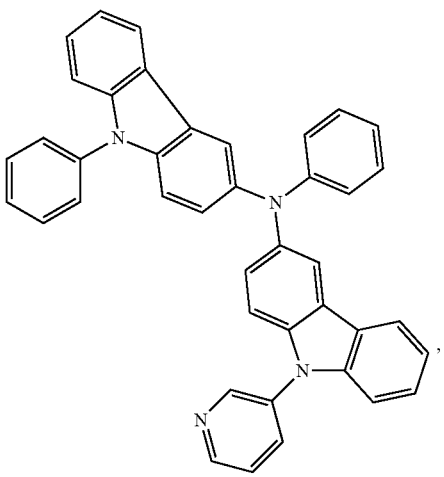
Compound 52
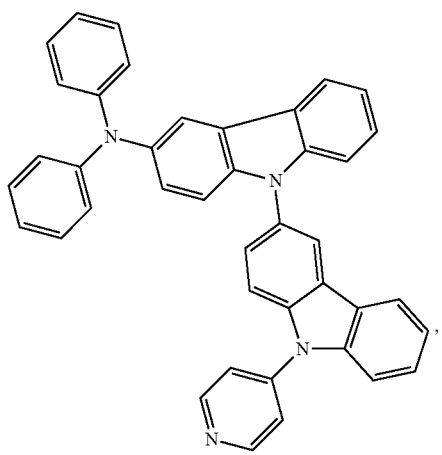
Compound 53
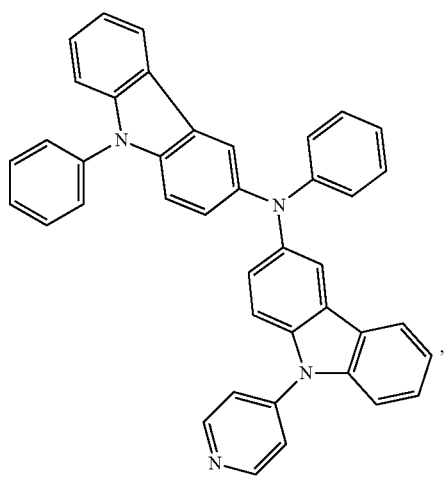
Compound 55
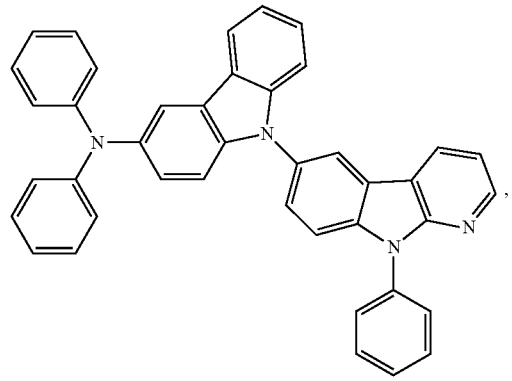
Compound 56
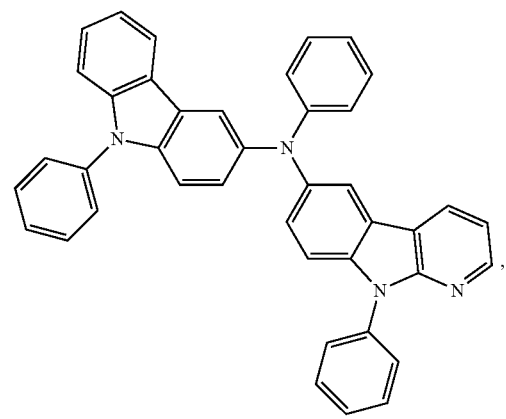

Compound 58
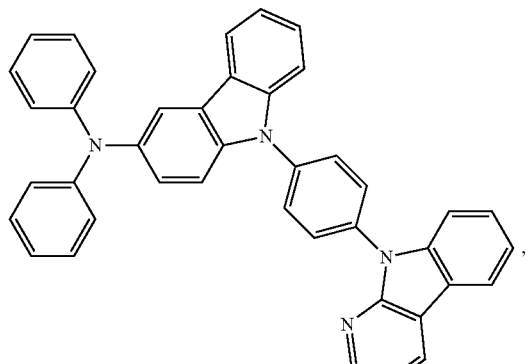

Compound 65
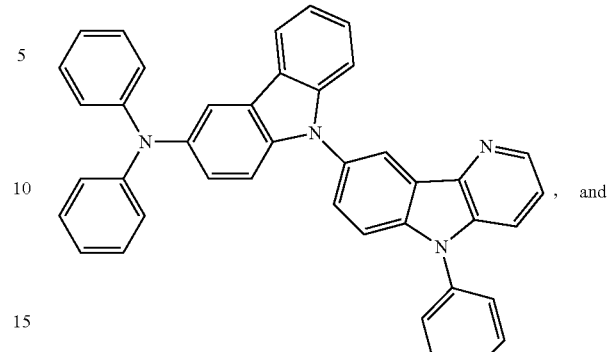
, and

Compound 60
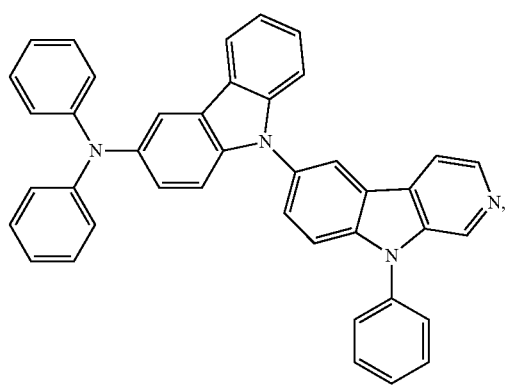

Compound 66
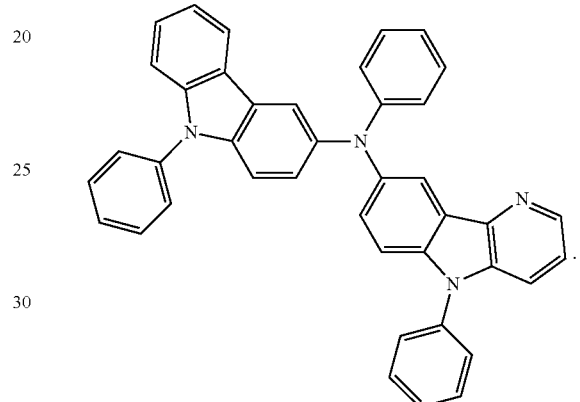

Compound 61
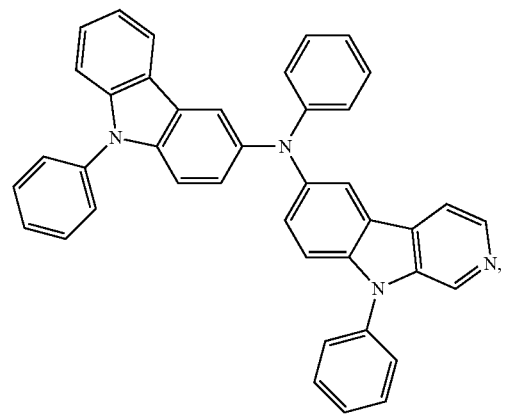

Compound 63
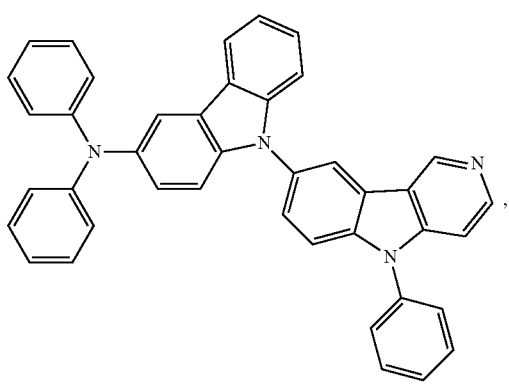

In one embodiment, the emissive layer further comprises a first phosphorescent emitting material.

In one embodiment, wherein the emissive layer further comprises a second phosphorescent emitting material.

In one embodiment, first emissive dopant emits a white light at room temperature when a voltage is applied across the organic light emitting device.

In one embodiment, the first emissive dopant emits a blue light having a peak wavelength between about 400 nm to about 500 nm.

In one embodiment, the first emissive dopant emits a yellow light having a peak wavelength between about 530 nm to about 580 nm.

In one embodiment, the first device comprises a second organic light-emitting device, wherein the second organic light emitting device is stacked on the first organic light emitting device.

In one embodiment, the first device is a consumer product. In one embodiment, the first device is an organic light-emitting device. In one embodiment, the first device comprises a lighting panel.

Device Examples:

In the OLED experiments, all device examples were fabricated by high vacuum ($<10^{-7}$ Torr) thermal evaporation. The anode electrode is ~800 Å of indium tin oxide (ITO). The cathode consisted of 10 Å of LiF followed by 1,000 Å of Al. All devices were encapsulated with a glass lid sealed with an epoxy resin in a nitrogen glove box (<1 ppm of $H_2O$ and $O_2$) and a moisture getter was incorporated inside the package.

The organic stack of the Device Example 1 consists of sequentially, from the ITO surface, 400 Å of Compound A as the hole transporting layer (HTL), 300 Å of Compound B doped with 20% of Compound 5 as the emissive layer (EML), 50 Å of Compound C as the ETL2 and 450 Å of Alq$_3$ as the ETL1.

Device Example 2 consists of sequentially, from the ITO surface, 400 Å of Compound A as the hole transporting layer (HTL), 300 Å of Compound B doped with 20% of Compound 6 as the emissive layer (EML), 50 Å of Compound C as the ETL2 and 450 Å of Alq$_3$ as the ETL1.

The structures of Compounds A, B, and C are depicted below:

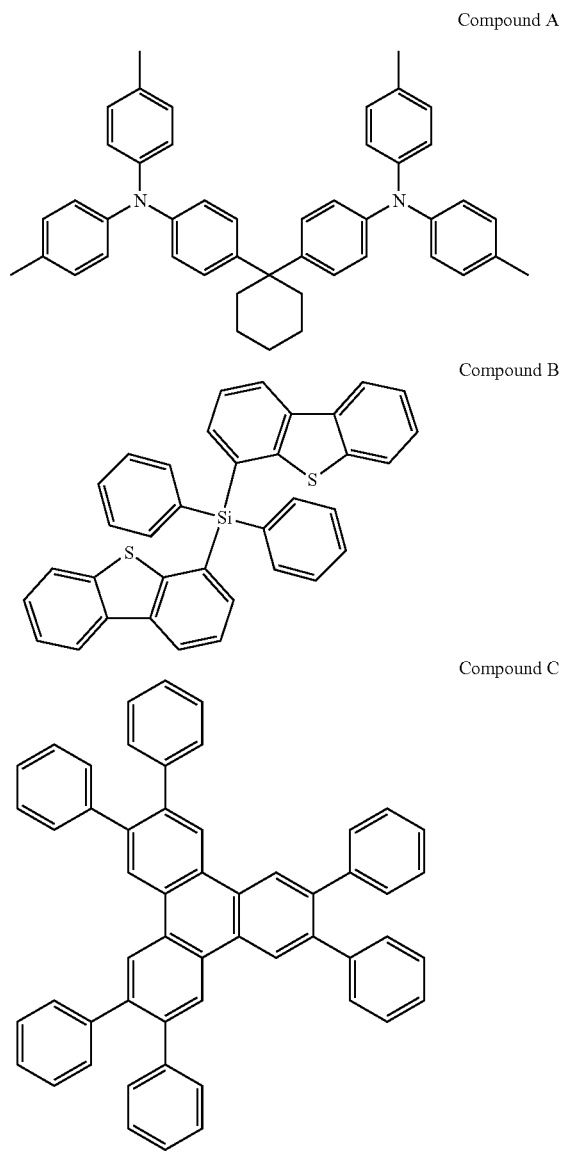

Device Example 1 had an external quantum efficiency of 1.5% at 100 cd/m$^2$. Blue electroluminescence was observed. The CIE coordinates were 0.182, 0.178. Device Example 2 had an external quantum efficiency of 0.9% at 100 cd/m$^2$. Blue electroluminescence was observed. The CIE coordinates were 0.186, 0.175. Compound 5 was used as the emitter in Device Example 1. The PLQY of Compound 5 was 14%. If it behaved as a traditional fluorescent emitter (i.e., no triplet harvesting), the maximum device external quantum efficiency would be about 1.0% assuming charge recombination efficiency was unity and light outcoupling was 30%. The fact that Device Example 1 had an external quantum efficiency of 1.5% suggests that additional radiative channels such as delayed fluorescence are involved.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

HIL/HTL:

A hole injecting/transporting material to be used in the present invention is not particularly limited, and any compound may be used as long as the compound is typically used as a hole injecting/transporting material. Examples of the material include, but not limit to: a phthalocyanine or porphryin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as MoO$_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

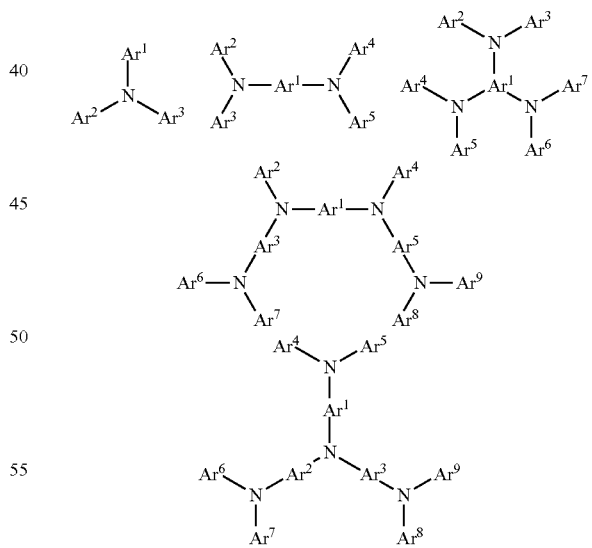

Each of Ar$^1$ to Ar$^9$ is selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each Ar is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, $Ar^1$ to $Ar^9$ is independently selected from the group consisting of:

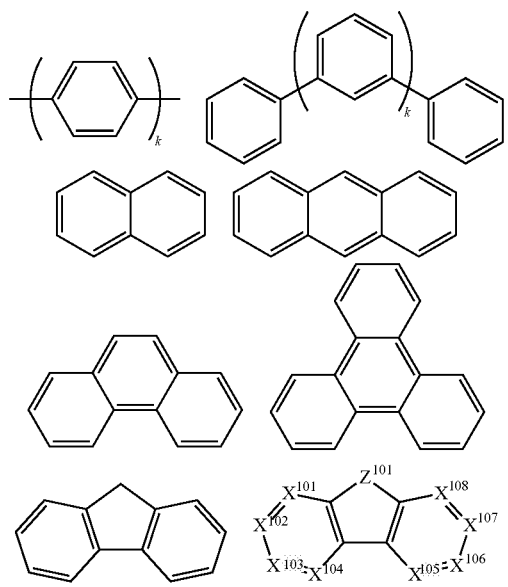

k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but not limit to the following general formula:

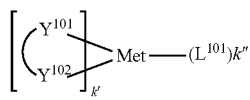

Met is a metal; ($Y^{101}$-$Y^{102}$) is a bidentate ligand, $Y^{101}$ and $Y^{102}$ are independently selected from C, N, O, P, and S; $L^{101}$ is another ligand; k' is an integer value from 1 to the maximum number of ligands that may be attached to the metal; and k'+k" is the maximum number of ligands that may be attached to the metal.

In one aspect, ($Y^{101}$-$Y^{102}$) is a 2-phenylpyridine derivative.

In another aspect, ($Y^{101}$-$Y^{102}$) is a carbene ligand.

In another aspect, Met is selected from Ir, Pt, Os, and Zn.

In a further aspect, the metal complex has a smallest oxidation potential in solution vs. $Fc^+/Fc$ couple less than about 0.6 V.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. While the Table below categorizes host materials as preferred for devices that emit various colors, any host material may be used with any dopant so long as the triplet criteria is satisfied.

Examples of metal complexes used as host are preferred to have the following general formula:

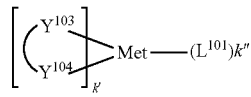

Met is a metal; ($Y^{103}$-$Y^{104}$) is a bidentate ligand, $Y^{103}$ and $Y^{104}$ are independently selected from C, N, O, P, and S; $L^{101}$ is another ligand; k' is an integer value from 1 to the maximum number of ligands that may be attached to the metal; and k'+k" is the maximum number of ligands that may be attached to the metal.

In one aspect, the metal complexes are:

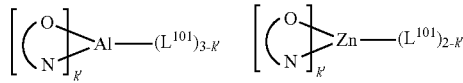

(O—N) is a bidentate ligand, having metal coordinated to atoms O and N.

In another aspect, Met is selected from Ir and Pt.

In a further aspect, ($Y^{103}$-$Y^{104}$) is a carbene ligand.

Examples of organic compounds used as host are selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each group is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, host compound contains at least one of the following groups in the molecule:

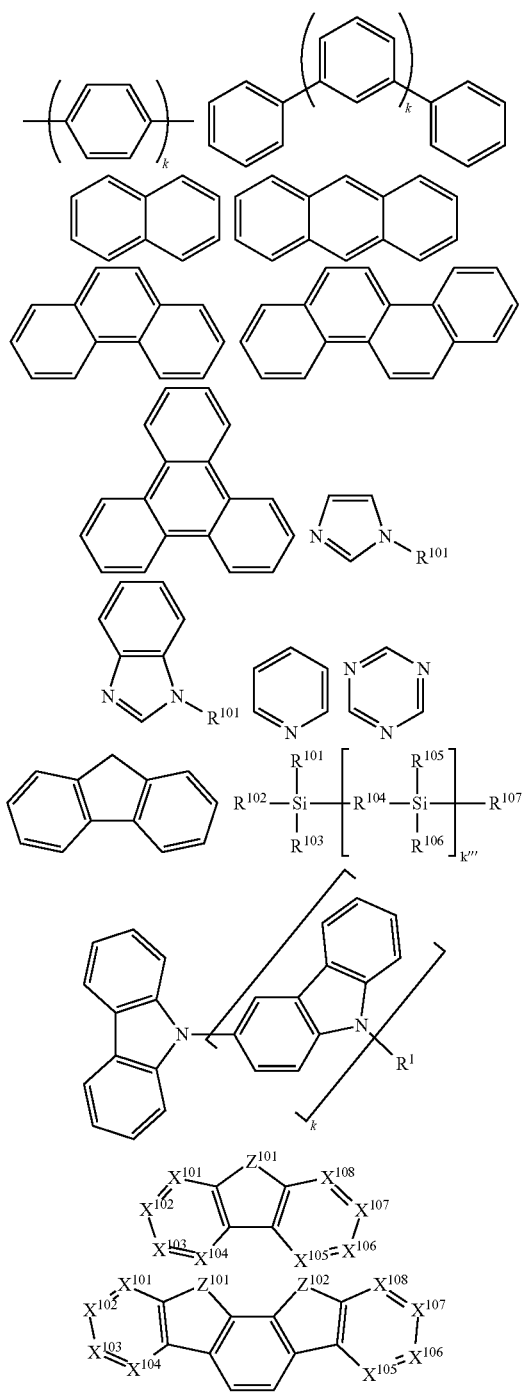

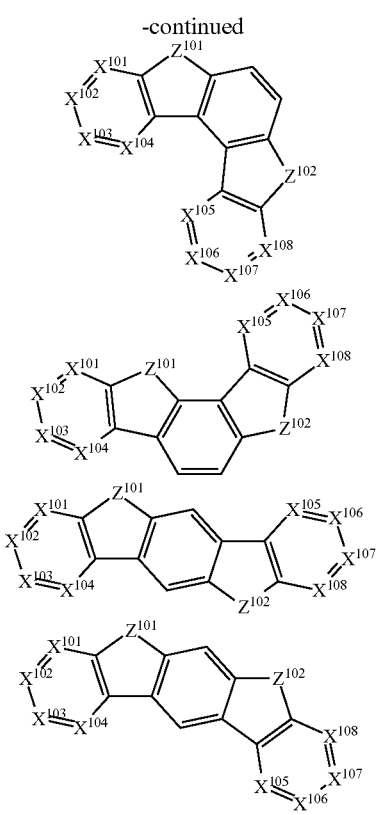

$R^{101}$ to $R^{107}$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above.

k is an integer from 1 to 20; k''' is an integer from 0 to 20.

$X^{101}$ to $X^{108}$ is selected from C (including CH) or N.

$Z^{101}$ and $Z^{102}$ is selected from $NR^{101}$, O, or S.

HBL:

A hole blocking layer (HBL) may be used to reduce the number of holes and/or excitons that leave the emissive layer. The presence of such a blocking layer in a device may result in substantially higher efficiencies as compared to a similar device lacking a blocking layer. Also, a blocking layer may be used to confine emission to a desired region of an OLED.

In one aspect, compound used in HBL contains the same molecule or the same functional groups used as host described above.

In another aspect, compound used in HBL contains at least one of the following groups in the molecule:

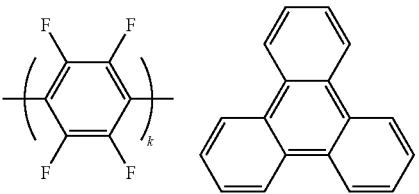

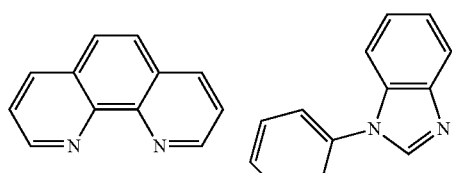
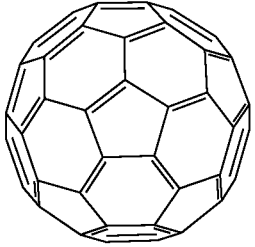
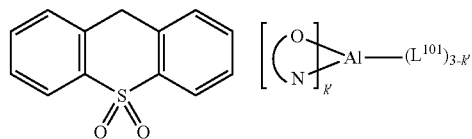

k is an integer from 1 to 20; $L^{101}$ is another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

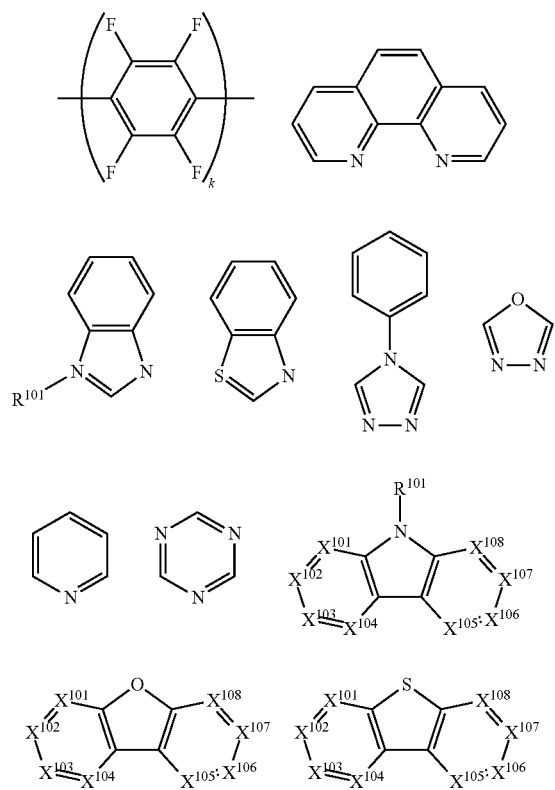

$R^{101}$ is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above.

$Ar^1$ to $Ar^3$ has the similar definition as Ar's mentioned above.

k is an integer from 1 to 20.

$X^{101}$ to $X^{108}$ is selected from C (including CH) or N.

In another aspect, the metal complexes used in ETL contains, but not limit to the following general formula:

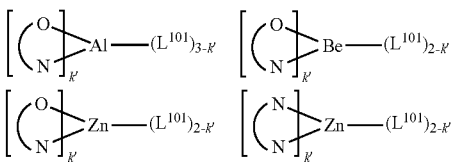

(O—N) or (N—N) is a bidentate ligand, having metal coordinated to atoms O, N or N, N; $L^{101}$ is another ligand; k' is an integer value from 1 to the maximum number of ligands that may be attached to the metal.

In any above-mentioned compounds used in each layer of the OLED device, the hydrogen atoms can be partially or fully deuterated. Thus, any specifically listed substituent, such as, without limitation, methyl, phenyl, pyridyl, etc. encompasses undeuterated, partially deuterated, and fully deuterated versions thereof. Similarly, classes of substituents such as, without limitation, alkyl, aryl, cycloalkyl, heteroaryl, etc. also encompass undeuterated, partially deuterated, and fully deuterated versions thereof.

In addition to and/or in combination with the materials disclosed herein, many hole injection materials, hole transporting materials, host materials, dopant materials, exciton/hole blocking layer materials, electron transporting and electron injecting materials may be used in an OLED. Non-limiting examples of the materials that may be used in an OLED in combination with materials disclosed herein are listed in Table 3 below. Table 3 lists non-limiting classes of materials, non-limiting examples of compounds for each class, and references that disclose the materials.

TABLE 3

| MATERIAL | EXAMPLES OF MATERIAL | PUBLICATIONS |
|---|---|---|
| Hole injection materials | | |
| Phthalocyanine and porphryin compounds | (Cu phthalocyanine structure) | Appl. Phys. Lett. 69, 2160 (1996) |
| Starburst triarylamines | (starburst triarylamine structure) | J. Lumin. 72-74, 985 (1997) |
| $CF_x$ Fluorohydrocarbon polymer | $-[CH_xF_y]_n-$ | Appl. Phys. Lett. 78, 673 (2001) |
| Conducting polymers (e.g., PEDOT:PSS, polyaniline, polypthiophene) | (PEDOT:PSS structure) | Synth. Met. 87, 171 (1997) WO2007002683 |
| Phosphonic acid and sliane SAMs | $N(-C_6H_4-SiCl_3)_3$ | US20030162053 |

TABLE 3-continued
| MATERIAL | EXAMPLES OF MATERIAL | PUBLICATIONS |
|---|---|---|
| Triarylamine or polythiophene polymers with conductivity dopants | 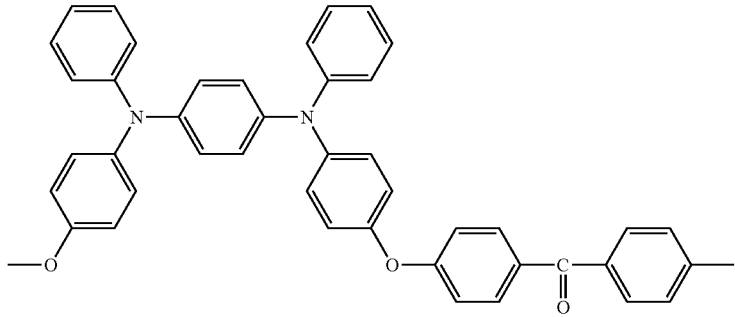 and 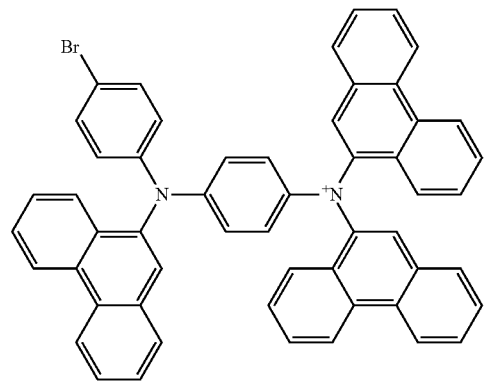 [SMILES: Brc1ccc(N(c2ccc([NH+](c3cc4ccccc4c4ccccc34)c3cc4ccccc4c4ccccc34)cc2)c2cc3ccccc3c3ccccc23)cc1]<br>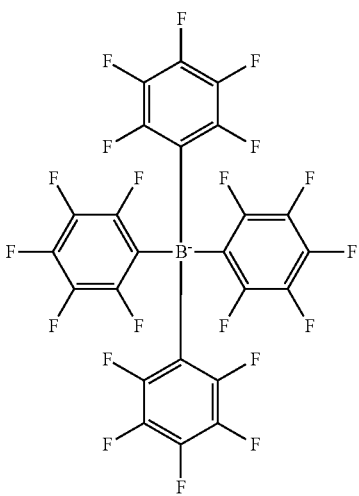 [SMILES: Fc1c(F)c(F)c([B-](c2c(F)c(F)c(F)c(F)c2F)(c2c(F)c(F)c(F)c(F)c2F)c2c(F)c(F)c(F)c(F)c2F)c(F)c1F] | EP1725079A1 |
| Organic compounds with conductive inorganic compounds, such as molybdenum and tungsten oxides | 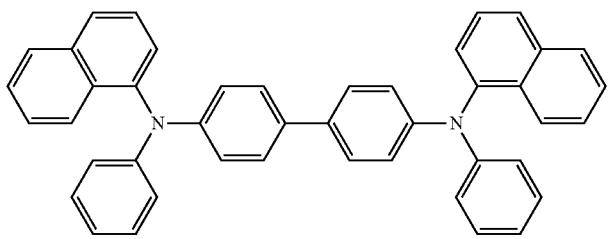 + $MoO_x$ | US20050123751<br>SID Symposium Digest, 37, 923 (2006)<br>WO2009018009 |

TABLE 3-continued
| MATERIAL | EXAMPLES OF MATERIAL | PUBLICATIONS |
|---|---|---|
| n-type semiconducting organic complexes | 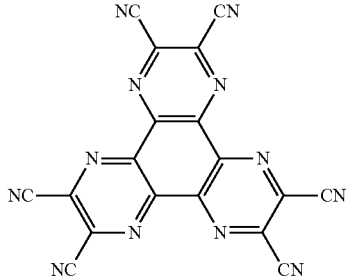 [SMILES: N#Cc1nc2c3nc(C#N)c(C#N)nc3c3nc(C#N)c(C#N)nc3c2nc1C#N] | US20020158242 |
| Metal organometallic complexes | 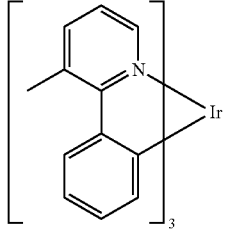 | US20060240279 |
| Cross-linkable compounds | 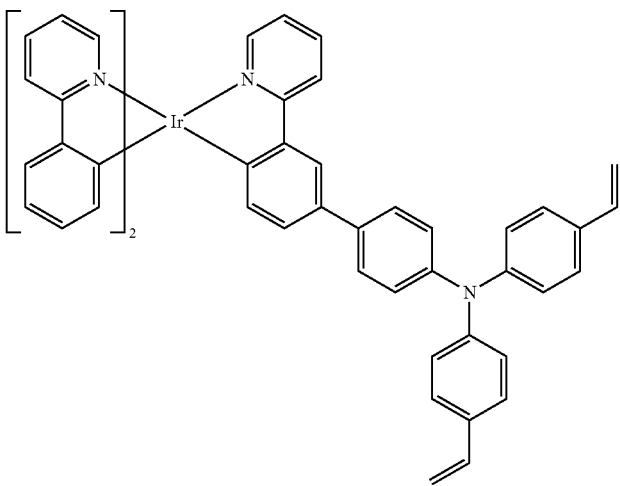 | US20080220265 |
| Polythiophene based polymers and copolymers | 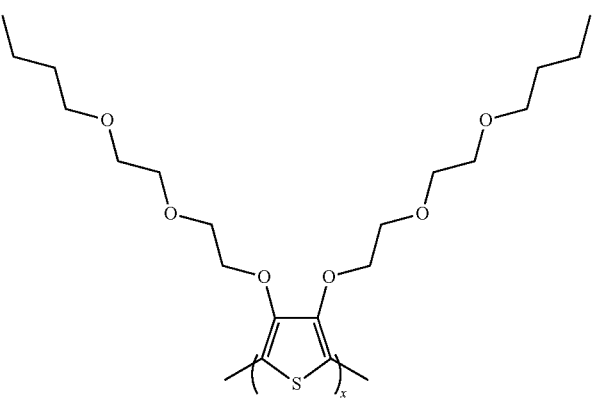 | WO2011075644<br>EP2350216 |

TABLE 3-continued
| MATERIAL | EXAMPLES OF MATERIAL | PUBLICATIONS |
| --- | --- | --- |
| Hole transporting materials | | |
| Triarylamines e.g., TPD, α-NPD) | 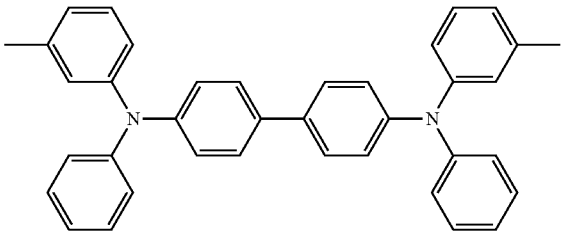 | Appl. Phys. Lett. 51, 913 (1987) |
| | 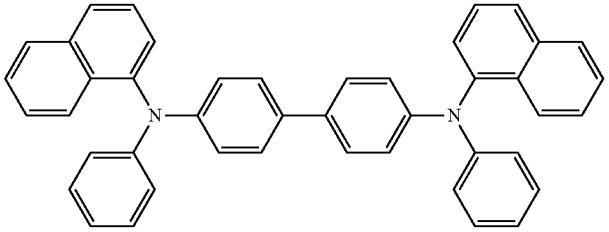 [SMILES: c1ccc(N(c2ccc(-c3ccc(N(c4ccccc4)c4cccc5ccccc45)cc3)cc2)c2cccc3ccccc23)cc1] | U.S. Pat. No. 5,061,569 |
| | 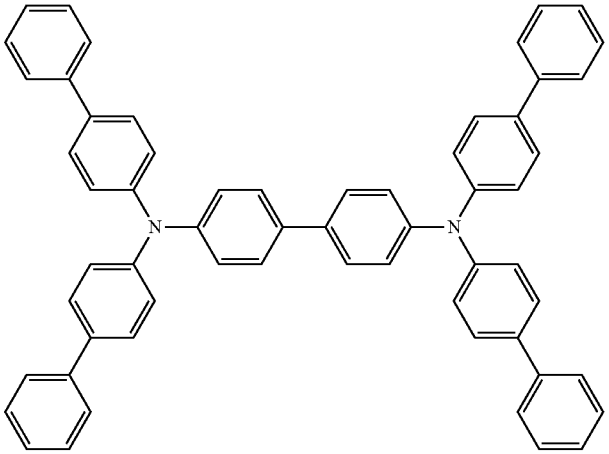 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1] | EP650955 |
| | 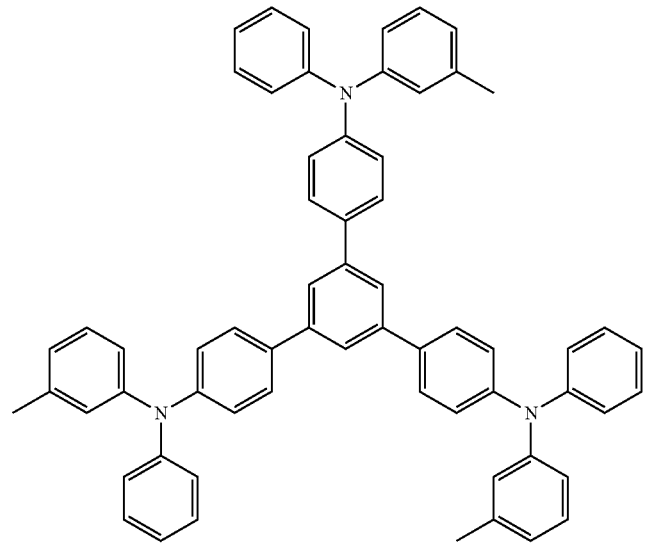 [SMILES: Cc1cccc(N(c2ccccc2)c2ccc(-c3cc(-c4ccc(N(c5ccccc5)c5cccc(C)c5)cc4)cc(-c4ccc(N(c5ccccc5)c5cccc(C)c5)cc4)c3)cc2)c1] | J. Mater. Chem. 3, 319 (1993) |

TABLE 3-continued

| MATERIAL | EXAMPLES OF MATERIAL | PUBLICATIONS |
|---|---|---|
| | | Appl. Phys. Lett. 90, 183503 (2007) |
| | | Appl. Phys. Lett. 90, 183503 (2007) |
| Triaylamine on spirofluorene core | | Synth. Met. 91, 209 (1997) |
| Arylamine carbazole compounds | | Adv. Mater. 6, 677 (1994), US20080124572 |

TABLE 3-continued
| MATERIAL | EXAMPLES OF MATERIAL | PUBLICATIONS |
|---|---|---|
| Triarylamine with (di)benzothiophene/ (di)benzofuran | 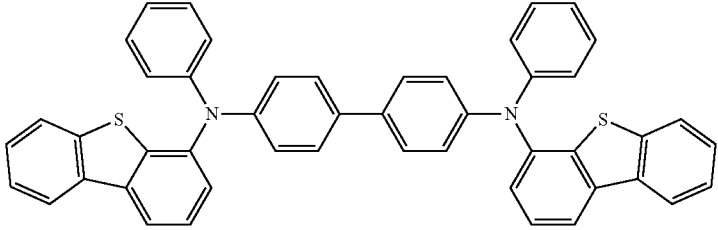 [SMILES: c1ccc(N(c2ccc(-c3ccc(N(c4ccccc4)c4cccc5c4sc4ccccc45)cc3)cc2)c2cccc3c2sc2ccccc23)cc1] | US20070278938, US20080106190 US20110163302 |
| Indolocarbazoles | 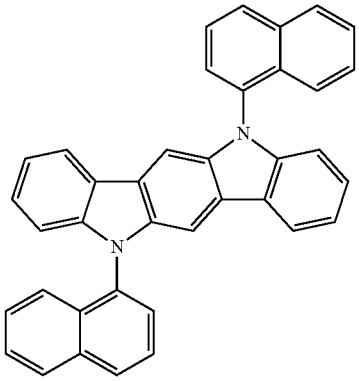 [SMILES: c1ccc2c(-n3c4ccccc4c4cc5c(cc43)c3ccccc3n5-c3cccc4ccccc34)cccc2c1] | Synth. Met. 111, 421 (2000) |
| Isoindole compounds | 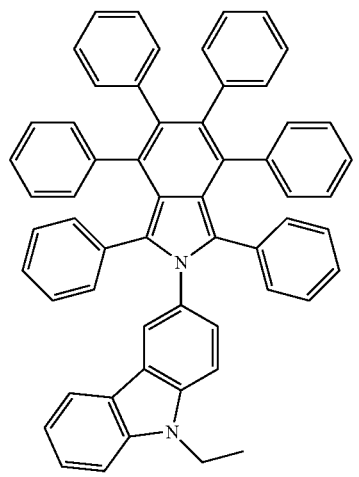 [SMILES: CCn1c2ccccc2c2cc(-n3c(-c4ccccc4)c4c(-c5ccccc5)c(-c5ccccc5)c(-c5ccccc5)c(-c5ccccc5)c4c3-c3ccccc3)ccc21] | Chem. Mater. 15, 3148 (2003) |
| Metal carbene complexes | 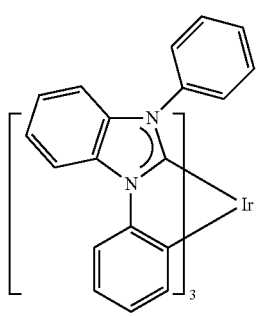 | US20080018221 |

TABLE 3-continued

| MATERIAL | EXAMPLES OF MATERIAL | PUBLICATIONS |
|---|---|---|
| Phosphorescent OLED host materials | | |
| Red hosts | | |
| Arylcarbazoles | | Appl. Phys. Lett. 78, 1622 (2001) |
| Metal 8-hydroxyquinolates (e.g., Alq$_3$, BAlq) | | Nature 395, 151 (1998) |
| | | US20060202194 |
| | | WO2005014551 |
| | | WO2006072002 |
| Metal phenoxybenzothiazole compounds | | Appl. Phys. Lett. 90, 123509 (2007) |
| Conjugated oligomers and polymers (e.g., polyfluorene) | | Org. Electron. 1, 15 (2000) |

TABLE 3-continued

| MATERIAL | EXAMPLES OF MATERIAL | PUBLICATIONS |
|---|---|---|
| Aromatic fused rings | | WO2009066779, WO2009066778, WO2009063833, US20090045731, US20090045730, WO2009008311, US20090008605, US20090009065 |
| Zinc complexes | | WO2010056066 |
| Chrysene based compounds | | WO2011086863 |

Green hosts

| | | |
|---|---|---|
| Arylcarbazoles | | Appl. Phys. Lett. 78, 1622 (2001) |
| | | US20030175553 |
| | | WO2001039234 |

TABLE 3-continued

| MATERIAL | EXAMPLES OF MATERIAL | PUBLICATIONS |
|---|---|---|
| Aryltriphenylene compounds | | US20060280965 |
| | | US20060280965 |
| | | WO2009021126 |
| Poly-fused heteroaryl compounds | | US20090309488<br>US20090302743<br>US20100012931 |
| Donor acceptor type molecules | | WO2008056746 |

TABLE 3-continued
| MATERIAL | EXAMPLES OF MATERIAL | PUBLICATIONS |
|---|---|---|
|  | 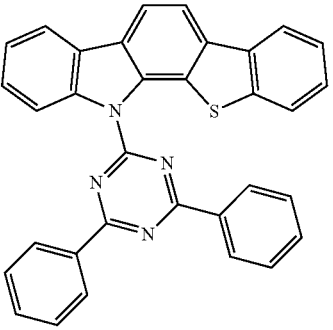 [SMILES: c1ccc(-c2nc(-c3ccccc3)nc(-n3c4ccccc4c4ccc5c6ccccc6sc5c43)n2)cc1] | WO2010107244 |
| Aza-carbazole/ DBT/DBF | 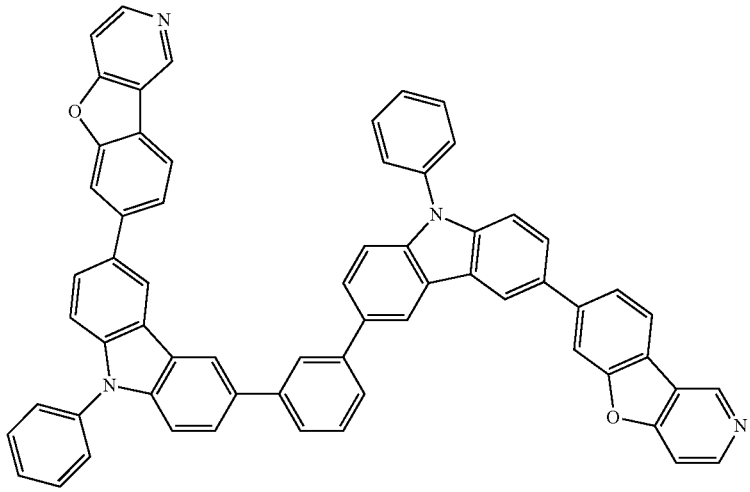 [SMILES: c1ccc(-n2c3ccc(-c4cccc(-c5ccc6c(c5)c5cc(-c7ccc8c(c7)oc7ccncc78)ccc5n6-c5ccccc5)c4)cc3c3cc(-c4ccc5c(c4)oc4ccncc45)ccc32)cc1] | JP2008074939 |
|  | 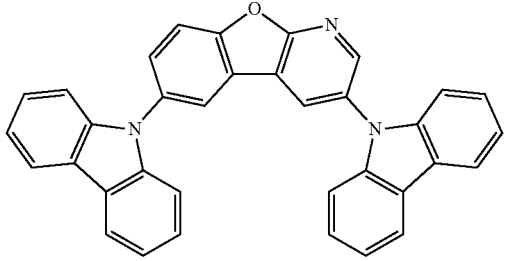 [SMILES: c1ccc2c(c1)c1ccccc1n2-c1ccc2oc3ncc(-n4c5ccccc5c5ccccc54)cc3c2c1] | US20100187984 |
| Polymers (e.g., PVK) | 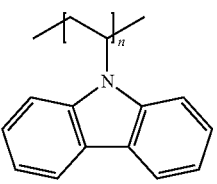 | Appl. Phys. Lett. 77, 2280 (2000) |
| Spirofluorene compounds | 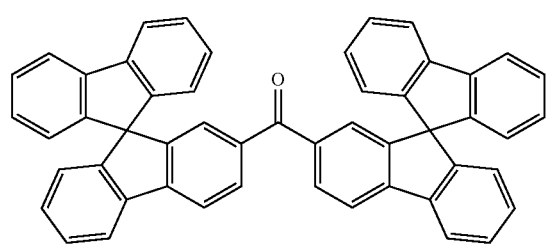 [SMILES: O=C(c1ccc2c(c1)C1(c3ccccc3-c3ccccc31)c1ccccc1-2)c1ccc2c(c1)C1(c3ccccc3-c3ccccc31)c1ccccc1-2] | WO2004093207 |

TABLE 3-continued

| MATERIAL | EXAMPLES OF MATERIAL | PUBLICATIONS |
|---|---|---|
| Metal phenoxybenzooxazole compounds | | WO2005089025 |
| | | WO2006132173 |
| | | JP200511610 |
| Spirofluorene-carbazole compounds | | JP2007254297 |
| | | JP2007254297 |

TABLE 3-continued

| MATERIAL | EXAMPLES OF MATERIAL | PUBLICATIONS |
|---|---|---|
| Indolocabazoles | | WO2007063796 |
| | | WO2007063754 |
| 5-member ring electron deficient heterocycles (e.g., triazole, oxadiazole) | | J. Appl. Phys. 90, 5048 (2001) |
| | | WO2004107822 |
| Tetraphenylene complexes | | US20050112407 |

TABLE 3-continued

| MATERIAL | EXAMPLES OF MATERIAL | PUBLICATIONS |
| --- | --- | --- |
| Metal phenoxypyridine compounds | | WO2005030900 |
| Metal coordination complexes (e.g., Zn, Al with N^N ligands) | | US20040137268, US20040137267 |

Blue hosts

| MATERIAL | EXAMPLES OF MATERIAL | PUBLICATIONS |
| --- | --- | --- |
| Arylcarbazoles | | Appl. Phys. Lett, 82, 2422 (2003) |
| | | US20070190359 |
| Dibenzothiophene/ Dibenzofuran-carbazole compounds | | WO2006114966, US20090167162 |
| | | US20090167162 |

TABLE 3-continued
| MATERIAL | EXAMPLES OF MATERIAL | PUBLICATIONS |
|---|---|---|
| | 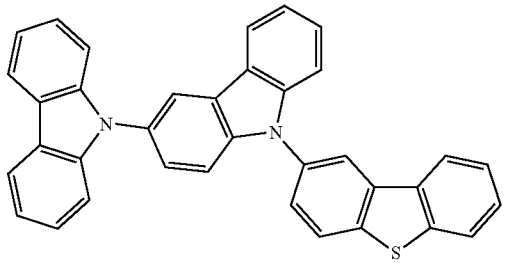 [SMILES: c1ccc2c(c1)sc1ccc(-n3c4ccccc4c4cc(-n5c6ccccc6c6ccccc65)ccc43)cc12] | WO2009086028 |
| | 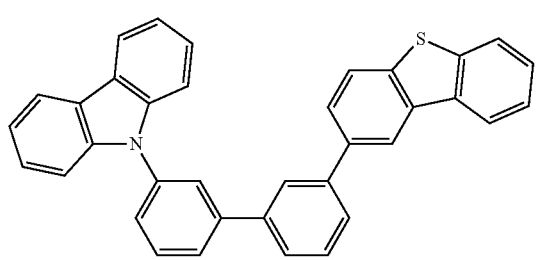 [SMILES: c1cc(-c2cccc(-n3c4ccccc4c4ccccc43)c2)cc(-c2ccc3sc4ccccc4c3c2)c1] | US20090030202, US20090017330 |
| | 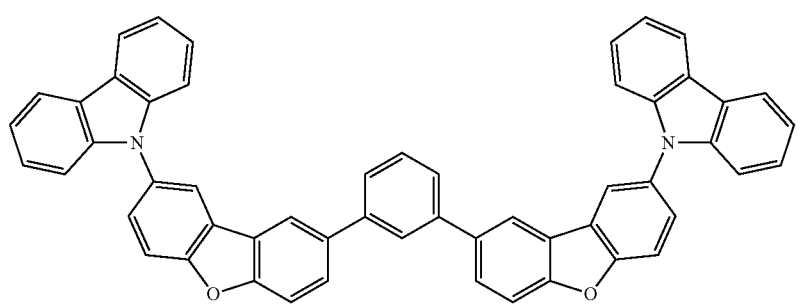 [SMILES: c1cc(-c2ccc3oc4ccc(-n5c6ccccc6c6ccccc65)cc4c3c2)cc(-c2ccc3oc4ccc(-n5c6ccccc6c6ccccc65)cc4c3c2)c1] | US20100084966 |
| Silicon aryl compounds | 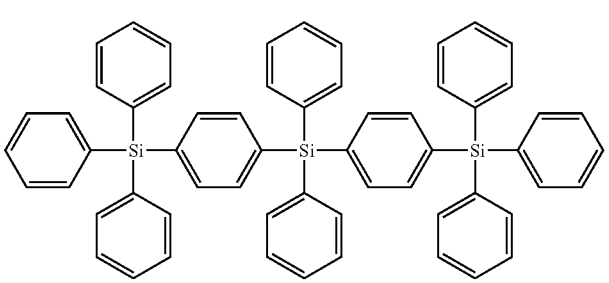 [SMILES: c1ccc([Si](c2ccccc2)(c2ccccc2)c2ccc([Si](c3ccccc3)(c3ccccc3)c3ccc([Si](c4ccccc4)(c4ccccc4)c4ccccc4)cc3)cc2)cc1] | US20050238919 |
| | 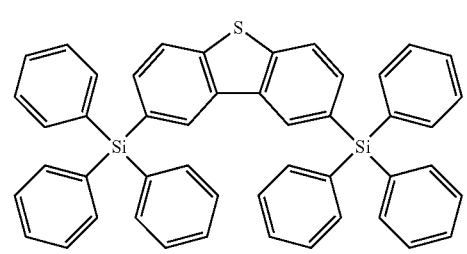 [SMILES: c1ccc([Si](c2ccccc2)(c2ccccc2)c2ccc3sc4ccc([Si](c5ccccc5)(c5ccccc5)c5ccccc5)cc4c3c2)cc1] | WO2009003898 |

TABLE 3-continued

| MATERIAL | EXAMPLES OF MATERIAL | PUBLICATIONS |
| --- | --- | --- |
| Silicon/Germanium aryl compounds | | EP2034538A |
| Aryl benzoyl ester | | WO2006100298 |
| Carbazole linked by non-conjugated groups | | US20040115476 |
| Aza-carbazoles | | US20060121308 |
| High triplet metal organometallic complex | | U.S. Pat. No. 7,154,114 |

TABLE 3-continued

| MATERIAL | EXAMPLES OF MATERIAL | PUBLICATIONS |
|---|---|---|
| | Phosphorescent dopants | |
| | Red dopants | |
| Heavy metal porphyrins (e.g., PtOEP) | | Nature 395, 151 (1998) |
| Iridium (III) organometallic complexes | | Appl. Phys. Lett. 78, 1622 (2001) |
| | | US2006835469 |
| | | US2006835469 |
| | | US20060202194 |

TABLE 3-continued

| MATERIAL | EXAMPLES OF MATERIAL | PUBLICATIONS |
|---|---|---|
| | | US20060202194 |
| | | US20070087321 |
| | | US20080261076<br>US20100090591 |
| | | US20070087321 |
| | | Adv. Mater. 19, 739 (2007) |

TABLE 3-continued

| MATERIAL | EXAMPLES OF MATERIAL | PUBLICATIONS |
|---|---|---|
| | | WO2009100991 |
| | | WO2008101842 |
| | | U.S. Pat. No. 7,232,618 |
| Platinum (II) organometallic complexes | | WO2003040257 |
| | | US20070103060 |

TABLE 3-continued
| MATERIAL | EXAMPLES OF MATERIAL | PUBLICATIONS |
| --- | --- | --- |
| Osminum (III) complexes | 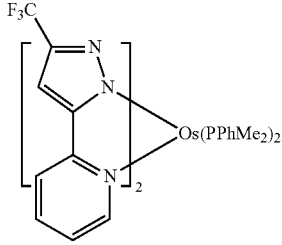 | Chem. Mater. 17, 3532 (2005) |
| Ruthenium (II) complexes | 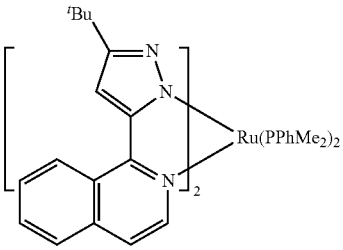 | Adv. Mater. 17, 1059 (2005) |
| Rhenium (I), (II), and (III) complexes | 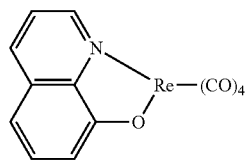 | US20050244673 |
Green dopants
| Iridium (III) organometallic complexes | 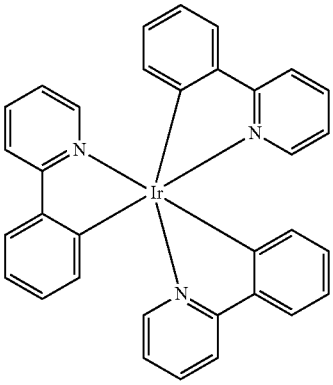<br>and its derivatives | Inorg. Chem. 40, 1704 (2001) |
| --- | --- | --- |
| | 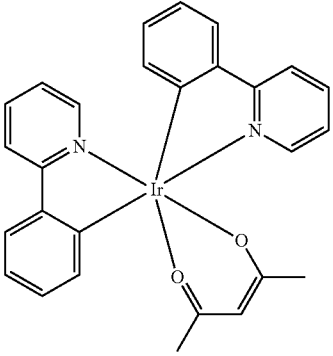 | US20020034656 |

TABLE 3-continued
| MATERIAL | EXAMPLES OF MATERIAL | PUBLICATIONS |
|---|---|---|
| | 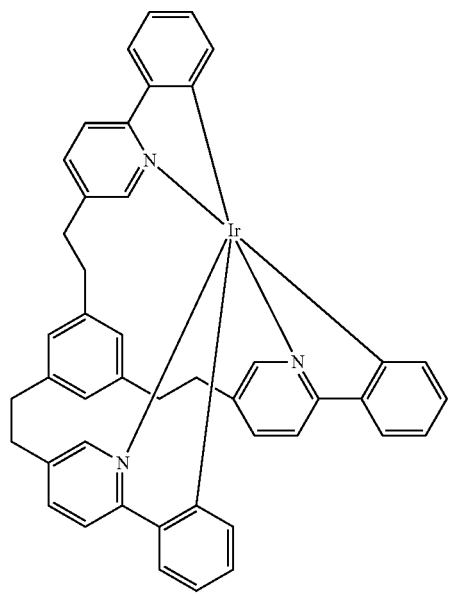 | U.S. Pat. No. 7,332,232 |
| | 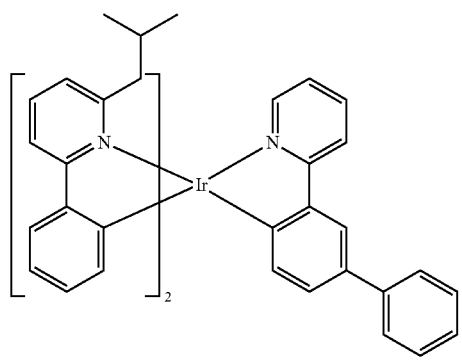 | US20090108737 |
| | 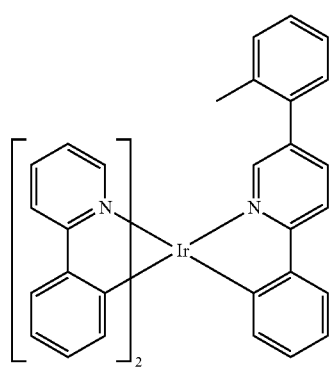 | WO2010028151 |

TABLE 3-continued
| MATERIAL | EXAMPLES OF MATERIAL | PUBLICATIONS |
|---|---|---|
| | 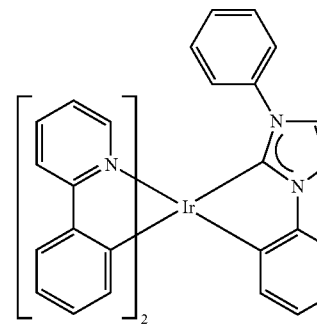 | EP1841834B |
| | 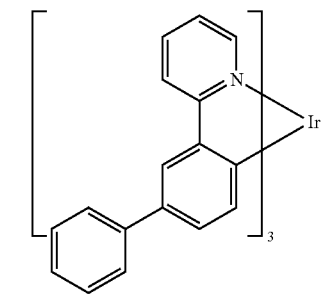 | US20060127696 |
| | 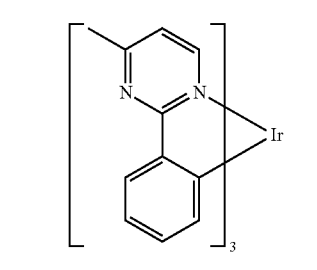 | US20090039776 |
| | 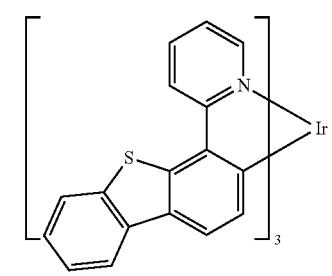 | U.S. Pat. No. 6,921,915 |
| | 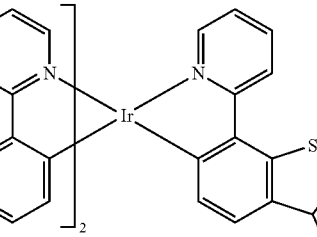 | US20100244004 |

TABLE 3-continued
| MATERIAL | EXAMPLES OF MATERIAL | PUBLICATIONS |
|---|---|---|
| | 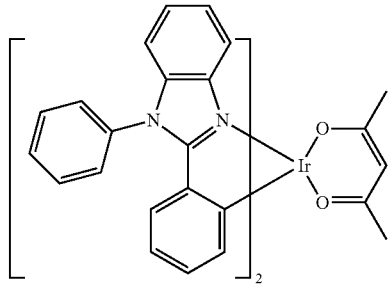 | U.S. Pat. No. 6,687,266 |
| | 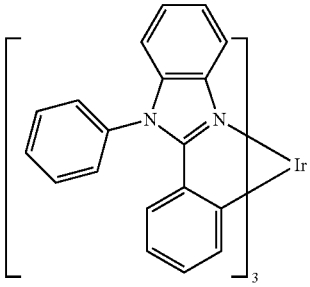 | Chem. Mater. 16, 2480 (2004) |
| | 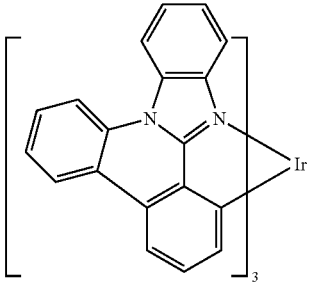 | US20070190359 |
| | 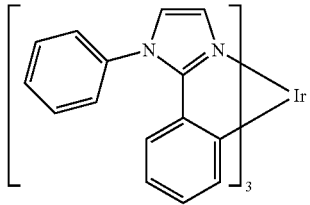 | US20060008670 JP2007123392 |
| | 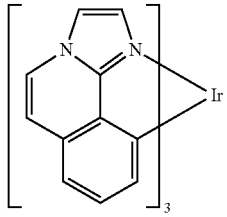 | WO2010086089, WO2011044988 |
| | 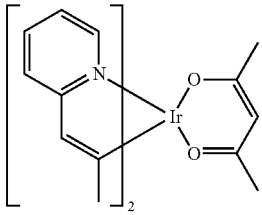 | Adv. Mater. 16, 2003 (2004) |

TABLE 3-continued

| MATERIAL | EXAMPLES OF MATERIAL | PUBLICATIONS |
|---|---|---|
| | | Angew. Chem. Int. Ed. 2006, 45, 7800 |
| | | WO2009050290 |
| | | US20090165846 |
| | | US20080015355 |
| | | US20010015432 |
| | | US20100295032 |

TABLE 3-continued

| MATERIAL | EXAMPLES OF MATERIAL | PUBLICATIONS |
| --- | --- | --- |
| Monomer for polymeric metal organometallic compounds | | U.S. Pat. No. 7,250,226, U.S. Pat. No. 7,396,598 |
| Pt (II) organometallic complexes, including polydentated ligands | | Appl. Phys. Lett. 86, 153505 (2005) |
| | | Appl. Phys. Lett. 86, 153505 (2005) |
| | | Chem. Lett. 34, 592 (2005) |
| | | WO2002015645 |

TABLE 3-continued
| MATERIAL | EXAMPLES OF MATERIAL | PUBLICATIONS |
|---|---|---|
| | 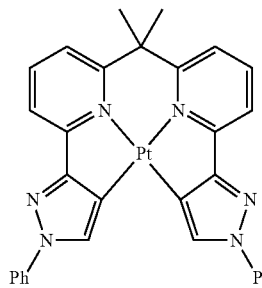 | US20060263635 |
| | 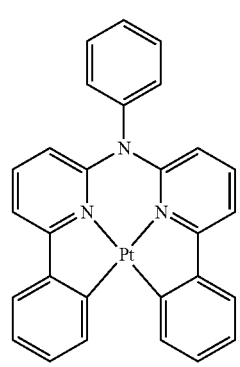 | US20060182992<br>US20070103060 |
| Cu complexes | 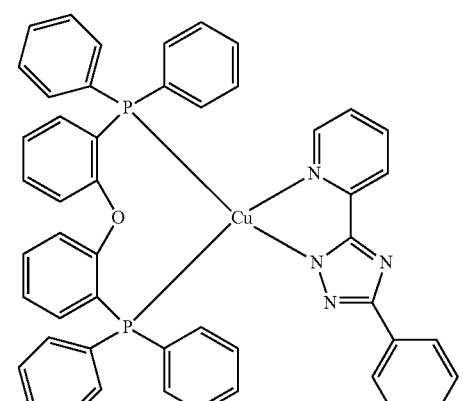 | WO2009000673 |
| | 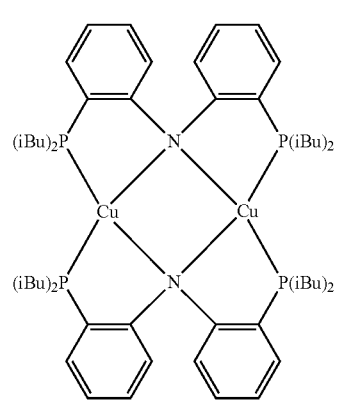 | US20070111026 |

TABLE 3-continued
| MATERIAL | EXAMPLES OF MATERIAL | PUBLICATIONS |
|---|---|---|
| Gold complexes | 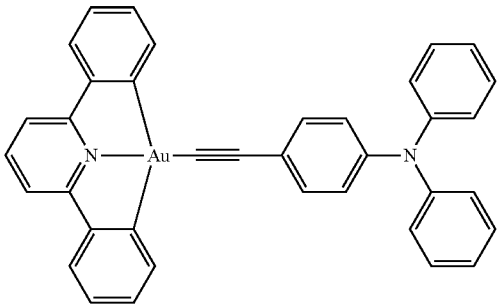 | Chem. Commun. 2906 (2005) |
| Rhenium (III) complexes | 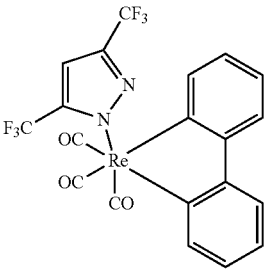 | Inorg. Chem. 42, 1248 (2003) |
| Osmium (II) complexes | 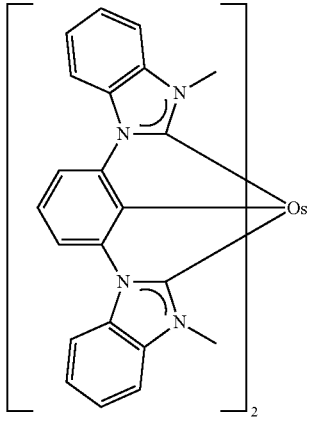 | U.S. Pat. No. 7,279,704 |
| Deuterated organometallic complexes | 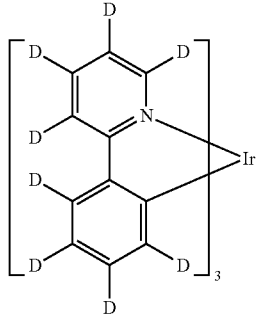 | US20030138657 |

| MATERIAL | EXAMPLES OF MATERIAL | PUBLICATIONS |
|---|---|---|
| Organometallic complexes with two or more metal centers | 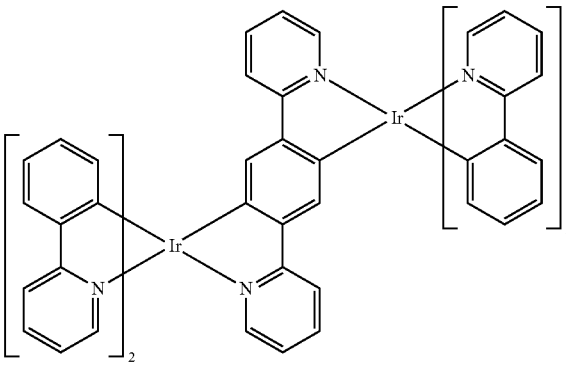 | US20030152802 |
| | 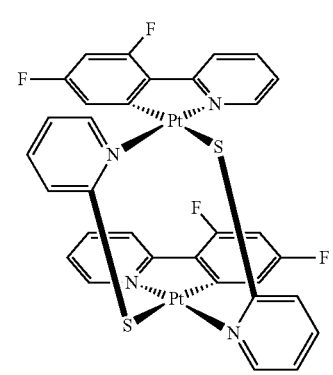 | U.S. Pat. No. 7,090,928 |
Blue dopants
| MATERIAL | EXAMPLES OF MATERIAL | PUBLICATIONS |
|---|---|---|
| Iridium (III) organometallic complexes | 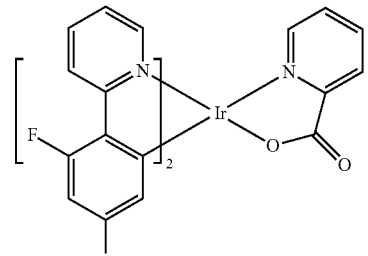 | WO2002002714 |
| | 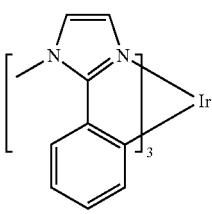 | WO2006009024 |
| | 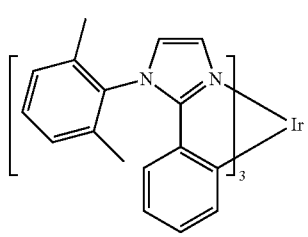 | US20060251923<br>US20110057559<br>US20110204333 |

TABLE 3-continued

| MATERIAL | EXAMPLES OF MATERIAL | PUBLICATIONS |
| --- | --- | --- |
| | | U.S. Pat. No. 7,393,599, WO2006056418, US20050260441, WO2005019373 |
| | | U.S. Pat. No. 7,534,505 |
| | | WO2011051404 |
| | | U.S. Pat. No. 7,445,855 |
| | | US20070190359, US20080297033 US20100148663 |

TABLE 3-continued
| MATERIAL | EXAMPLES OF MATERIAL | PUBLICATIONS |
|---|---|---|
| | 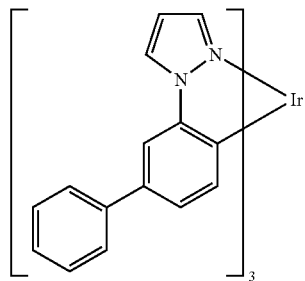 | U.S. Pat. No. 7,338,722 |
| | 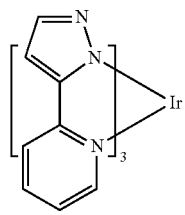 | US20020134984 |
| | 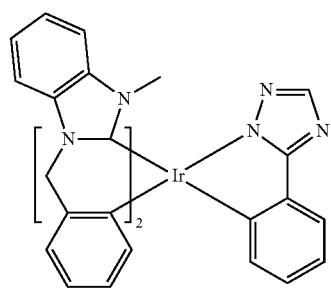 | Angew. Chem. Int. Ed. 47, 1 (2008) |
| | 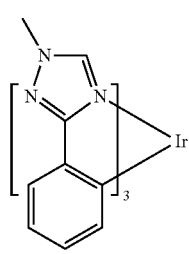 | Chem. Mater. 18, 5119 (2006) |
| | 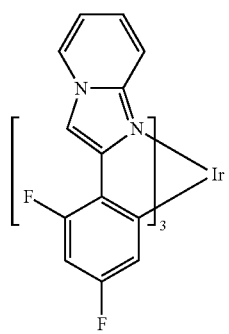 | Inorg. Chem. 46, 4308 (2007) |

| MATERIAL | EXAMPLES OF MATERIAL | PUBLICATIONS |
|---|---|---|
| | 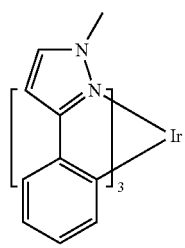 | WO2005123873 |
| | 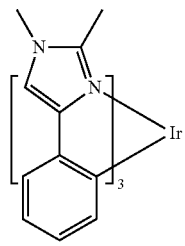 | WO2005123873 |
| | 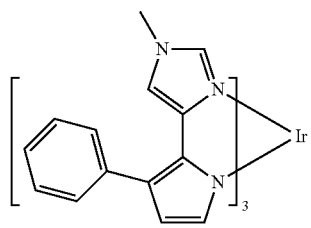 | WO2007004380 |
| | 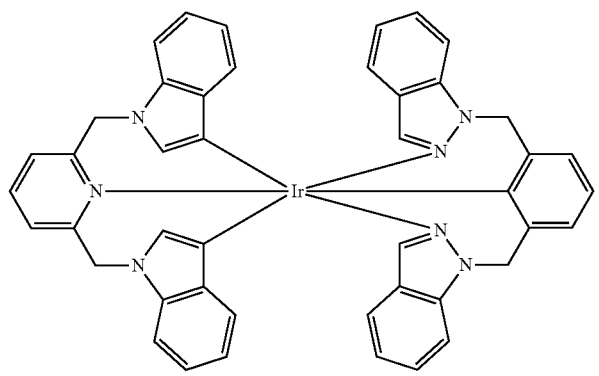 | WO2006082742 |
| Osmium (II) complexes | 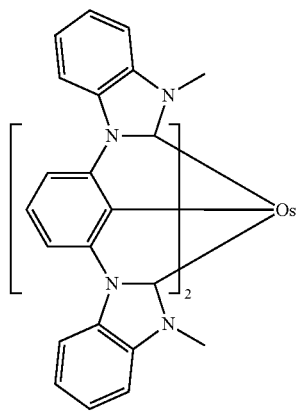 | U.S. Pat. No. 7,279,704 |

TABLE 3-continued

| MATERIAL | EXAMPLES OF MATERIAL | PUBLICATIONS |
|---|---|---|
| | 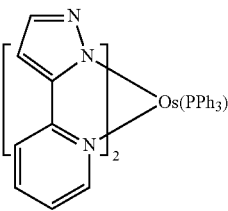 | Organometallics 23, 3745 (2004) |
| Gold complexes | 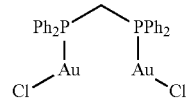 | Appl. Phys. Lett. 74, 1361 (1999) |
| Platinum (II) complexes | 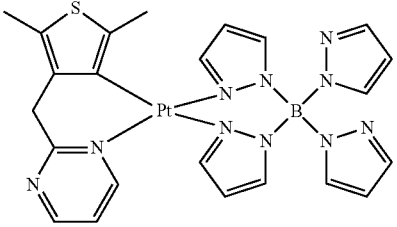 | WO2006098120, WO2006103874 |
| Pt tetradentate complexes with at least one metal-carbene bond | 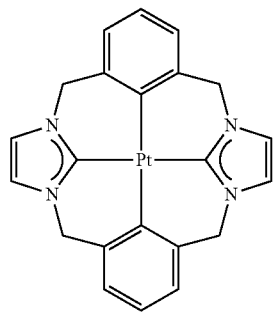 | U.S. Pat. No. 7,655,323 |
| Exciton/hole blocking layer materials | | |
| Bathocuprine compounds (e.g., BCP, BPhen) | 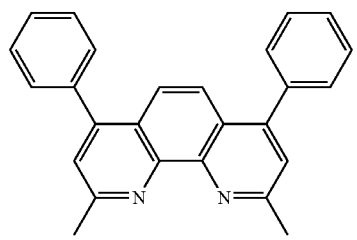 [SMILES: Cc1cc(-c2ccccc2)c2ccc3c(-c4ccccc4)cc(C)nc3c2n1] | Appl. Phys. Lett. 75, 4 (1999) |
| | 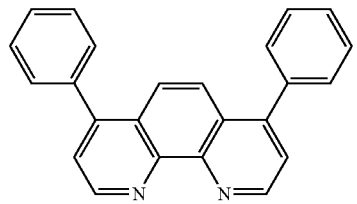 [SMILES: c1ccc(-c2ccnc3c2ccc2c(-c4ccccc4)ccnc23)cc1] | Appl. Phys. Lett. 79, 449 (2001) |
| Metal 8-hydroxyquinolates (e.g., BAlq) | 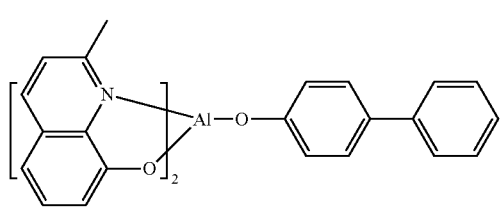 | Appl. Phys. Lett. 81, 162 (2002) |

TABLE 3-continued

| MATERIAL | EXAMPLES OF MATERIAL | PUBLICATIONS |
| --- | --- | --- |
| 5-member ring electron deficient heterocycles such as triazole, oxadiazole, imidazole, benzoimidazole | | Appl. Phys. Lett. 81, 162 (2002) |
| Triphenylene compounds | | US20050025993 |
| Fluorinated aromatic compounds | | Appl. Phys. Lett. 79, 156 (2001) |

TABLE 3-continued

| MATERIAL | EXAMPLES OF MATERIAL | PUBLICATIONS |
|---|---|---|
| Phenothiazine-S-oxide | | WO2008132085 |
| Silylated five-membered nitrogen, oxygen, sulfur or phosphorus dibenzoheterocycles | | WO2010079051 |
| Aza-carbazoles | | US20060121308 |
| Electron transporting materials | | |
| Anthracene-benzoimidazole compounds | | WO2003060956 |
| | | US20090179554 |

TABLE 3-continued

| MATERIAL | EXAMPLES OF MATERIAL | PUBLICATIONS |
| --- | --- | --- |
| Aza triphenylene derivatives | | US20090115316 |
| Anthracene-benzothiazole compounds | | Appl. Phys. Lett. 89, 063504 (2006) |
| Metal 8-hydroxyquinolates (e.g., $Alq_3$, $Zrq_4$) | | Appl. Phys. Lett. 51, 913 (1987) U.S. Pat. No. 7,230,107 |
| Metal hydroxybenoquinolates | | Chem. Lett. 5, 905 (1993) |
| Bathocuprine compounds such as BCP, BPhen, etc | | Appl. Phys. Lett. 91, 263503 (2007) |
| | | Appl. Phys. Lett. 79, 449 (2001) |

TABLE 3-continued
| MATERIAL | EXAMPLES OF MATERIAL | PUBLICATIONS |
|---|---|---|
| 5-member ring electron deficient heterocycles (e.g., triazole, oxadiazole, imidazole, benzoimidazole) | 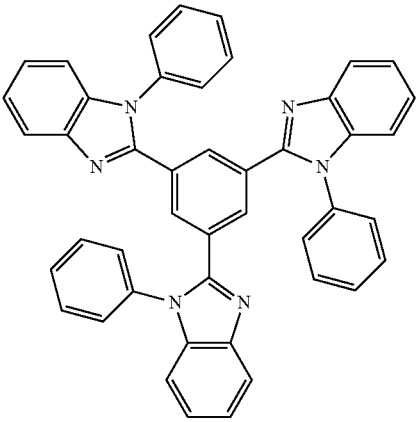 [SMILES: c1ccc(-n2c(-c3cc(-c4nc5ccccc5n4-c4ccccc4)cc(-c4nc5ccccc5n4-c4ccccc4)c3)nc3ccccc32)cc1] | Appl. Phys. Lett. 74, 865 (1999) |
| | 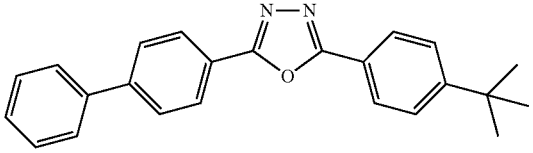 [SMILES: CC(C)(C)c1ccc(-c2nnc(-c3ccc(-c4ccccc4)cc3)o2)cc1] | Appl. Phys. Lett. 55, 1489 (1989) |
| | 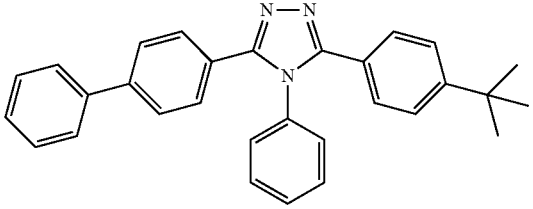 [SMILES: CC(C)(C)c1ccc(-c2nnc(-c3ccc(-c4ccccc4)cc3)n2-c2ccccc2)cc1] | Jpn. J. Apply. Phys. 32, L917 (1993) |
| Silole compounds | 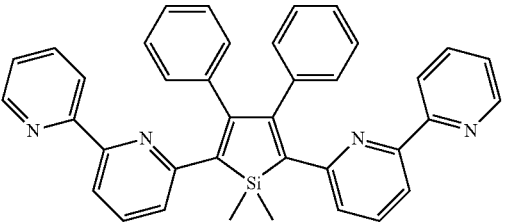 [SMILES: C[Si]1(C)C(c2cccc(-c3ccccn3)n2)=C(c2ccccc2)C(c2ccccc2)=C1c1cccc(-c2ccccn2)n1] | Org. Electron. 4, 113 (2003) |
| Arylborane compounds | 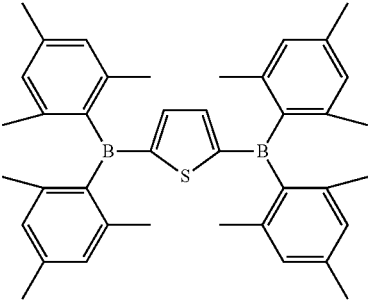 | J. Am. Chem. Soc. 120, 9714 (1998) |
| Fluorinated aromatic compounds | 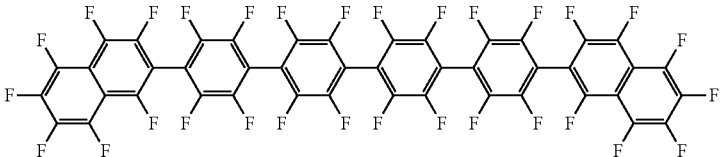 [SMILES: Fc1c(F)c(-c2c(F)c(F)c(-c3c(F)c(F)c4c(F)c(F)c(F)c(F)c4c3F)c(F)c2F)c(F)c(F)c1-c1c(F)c(F)c(-c2c(F)c(F)c(-c3c(F)c(F)c4c(F)c(F)c(F)c(F)c4c3F)c(F)c2F)c(F)c1F] | J. Am. Chem. Soc. 122, 1832 (2000) |

TABLE 3-continued

| MATERIAL | EXAMPLES OF MATERIAL | PUBLICATIONS |
| --- | --- | --- |
| Fullerene (e.g., C60) | 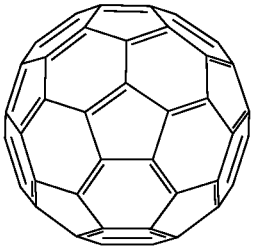 [SMILES: c1cc2c3ccc4c5ccc6c7ccc8c9ccc%10c1c1c2c2c3c4c3c5c6c4c7c8c5c9c%10c1c1c2c3c4c51] | US20090101870 |
| Triazine complexes | 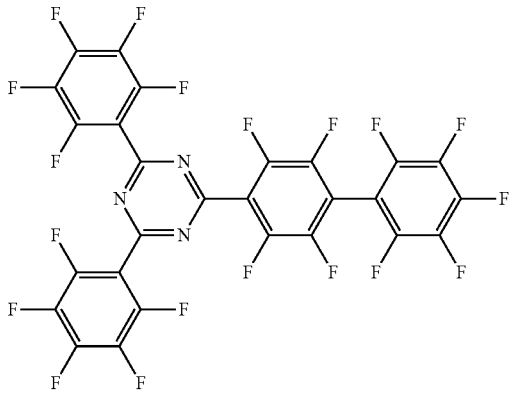 [SMILES: Fc1c(F)c(F)c(-c2nc(-c3c(F)c(F)c(F)c(F)c3F)nc(-c3c(F)c(F)c(-c4c(F)c(F)c(F)c(F)c4F)c(F)c3F)n2)c(F)c1F] | US20040036077 |
| Zn (N^N) complexes | 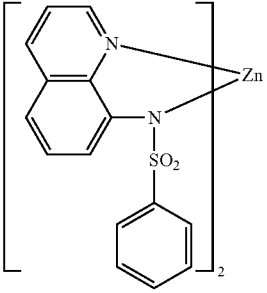 | U.S. Pat. No. 6,528,187 |

Experimental

Chemical abbreviations used throughout are: DCM is dichloromethane, THF is tetrahydrofuran, DMF is dimethylformamide, dba is dibenzylidineacetone.

Synthesis of 3-bromo-N,N-diphenylaniline

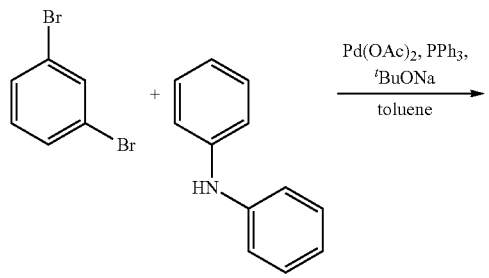

-continued

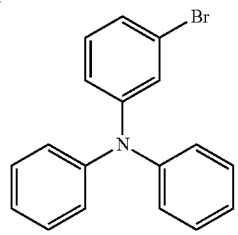

Diphenylamine (9 g, 53.3 mmol), and 1,3-dibromobenzene (25 g, 106.8 mmol) were mixed in toluene (500 mL). The solution was bubbled nitrogen while stirring for 15 min. Pd(OAc)$_2$ (0.18 g, 0.8 mmol), triphenylphosphine (0.84 g, 3.2 mmol) and $^t$BuONa (7.7 g, 80.2 mmol) were added in sequence. The mixture was heated to reflux overnight under nitrogen. After cooling, the reaction mixture was filtered through Celite®/silica pad and the solvent was then evaporated. The residue was purified by column using hexane as eluent to obtain 13.5 g (60%) of 3-bromo-N,N-diphenylaniline.

Synthesis of N¹,N¹,N³-triphenyl-N³-(4-(phenylamino)phenyl)benzene-1,3-diamine

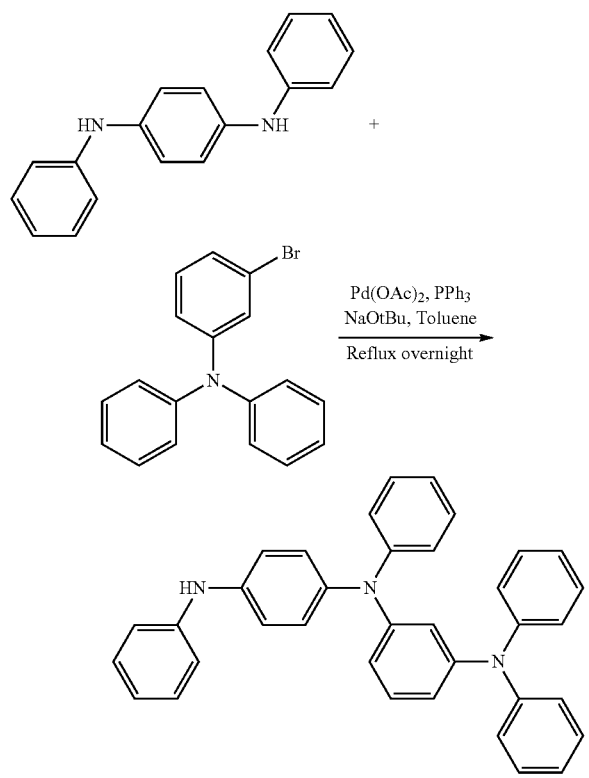

1,4-Phenylenediamine (7.2 g, 27.7 mmol), and 3-bromotriphenylamine (6 g, 18.5 mmol) were mixed in 500 mL of dry toluene. The solution was bubbled nitrogen while stirring for 15 min. Pd(OAc)$_2$ (0.045 g, 0.2 mmol), triphenylphosphine (0.21 g, 0.8 mmol) and sodium tert-butoxide (2.9 g, 30.2 mmol) were added in sequence. The mixture was heated to reflux overnight under nitrogen. After cooling, the reaction mixture was filtered through Celite®/silica pad and the solvent was then evaporated. The residue was then purified by column using toluene:hexane (1:1, v/v) as eluent. The product was further purified by boiling with degassed toluene:heptane (1:10, v/v), after cooling, the white solid was filtered and 5.5 g (59%) of product was collected.

Synthesis of Compound 1

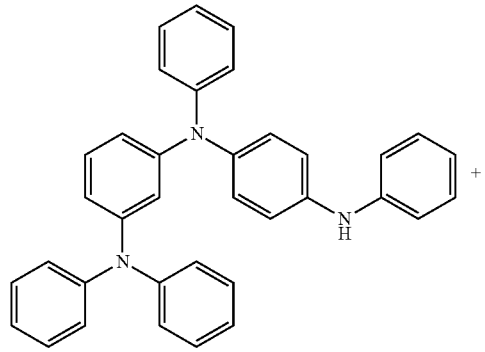

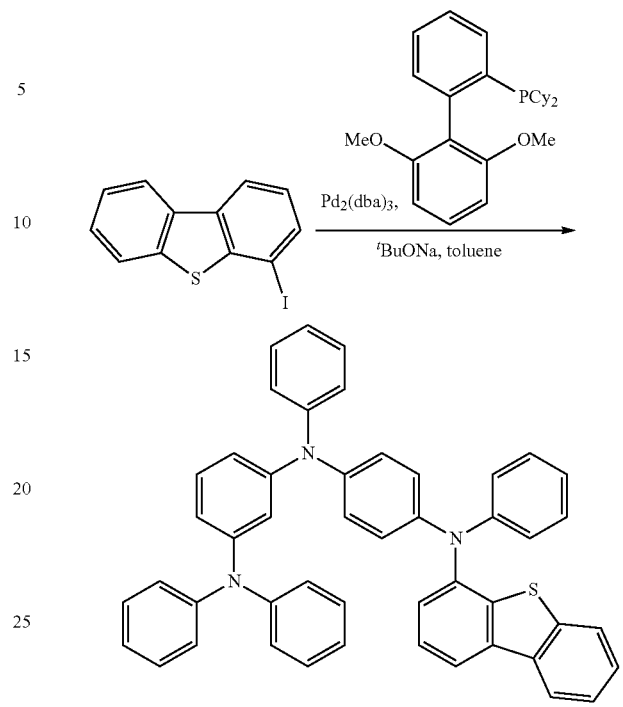

N¹,N¹,N³-Triphenyl-N³-(4-(phenylamino)phenyl)benzene-1,3-diamine (2.2 g, 4.4 mmol), and 4-iododibenzothiophene (1.6 g, 6.1 mmol) were mixed in toluene (150 mL). The solution was bubbled nitrogen while stirring for 15 min. Pd$_2$(dba)$_3$ (0.02 g, 0.02 mmol), 2-dicyclohexylphosphino-2',6'-dimethoxybiphenyl (0.035 g, 0.08 mmol) and $^t$BuONa (0.63 g, 6.5 mmol) were added in sequence. The mixture was heated to reflux overnight under nitrogen. After cooling, the reaction mixture was filtered through Celite®/silica pad and the solvent was then evaporated. The residue was then purified by column using toluene:hexane (30%) as eluent to obtain 2.1 g (70%) of Compound 2. It was then suspended in a nitrogen purged mixture of 1.5 mL of toluene and 13 mL of heptane and refluxed for 2 hours. After cooling, the solids were filtered and dried to yield 1.8 g (60%) of Compound 1.

Synthesis of Compound 2

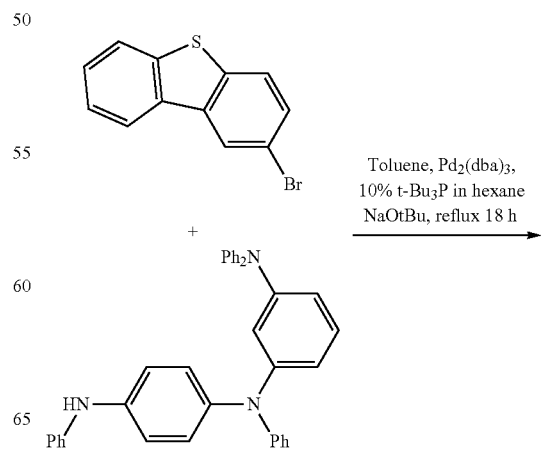

-continued

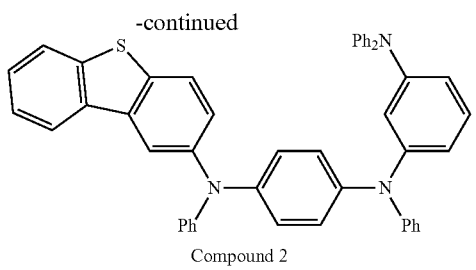
Compound 2

Dry toluene (125 mL), Pd$_2$(dba)$_3$ (0.026 g, 0.029 mmol) and 10% t-Bu$_3$P in hexane (0.17 mL, 0.058 mmol) were bubbled with nitrogen for 15 min, followed by addition of N$^1$,N$^1$,N$^3$-triphenyl-N$^3$-(4-(phenylamino)phenyl)benzene-1,3-diamine (2.9 g, 5.8 mmol), 2-bromodibenzothiophene (1.2 g, 4.6 mmol), sodium tert-butoxide (1.1 g, 11.6 mmol) were added. The mixture was bubbled with nitrogen for 15 min and refluxed for 18 h under nitrogen. After cooling, the reaction mixture was filtered through a silica pad and washed with DCM. The solvent was removed in vacuo and the residue was purified by flash chromatography using 20% DCM/hexane to afford Compound 2 (2.6 g, 83% yield) as a white solid.

Synthesis of Compound 5

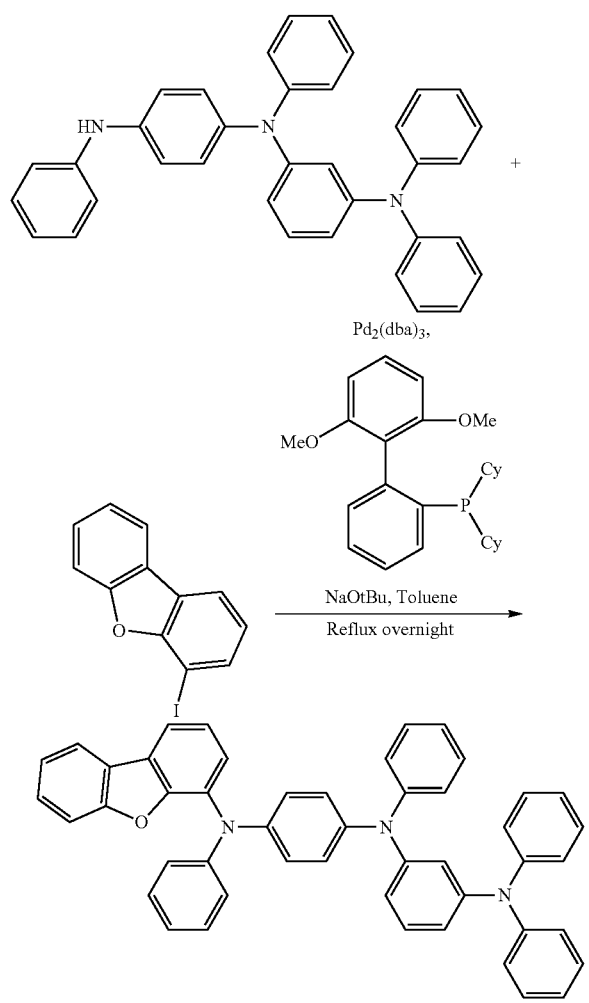

N$^1$,N$^1$,N$^3$-triphenyl-N$^3$-(4-(phenylamino)phenyl)benzene-1,3-diamine (3 g, 6.0 mmol), and 4-iododibenzo[b,d]furan (2.6 g, 8.8 mmol) were mixed in dry toluene (150 mL). To the solution was bubbled nitrogen while stirring for 15 min. Pd$_2$(dba)$_3$ (0.027 g, 0.03 mmol), dicyclohexyl(2',6'-dimethoxy-[1,1'-biphenyl]-3-yl)phosphine (0.055 g, 0.12 mmol) and sodium tert-butoxide (0.86 g, 9.0 mmol) were added in sequence. The mixture was heated to reflux overnight under nitrogen. After cooling, the reaction mixture was filtered through Celite®/silica pad and the solvent was then evaporated. The residue was then purified by column using toluene:hexane (1:3, v/v) as eluent. The product was further purified by boiling with degassed toluene:heptane (1:10, v/v), and after cooling, the white solid was filtered and 3.2 g (79%) of product was collected.

Synthesis of Compound 6

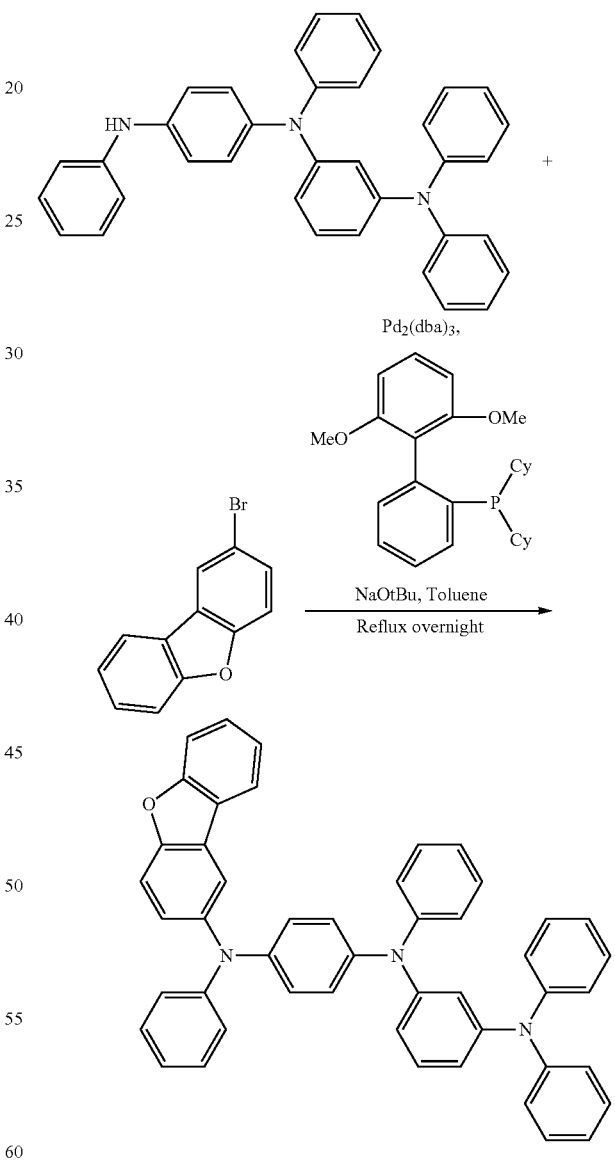

N$^1$,N$^1$,N$^3$-triphenyl-N$^3$-(4-(phenylamino)phenyl)benzene-1,3-diamine (3 g, 6.0 mmol), and 2-bromobenzo[b,d]furan (1.4 g, 8.8 mmol) were mixed in 150 mL of dry toluene. To the solution was bubbled nitrogen while stirring for 15 min. Pd$_2$(dba)$_3$ (0.027 g, 0.03 mmol), dicyclohexyl(2',6'-dimethoxy-[1,1'-biphenyl]-3-yl)phosphine (0.055 g, 0.12 mmol) and sodium tert-butoxide (0.86 g, 9.0 mmol) were added in sequence. The mixture was heated to reflux overnight under nitrogen. After cooling, the reaction mixture was filtered through celite/silica pad and the solvent was then evaporated. The residue was then purified by column using toluene:hexane (1:3, v/v) as eluent. The product was further purified by boiling with degassed toluene:heptane (1:10, v/v), after cooling, the white solid was filtered and 3.2 g (79%) of product was collected.

Synthesis of $N^1,N^1,N^4$-triphenyl-$N^4$-(4-(phenylamino)phenyl)benzene-1,4-diamine

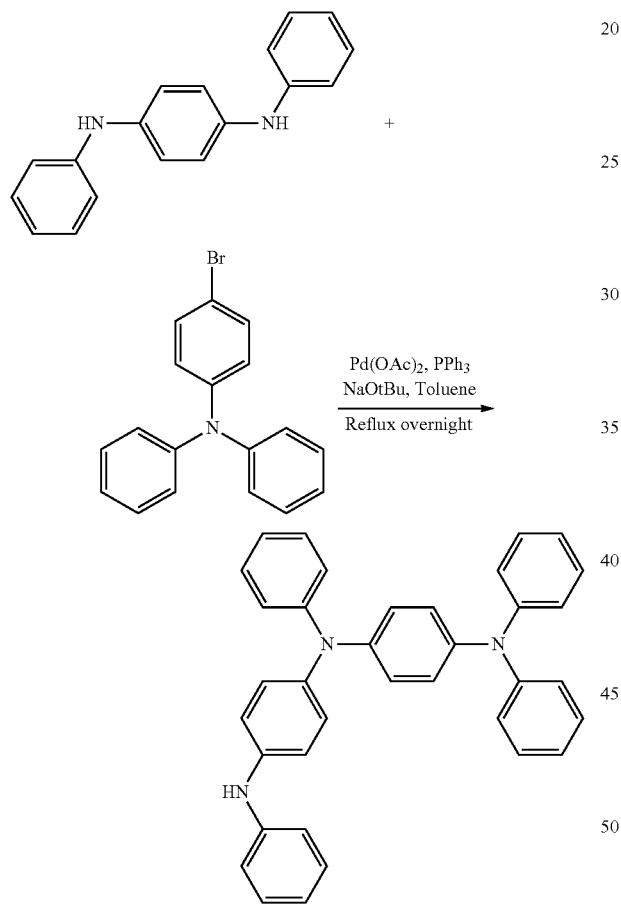

Synthesis of Compound 7

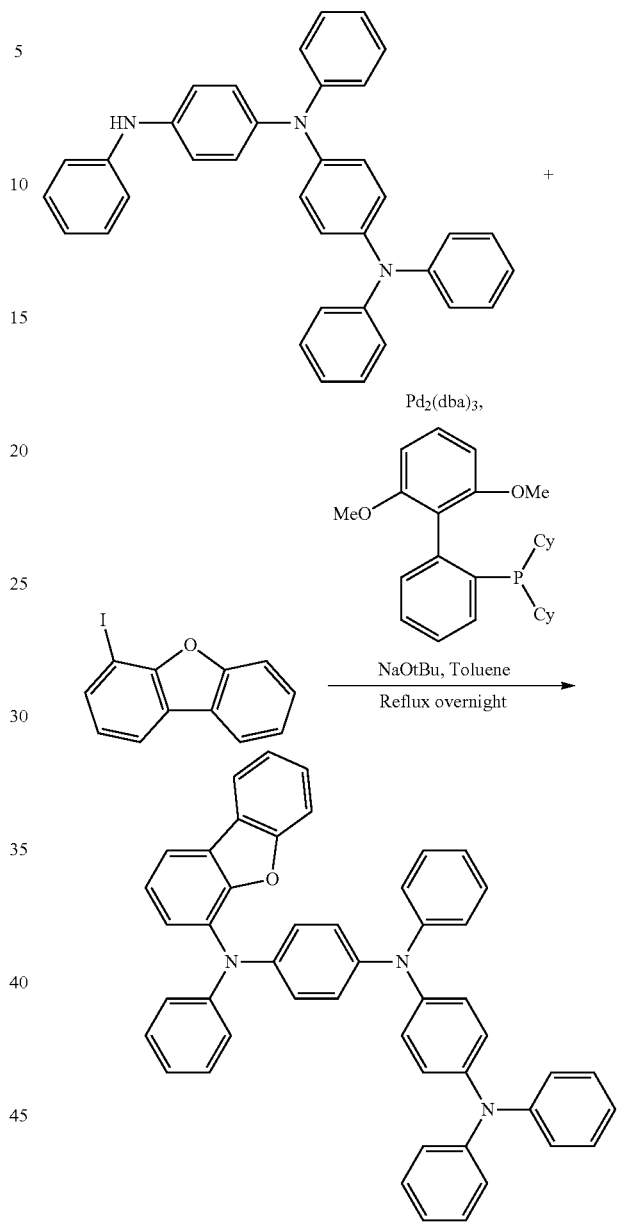

To a stirred solution of $N^1,N^4$-diphenylbenzene-1,4-diamine (6.5 g, 20.0 mmol) in toluene (400 mL), 4-bromo-N,N-diphenylaniline (7.9 g, 30.1 mmol) was added and the solution was degassed with nitrogen for 15 minutes. Palladium (II) acetate (45 mg, 0.2 mmol), triphenylphosphine (210 mg, 0.8 mmol) and sodium tert-butoxide (2.9 g, 30.1 mmol) were added and degassed with nitrogen for another 15 minutes. The reaction was refluxed overnight. The reaction mixture was filtered through Celite®, washed with toluene and the filtrate was concentrated under vacuum. It was then column chromatographed with hexane to 50% toluene/hexane to obtain 5.6 g (48%) of the desired product as a white solid.

To a stirred solution of $N^1,N^1,N^4$-triphenyl-$N^4$-(4-(phenylamino)phenyl)benzene-1,4-diamine (2.6 g, 5.2 mmol) in toluene (50 mL), 4-iododibenzo[b,d]furan (2.0 g, 6.7 mmol) was added and the solution was degassed with nitrogen for 15 minutes. $Pd_2(dba)_3$ (4.7 mg, 0.1 mmol), 2-dicyclohexylphosphino-2',6'-dimethoxybiphenyl (8.5 mg, 0.2 mmol) and sodium tert-butoxide (0.7 g, 7.7 mmol) were added and degassed with nitrogen for another 15 minutes. The reaction was refluxed for 3 days. The reaction mixture was filtered through celite, washed with toluene and the filtrate was concentrated under vacuum. It was then column chromatographed with hexane to 30% toluene/hexane to obtain 2.2 g (64%) of the desired product as a white.

Synthesis of Compound 8

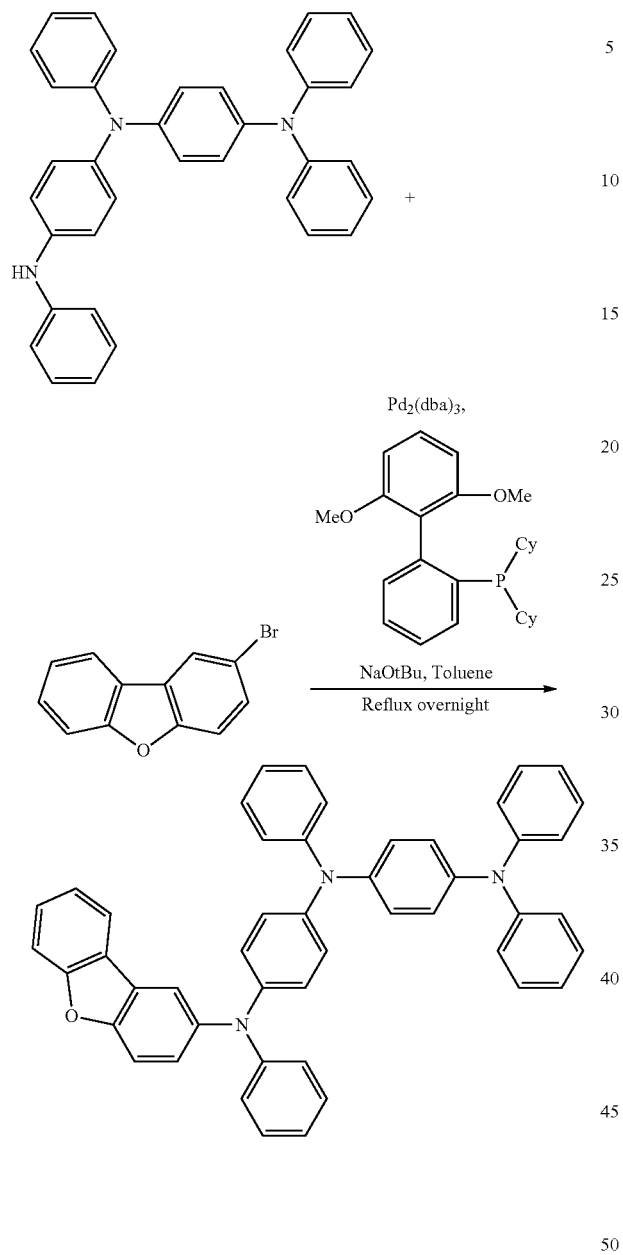

$N^1,N^1,N^4$-triphenyl-$N^4$-(4-(phenylamino)phenyl)benzene-1,4-diamine (3 g, 6.0 mmol), and 2-bromodibenzo[b,d]furan (1.4 g, 8.8 mmol) were mixed in dry toluene (150 mL). The solution was bubbled with nitrogen while stirring for 15 min. $Pd_2(dba)_3$ (0.027 g, 0.03 mmol), dicyclohexyl(2',6'-dimethoxy-[1,1'-biphenyl]-3-yl)phosphine (0.055 g, 0.12 mmol) and sodium tert-butoxide (0.86 g, 9.0 mmol) were added in sequence. The mixture was heated to reflux overnight under nitrogen. After cooling, the reaction mixture was filtered through Celite®/silica pad and the solvent was then evaporated. The residue was then purified by column using toluene:hexane (1:3, v/v) as eluent. The product was further purified by boiling with degassed toluene:heptane (1:10, v/v), and after cooling, the white solid was filtered and 3.2 g (79%) of product was collected.

Synthesis of Compound 9

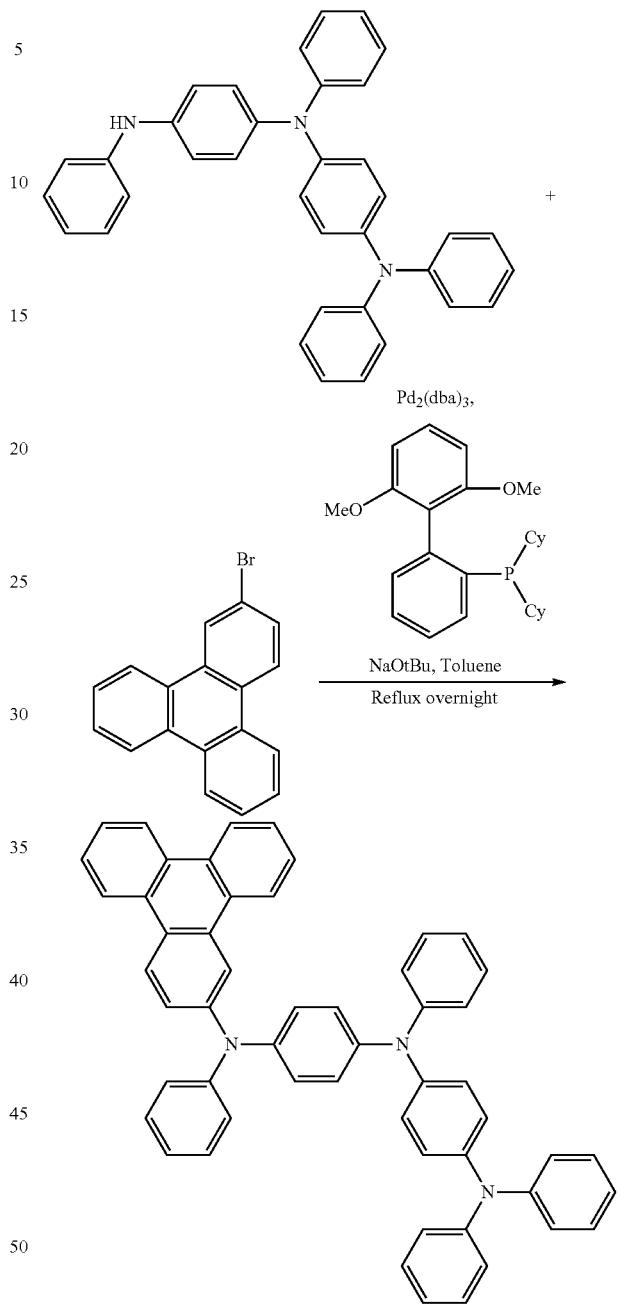

To a stirred solution of $N^1,N^1,N^4$-triphenyl-$N^4$-(4-(phenylamino)phenyl)benzene-1,4-diamine (2.5 g, 5.0 mmol) in toluene (50 mL), 2-bromotriphenylene (1.4 g, 4.5 mmol) was added and degassed with nitrogen for 15 minutes. $Pd_2(dba)_3$ (22.7 mg, 0.02 mmol), 2-dicyclohexylphosphino-2',6'-dimethoxybiphenyl (50.9 mg, 0.1 mmol) and sodium tert-butoxide (0.72 g, 7.5 mmol) were added and degassed with nitrogen for another 15 minutes. The reaction was refluxed overnight. The reaction mixture was filtered through Celite®, washed with toluene and the filtrate was concentrated under vacuum. It was then column chromatographed with hexane to 50% toluene/hexane to obtain 2.7 g (75%) the desired product as a yellow solid.

Synthesis of Compound 14

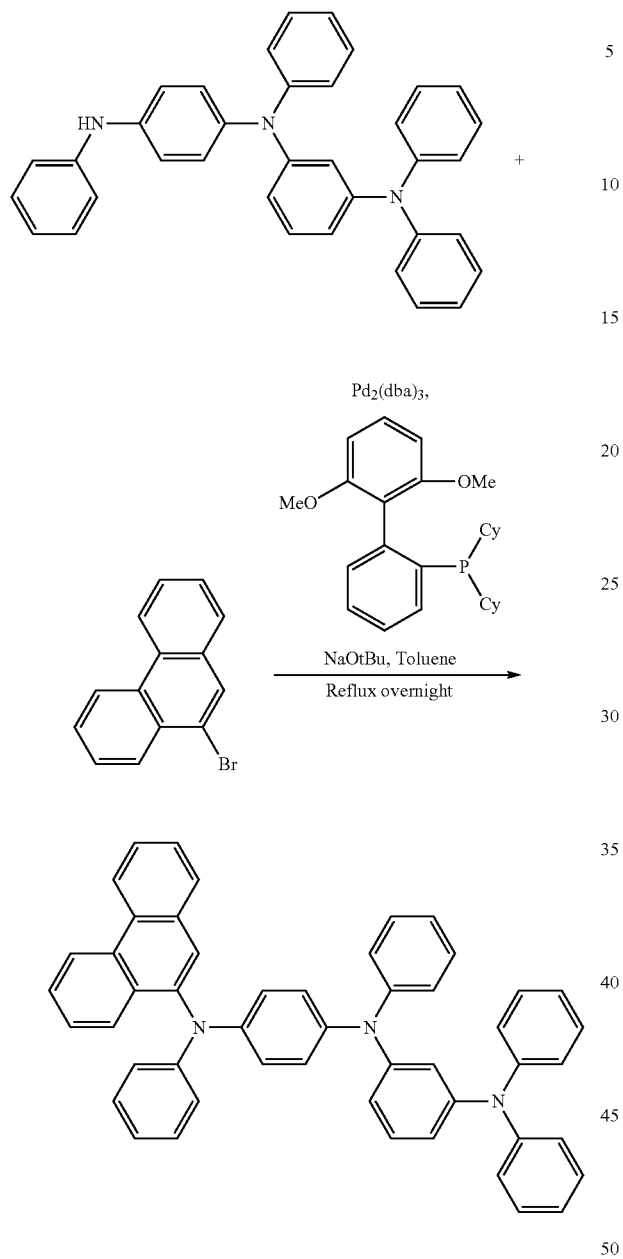

Synthesis of Compound 13

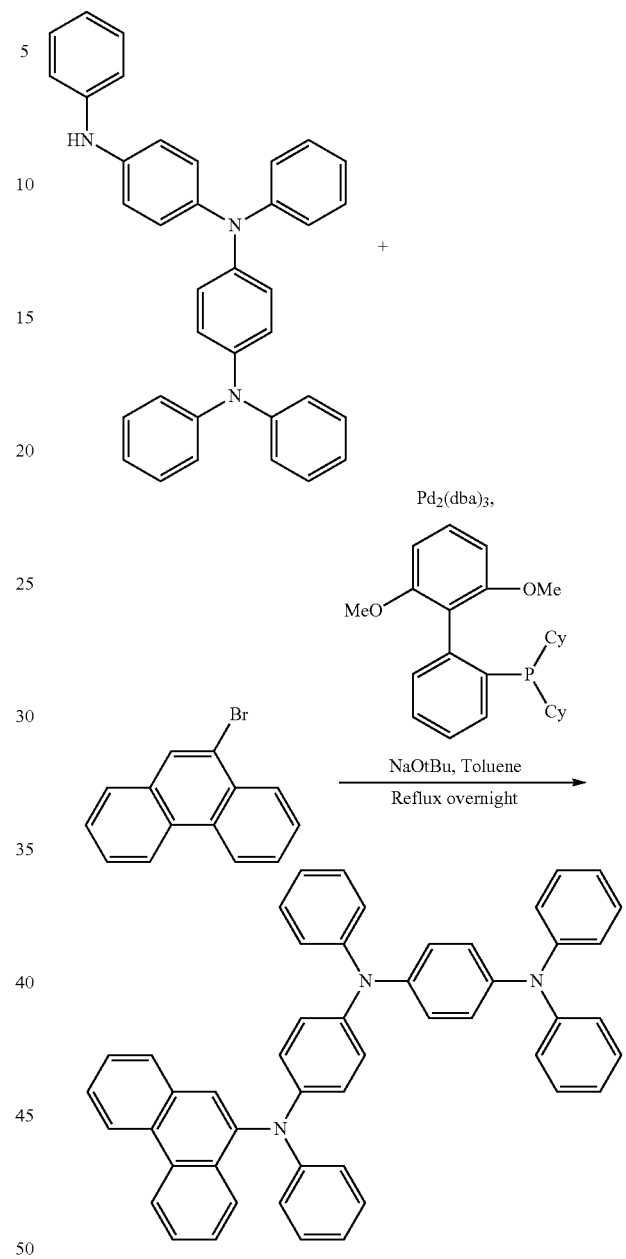

To a stirred solution of N¹,N¹,N³-triphenyl-N³-(4-(phenylamino)phenyl)benzene-1,3-diamine (2.7 g, 5.4 mmol) in toluene (50 mL), 9-bromophenanthrene (1.2 g, 4.8 mmol) was added and degassed with nitrogen for 15 minutes. $Pd_2(dba)_3$ (49.1 mg, 0.05 mmol), 2-dicyclohexylphosphino-2',6'-dimethoxybiphenyl (88.0 mg, 0.2 mmol) and sodium tert-butoxide (0.77 g, 8.0 mmol) were added and degassed with nitrogen for another 15 minutes. The reaction was refluxed overnight. The reaction mixture was filtered through Celite®, washed with toluene and the filtrate was concentrated under vacuum. The residue was then column chromatographed eluting with hexane to 50% toluene/hexane to obtain 1.7 g (47%) the desired product as a yellow solid.

N¹,N¹,N⁴-triphenyl-N⁴-(4-(phenylamino)phenyl)benzene-1,4-diamine (2.5 g, 5.0 mmol), and 9-bromophenanthrene (1.1 g, 4.23 mmol) were mixed in dry toluene (150 mL). The solution was bubbled nitrogen while stirring for 15 min. $Pd_2(dba)_3$ (0.027 g, 0.03 mmol), dicyclohexyl(2',6'-dimethoxy-[1,1'-biphenyl]-3-yl)phosphine (0.055 g, 0.12 mmol) and sodium tert-butoxide (0.75 g, 7.8 mmol) were added in sequence. The mixture was heated to reflux overnight under nitrogen. After cooling, the reaction mixture was filtered through celite/silica pad and the solvent was then evaporated. The residue was then purified by column using toluene:hexane (1:3, v/v) as eluent. The product was further purified by boiling with degassed toluene:heptane (1:10, v/v), after cooling, the white solid was filtered and 2.5 g (75%) of product was collected.

Synthesis of 9-(pyridin-2-yl)-9H-carbazole

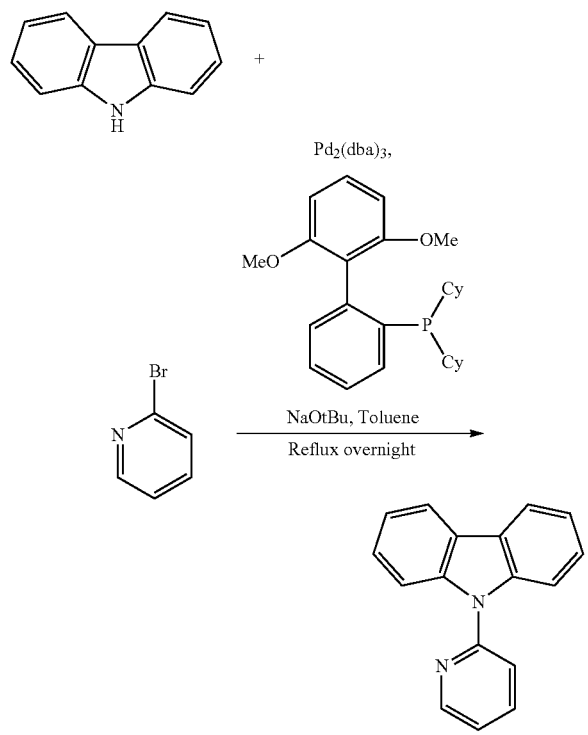

9-H-carbazole (20 g, 120 mmol), and 2-bromopyridine (13 mL, 132 mmol) were mixed in dry toluene (500 mL). The solution was bubbled nitrogen while stirring for 15 min. Pd$_2$(dba)$_3$ (0.6 g, 0.66 mmol), dicyclohexyl(2',6'-dimethoxy-[1,1'-biphenyl]-3-yl)phosphine (1 g, 0.24 mmol) and sodium tert-butoxide (20 g, 200 mmol) were added in sequence. The mixture was heated to reflux overnight under nitrogen. After cooling, the reaction mixture was filtered through Celite®/silica pad and the solvent was then evaporated. The residue was then purified by silica gel column chromatography using toluene:hexane (1:1, v/v) as eluent to obtain 24.3 g (83%) of the desired product.

Synthesis of 3-bromo-9-(pyridin-2-yl)-9H-carbazole

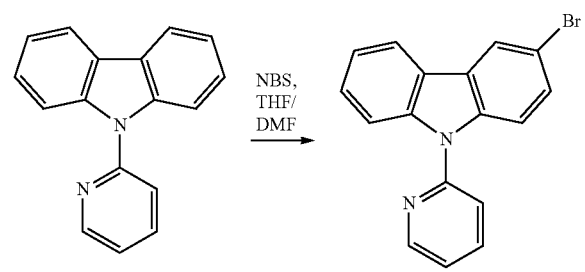 [SMILES: c1ccc(-n2c3ccccc3c3ccccc32)nc1 ; Brc1ccc2c(c1)c1ccccc1n2-c1ccccn1]

N-bromosuccinimide (17.8 g, 100 mmol) in DMF (50 mL) was added slowly to 9-(pyridin-2-yl)-9H-carbazole (24 g, 100 mmol) in THF (250 mL) at 0° C. over 30 min. The reaction was allowed to warm to room temperature and stir overnight. The reaction mixture was then evaporated and extracted with dichloromethane, and the organic layer was dried over magnesium sulfate and the solvent was then evaporated. The residue was then purified by column using toluene:hexane (1:1, v/v) as eluent and the product was further purified by recrystallization from toluene:ethanol (1:1, v/v), and after cooling, 24.3 g (75%) of the product was collected as a white solid after filtration.

Synthesis of N$^1$,N$^1$,N$^4$-triphenylbenzene-1,4-diamine

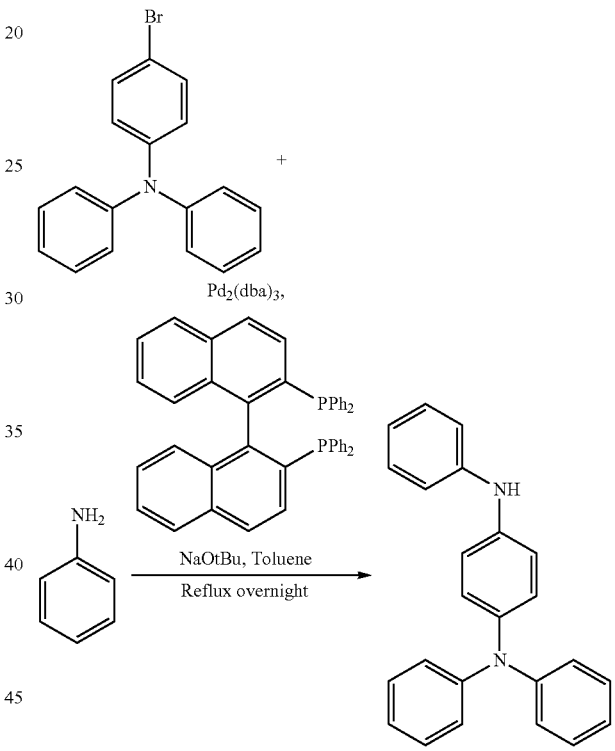

4-Bromotriphenylamine (10 g, 31 mmol), and aniline (4.3 mL, 46.3 mmol) were mixed in dry toluene (500 mL). The solution was bubbled nitrogen while stirring for 15 min. Pd$_2$(dba)$_3$ (0.14 g, 0.15 mmol), 2,2'-bis(diphenylphosphino)-1,1'-binaphthyl (0.45 g, 0.7 mmol) and sodium tert-butoxide (4.4 g, 46 mmol) were added in sequence. The mixture was heated to reflux overnight under nitrogen. After cooling, the reaction mixture was filtered through Celite®/silica pad and the solvent was then evaporated. The residue was then purified by column using toluene:hexane (1:1, v/v) as eluent. The product was further purified by boiling with degassed toluene:heptane (1:10, v/v), and after cooling, 7.3 g (70%) of product was collected as a white solid after filtration.

Synthesis of Compound 44

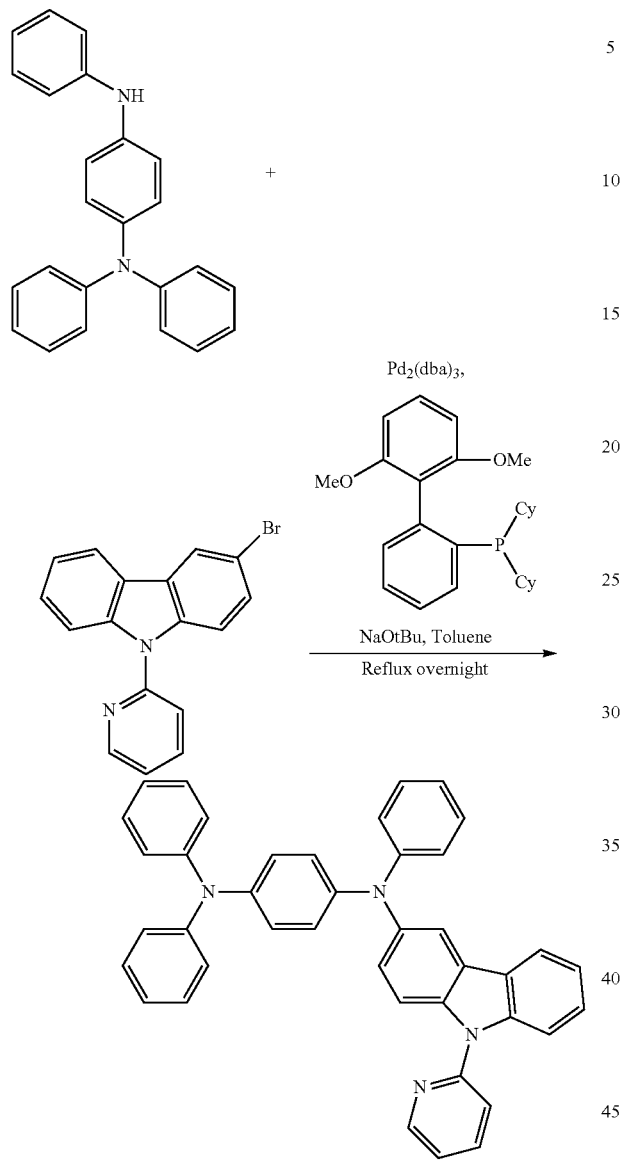

3-Bromo-9-(pyridin-2-yl)-9H-carbazole (2.5 g, 7.7 mmol), and $N^1,N^1,N^4$-triphenylbenzene-1,4-diamine (2.8 g, 8.5 mmol) were mixed in 150 mL of dry toluene. To the solution was bubbled nitrogen while stirring for 15 min. $Pd_2(dba)_3$ (0.035 g, 0.04 mmol), dicyclohexyl(2',6'-dimethoxy-[1,1'-biphenyl]-3-yl)phosphine (0.065 g, 0.16 mmol) and sodium tert-butoxide (1.2 g, 11.5 mmol) were added in sequence. The mixture was heated to reflux overnight under nitrogen. After cooling, the reaction mixture was filtered through Celite®/silica pad and the solvent was then evaporated. The residue was then purified by column using toluene as eluent. The product was further purified by boiling with degassed toluene:heptane (1:10, v/v), after cooling, the yellow solid was filtered and 3.3 g (75%) of product was collected.

Synthesis of 3-bromo-9-phenyl-9H-carbazole

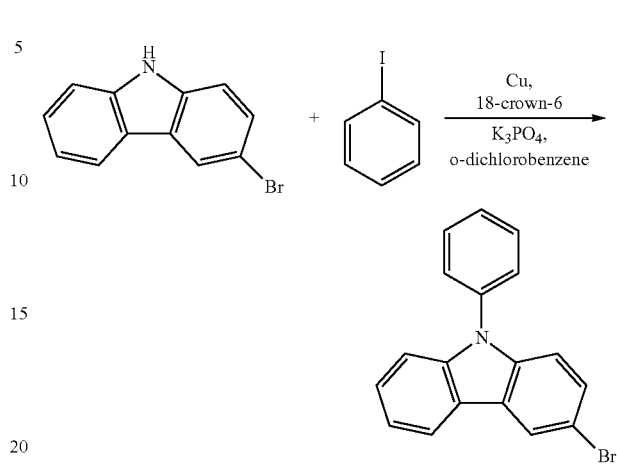

3Bromo-9H-carbazole (10.0 g, 40.6 mmol), iodobenzene (20.7 g, 101.6 mmol), potassium carbonate (28.1 g, 203.2 mmol), copper (2.58 g, 40.6 mmol), 18-crown-6 (10.7 g, 40.6 mmol) in o-dichlorobenzene (400 mL) were stirred and degassed with nitrogen for 15 minutes. The reaction was refluxed overnight. The reaction mixture was filtered Celite®, washed with toluene and the filtrate was concentrated under vacuum. It was then column chromatographed with 20% DCM/hexane to obtain 15.6 g (81%) of the desired product as a white solid.

Synthesis of N,9-diphenyl-9H-carbazol-3-amine

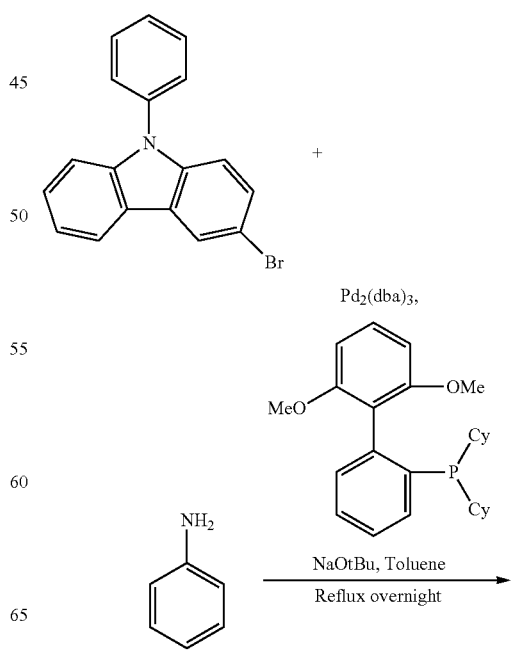

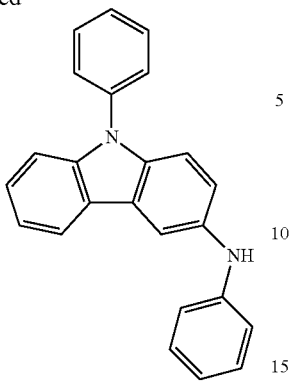

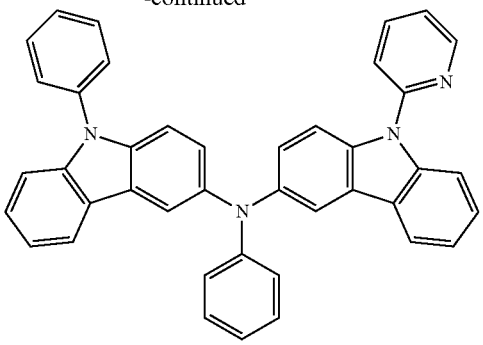

To a stirred solution of 3-bromo-9-phenyl-9H-carbazole (7.7 g, 23.8 mmol) in xylenes (200 mL), aniline (4.4 g, 47.5 mmol) was added and degassed with nitrogen for 15 minutes. Pd$_2$(dba)$_3$ (1.1 g, 1.2 mmol), 2-dicyclohexylphosphino-2',6'-dimethoxybiphenyl (2.0 mg, 4.8 mmol) and sodium tert-butoxide (3.4 g, 35.6 mmol) were added and degassed with nitrogen for another 15 minutes. The reaction was refluxed overnight. The reaction mixture was filtered through Celite®, washed with toluene and the filtrate was concentrated under vacuum. It was then column chromatographed with hexane to 50% toluene/hexane, yielded 6.4 g (81%) of white solid was obtained as the desired product.

Synthesis of Compound 46

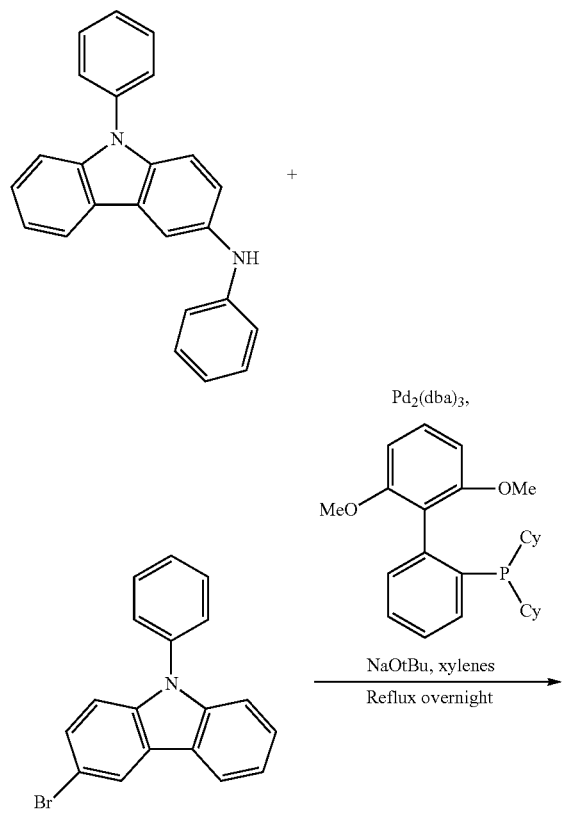

To a stirred solution of 3-bromo-9-phenyl-9H-carbazole (2.0 g, 6.2 mmol) in xylenes (60 mL). N,9-diphenyl-9H-carbazol-3-amine (2.4 g, 7.1 mmol) was added and degassed with nitrogen for 15 minutes. Pd$_2$(dba)$_3$ (0.3 g, 0.3 mmol), 2-dicyclohexylphosphino-2',6'-dimethoxybiphenyl (0.5 mg, 1.2 mmol) and sodium tert-butoxide (0.94 g, 9.3 mmol) were added and degassed with nitrogen for another 15 minutes. The reaction was refluxed overnight. The reaction mixture was filtered through celite, washed with toluene and the filtrate was concentrated under vacuum. It was then column chromatographed with hexane to 50% toluene/hexane to obtain 3.4 g (95%) of the desired product as a white solid.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:

1. A first device comprising a first organic light emitting device, further comprising:
    an anode;
    a cathode; and
    an emissive layer, disposed between the anode and the cathode, comprising a first emissive dopant;
    wherein the first emissive dopant is organic and non-metal containing;
    wherein the first emissive dopant comprises an electron donor and an electron acceptor moiety;
    wherein the first emissive dopant has a calculated HOMO energy higher than or equal to −4.70 eV;
    wherein the first emissive dopant has a calculated LUMO energy higher than or equal to −1.20 eV; and
    wherein the first emissive dopant has an energy ratio calculated by dividing the T1 energy of the first emissive dopant by $\Delta E_{HOMO-LUMO}$ for the first emissive dopant;
    wherein the energy ratio is at least 0.70;
    wherein the first emissive dopant has an energy difference calculated by subtracting the T1 energy of the first emissive dopant from $\Delta E_{HOMO-LUMO}$ for the first emissive dopant; and
    wherein the energy difference is at smaller than or equal to 1.00 eV, wherein the first emissive dopant has the formula:

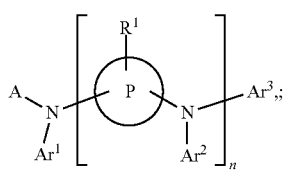

Formula I wherein A represents an aromatic carbocyclic or heterocyclic moiety with at least two fused aromatic carbocyclic or heterocyclic rings;
wherein ring P is phenyl;
wherein $Ar^1$, $Ar^2$, and $Ar^3$ are aryl or heteroaryl, and are optionally further substituted;
wherein ring A, $Ar^1$, $Ar^2$, and $Ar^3$ are optionally fused;
wherein $R^1$ represents mono-, di-, tri-, or tetra-substitution, or no substitution;
wherein $R^1$ is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; and
wherein n is an integer from 1 to 10.

2. The first device of claim 1, wherein the energy ratio is at least 0.73.

3. The first device of claim 1, wherein the energy difference is smaller than or equal to 0.90 eV.

4. The first device of claim 1, wherein the energy the energy ratio is at least 0.73 and the energy difference is at smaller than or equal to 0.90 eV.

5. The first device of claim 1, wherein A has the formula:

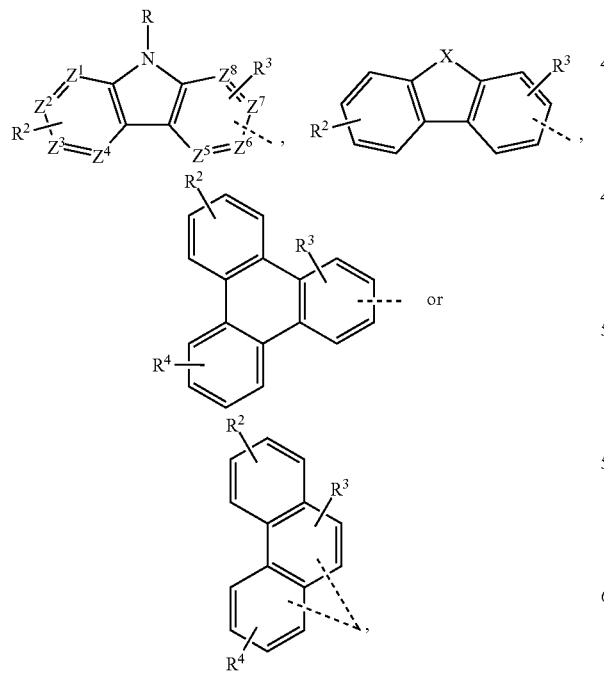

wherein X is O, S, or Se;
wherein $Z^1$ to $Z^8$ independently comprise C or N;
wherein the total number of N in $Z^1$ to $Z^8$ is at most 1;

wherein R is selected from the group consisting of alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;
wherein $R^2$ represents mono-, di-, tri-, or tetra-substitution, or no substitution;
wherein $R^3$ represents mono-, di- or tri-substitution, or no substitution;
wherein $R^4$ represents mono-, di-, tri-, or tetra-substitution, or no substitution; and
wherein $R^2$, $R^3$, and $R^4$ are independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

6. The first device of claim 5, wherein the first emissive dopant has the formula:

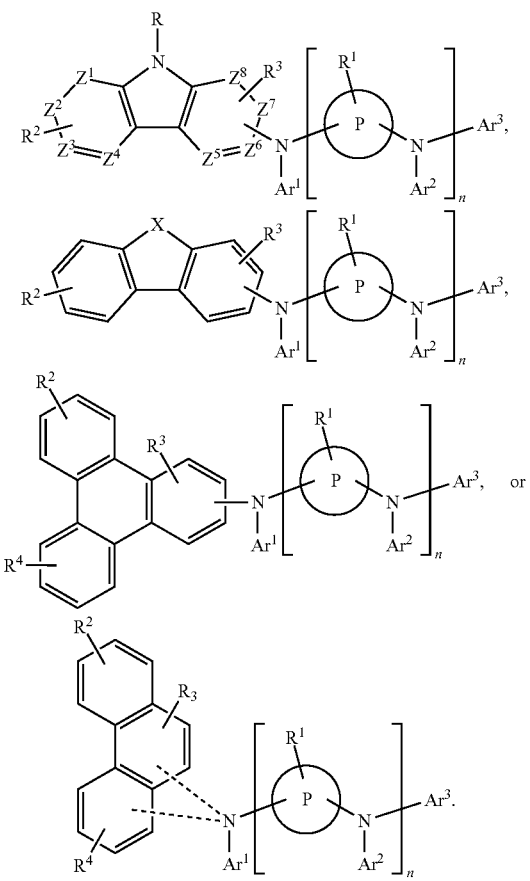

7. The first device of claim 6, wherein $Ar^1$, $Ar^2$, and $Ar^3$ are independently selected from the group consisting of phenyl and triphenylene.

8. The first device of claim 6, wherein n is 2.

9. The first device of claim 6, wherein rings $Ar^2$, and $Ar^3$ are phenyl.

10. The first device of claim 6, wherein X is NR and wherein R is aryl or heteroaryl.

11. The first device of claim 6, wherein X is O.
12. The first device of claim 6, wherein X is S.
13. The first device of claim 6, wherein the first emissive dopant is selected from the group consisting of:
Compound 1
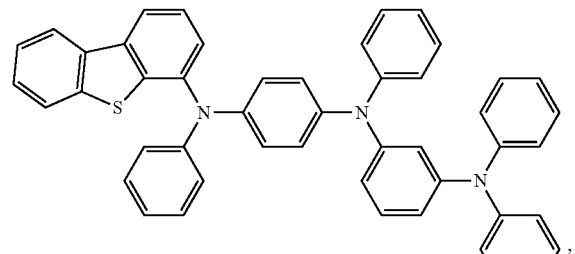
Compound 2
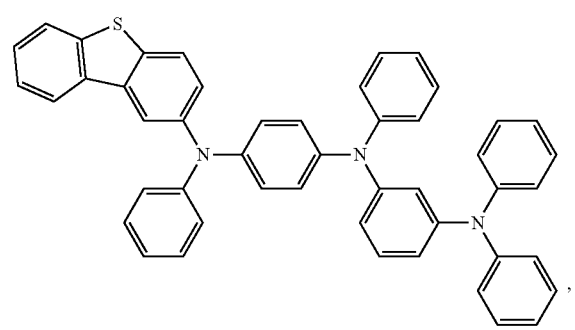
Compound 3
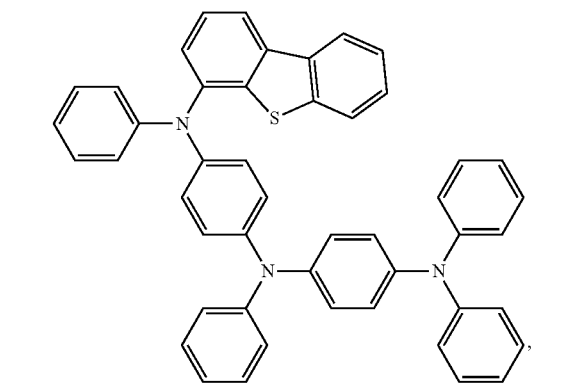
Compound 4
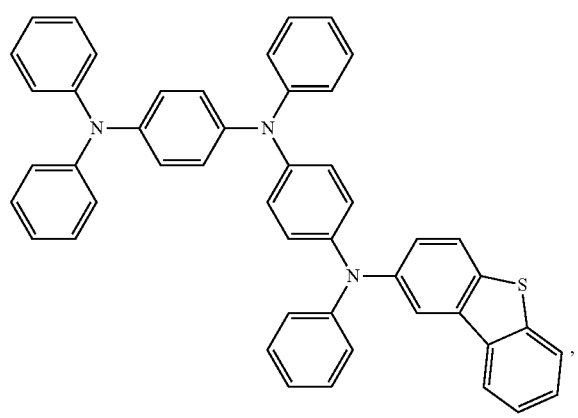
-continued
Compound 5
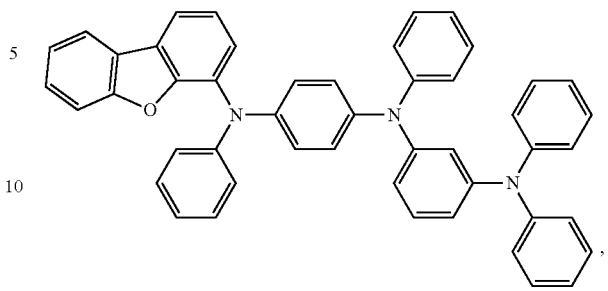
Compound 6
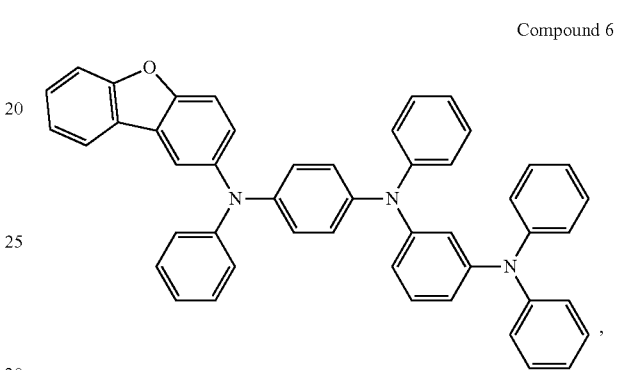
Compound 7
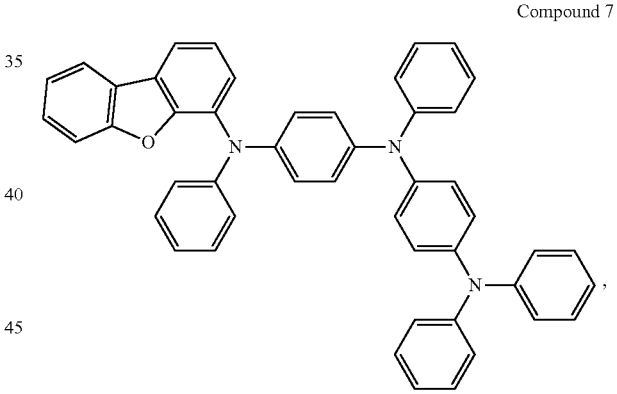
Compound 8
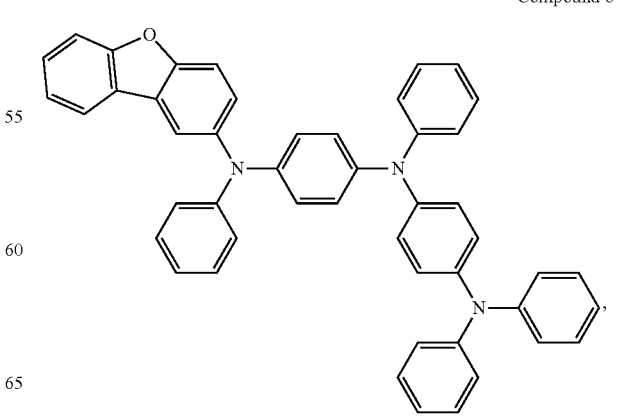

Compound 9
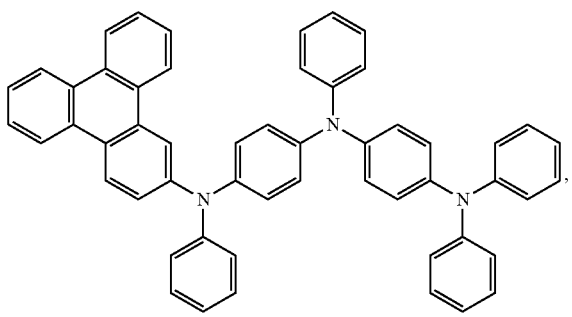
Compound 10
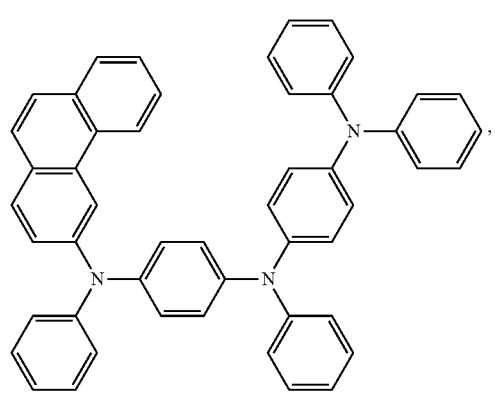
Compound 11
Compound 12
Compound 13
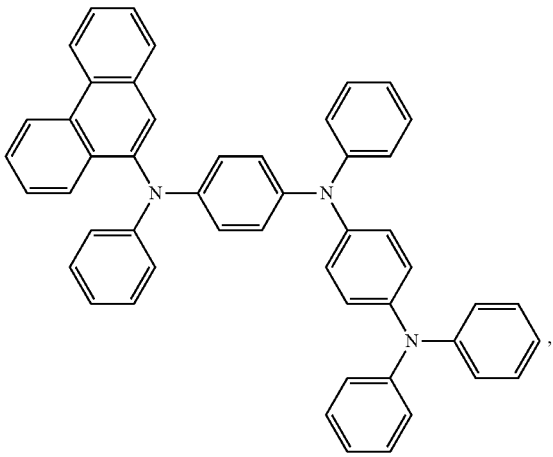
Compound 14
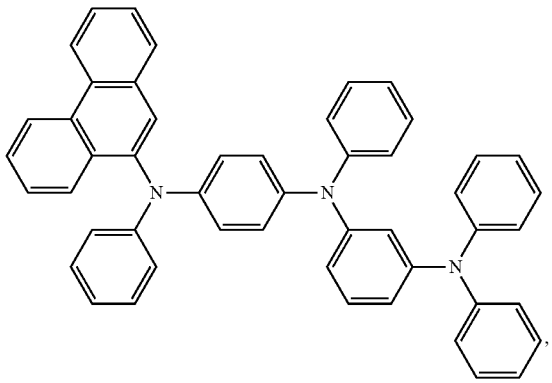
Compound 20
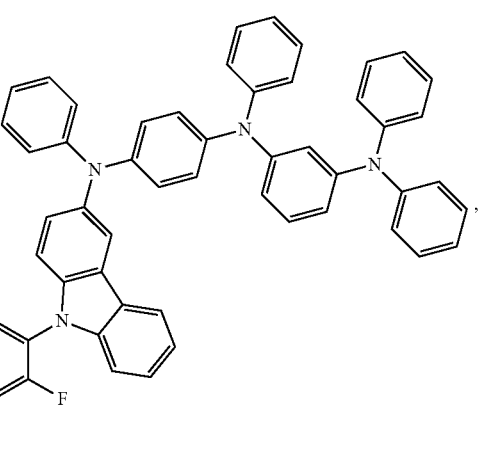

Compound 41
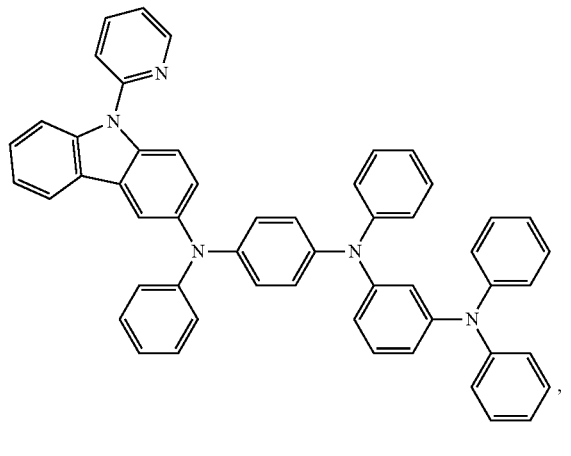
Compound 44
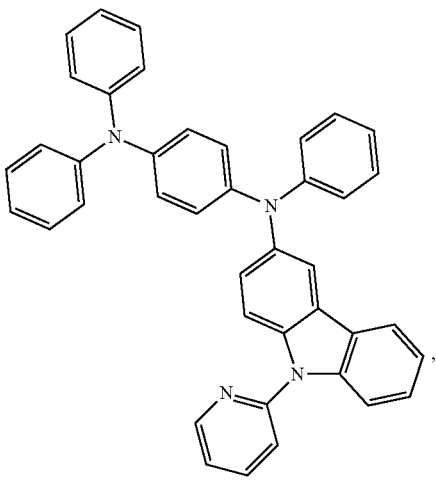
Compound 42
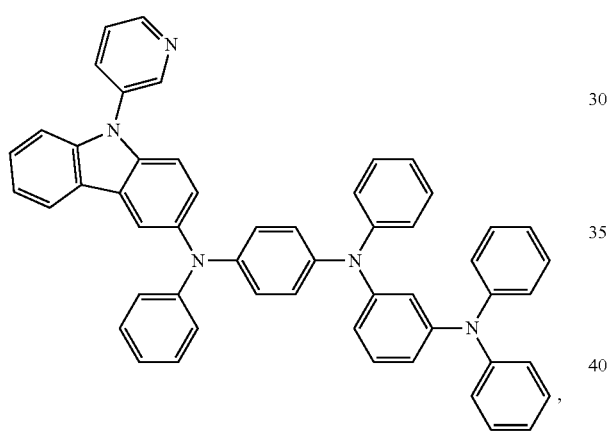
Compound 48
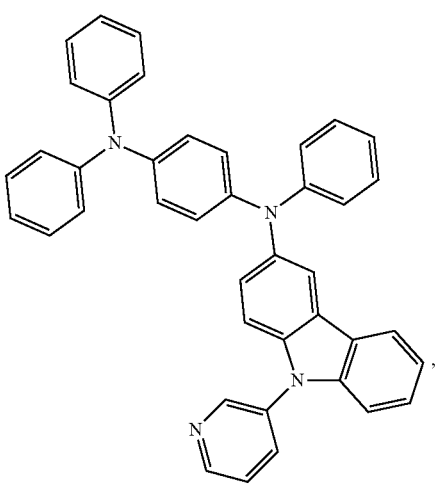
Compound 43
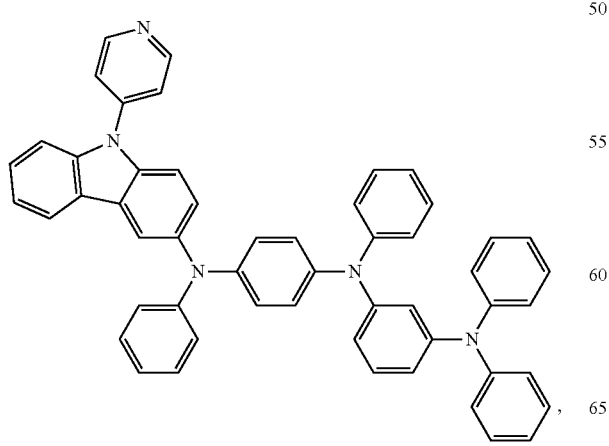
Compound 51
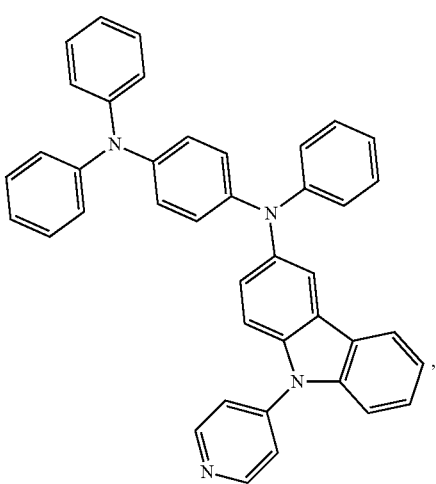

Compound 54
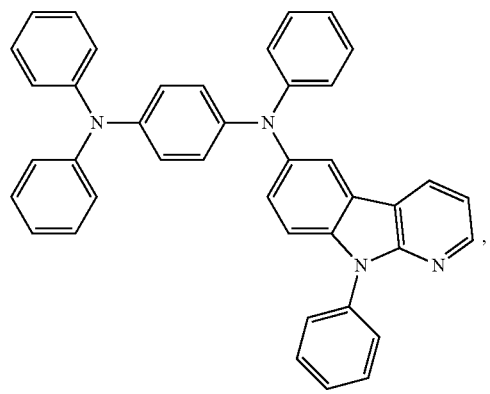
Compound 64
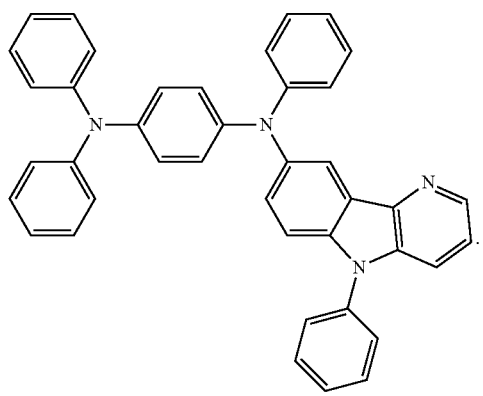
14. The first device of claim 1, wherein the first emissive dopant selected from the group consisting of:
Compound 59
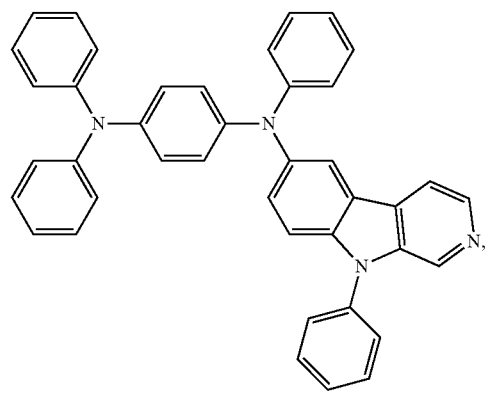
Compound 28
Compound 62
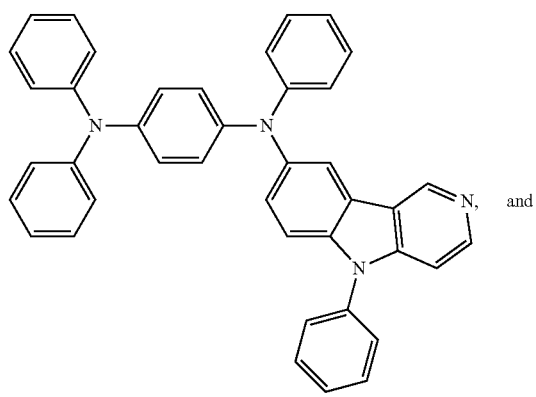
and
Compound 29
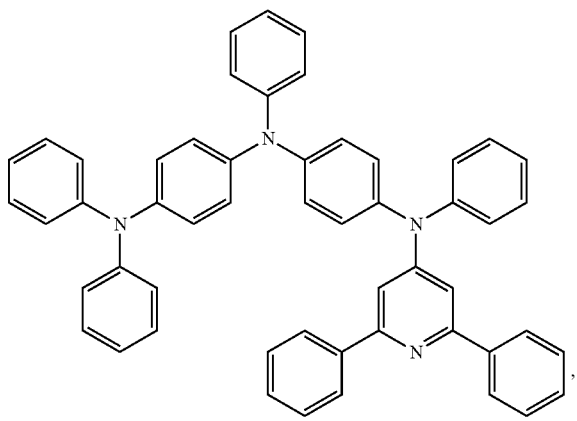

-continued

Compound 30

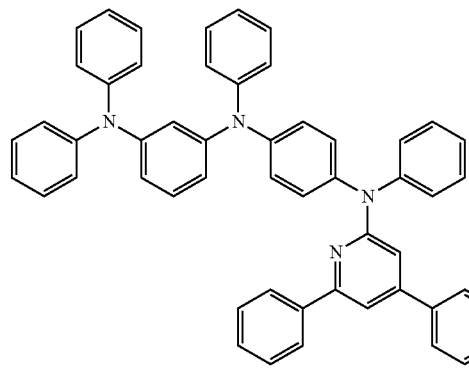

, and

Compound 57

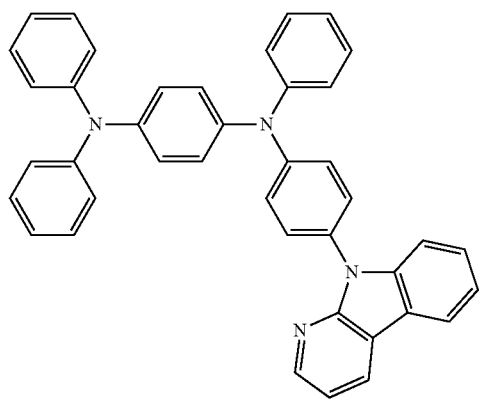

.

15. The first device of claim 5, wherein the first device emits a luminescent radiation at room temperature when a voltage is applied across the organic light emitting device; wherein the luminescent radiation comprises a delayed fluorescence process.

16. The first device of claim 6, wherein ring A, Ar$^1$, Ar$^2$ or A$^3$ fuse to form at least one carbazole moiety.

17. The first device of claim 6, wherein the first emissive dopant is selected from the group consisting of:

Compound 15

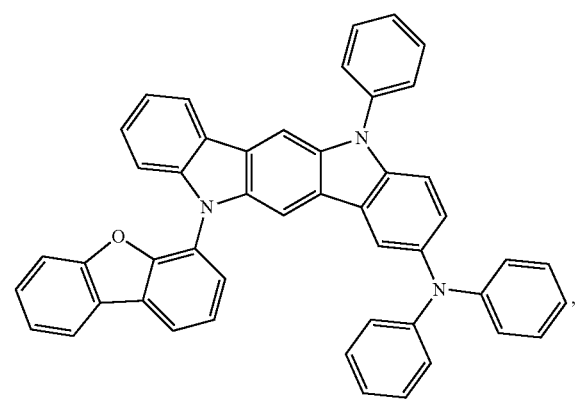

-continued

Compound 16

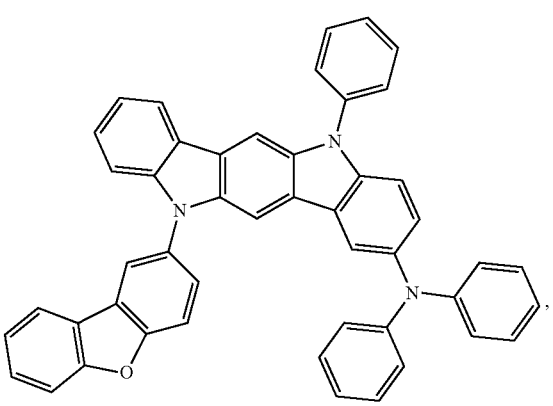

,

Compound 17

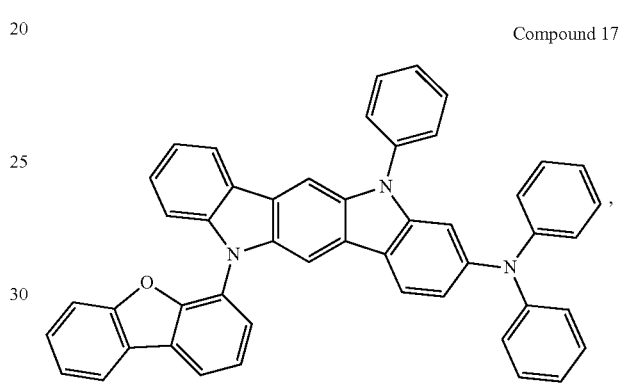

,

Compound 18

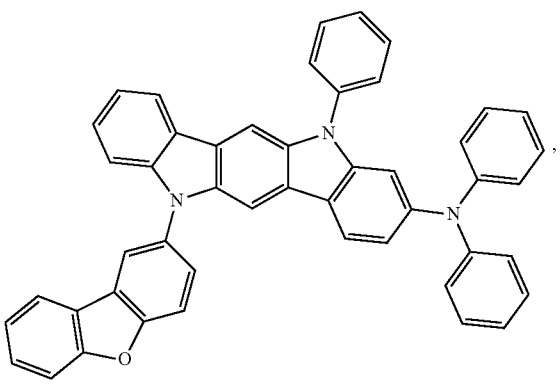

,

Compound 19

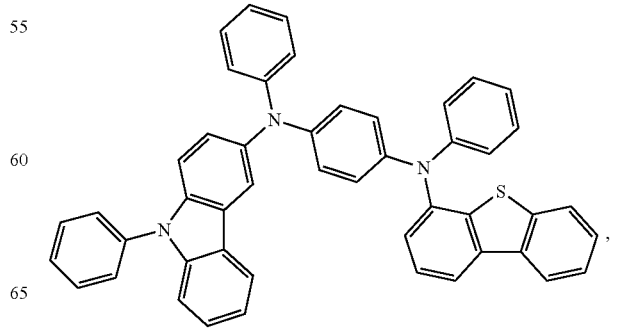

,

Compound 21
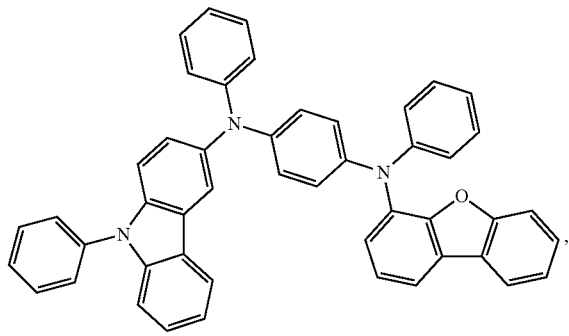
Compound 22
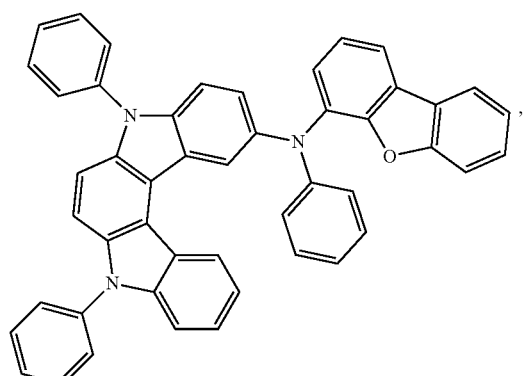
Compound 23
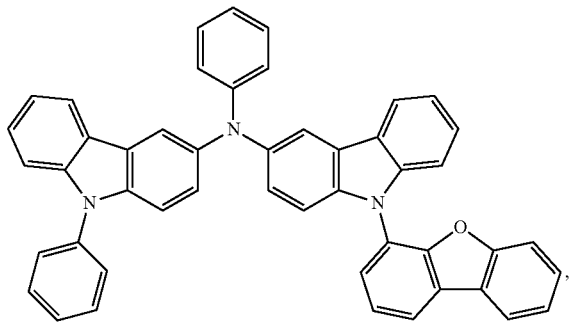
Compound 24
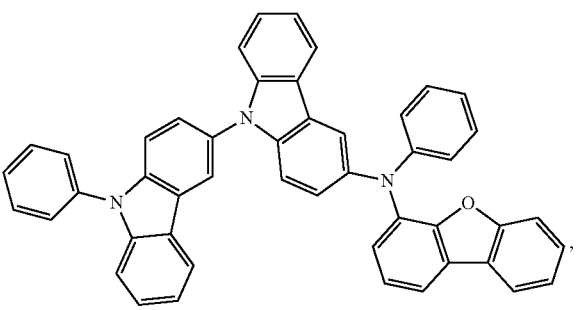
Compound 25
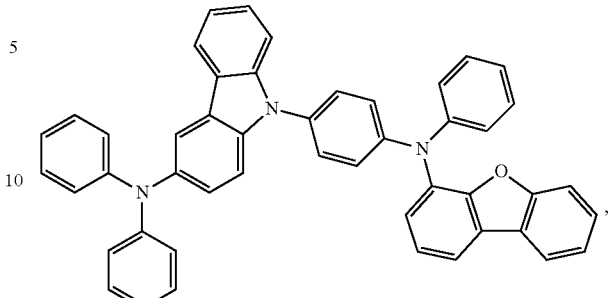
Compound 26
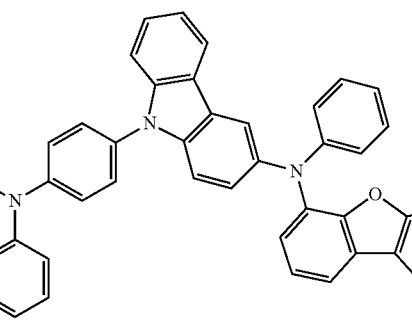
Compound 27
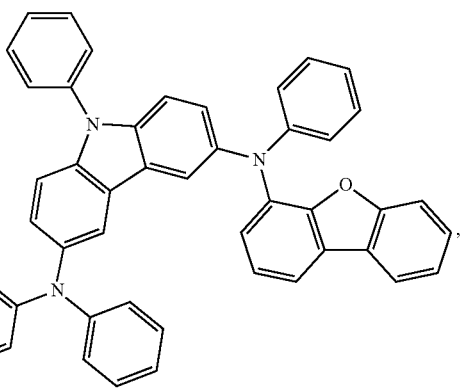
Compound 31
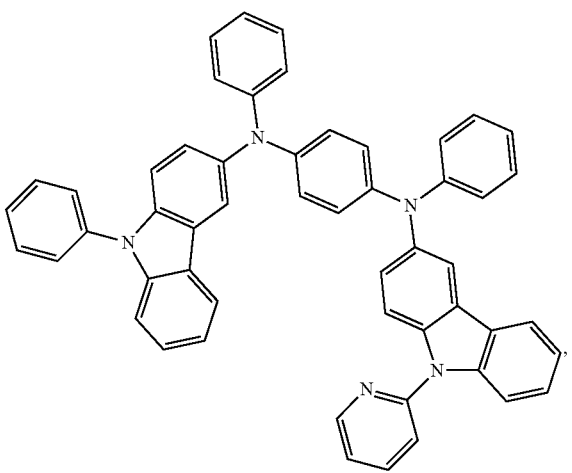

Compound 32
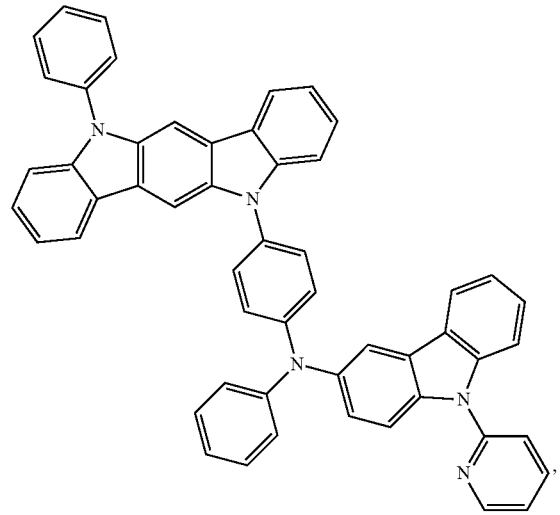
Compound 33
Compound 34
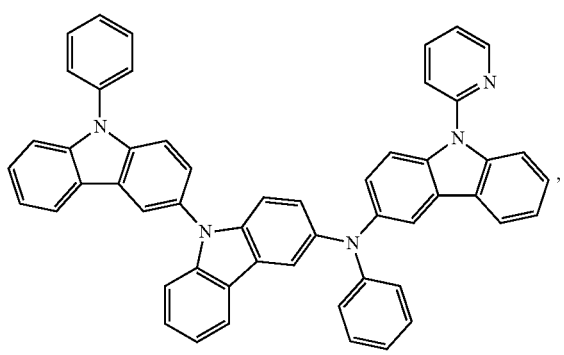
Compound 35
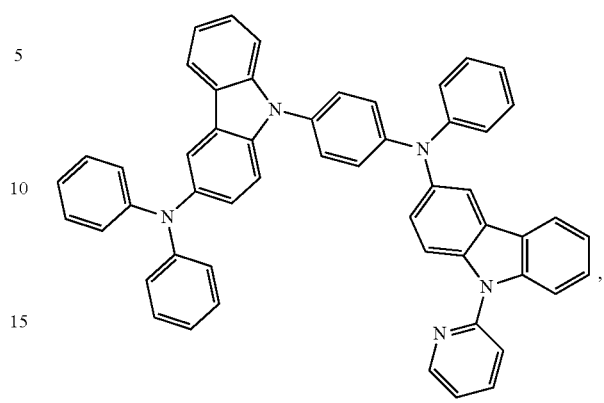
Compound 36
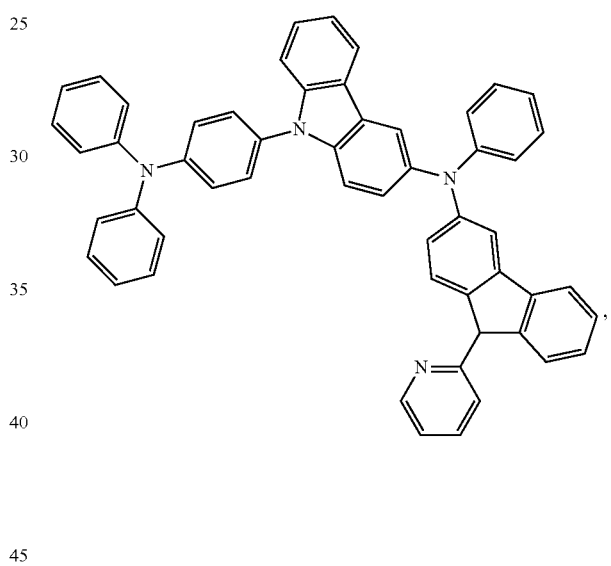
Compound 37
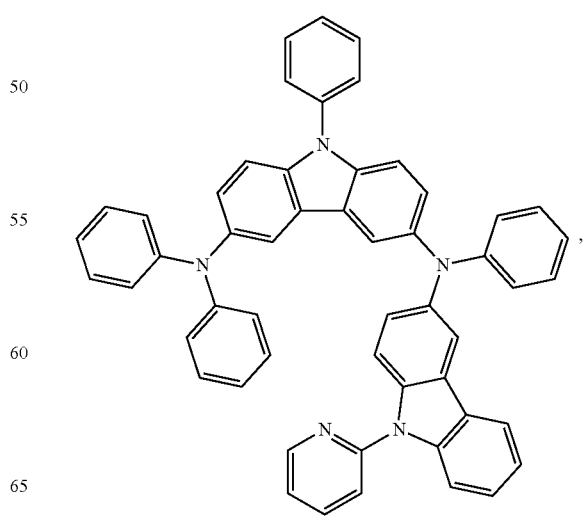

-continued
Compound 38
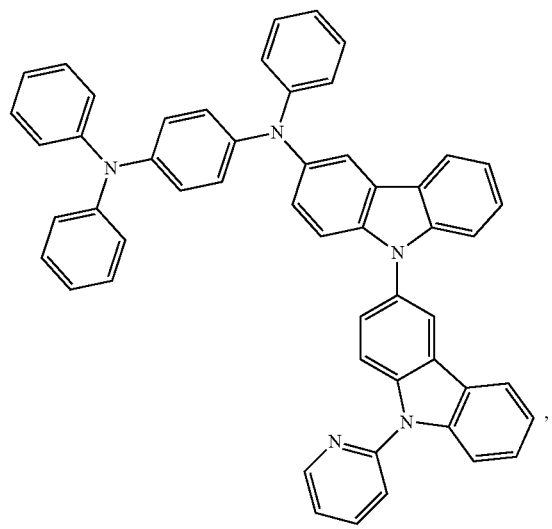
Compound 39
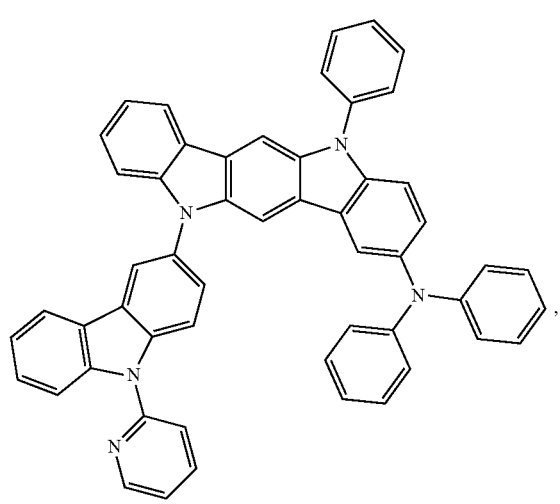
Compound 40
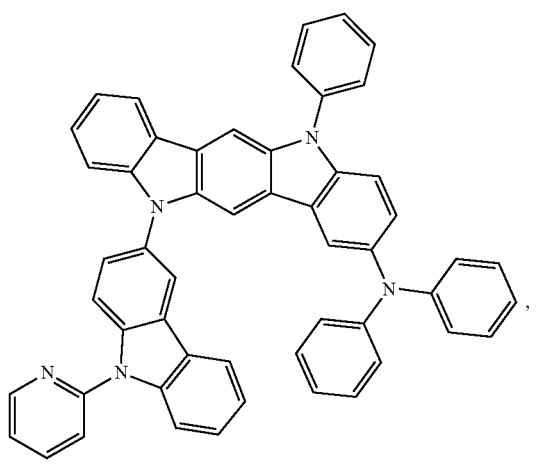
-continued
Compound 45
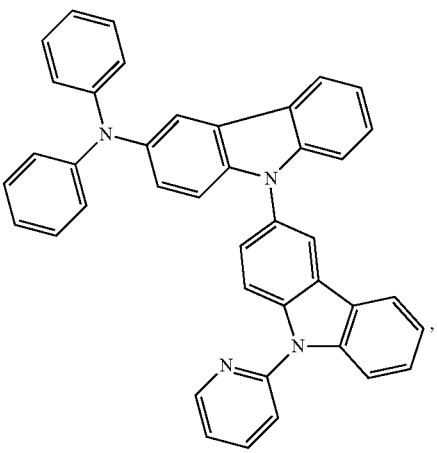
Compound 46
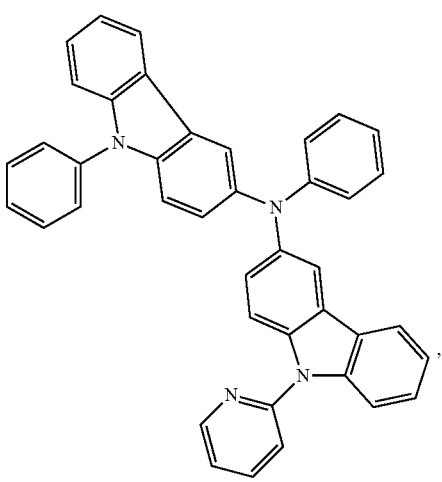
Compound 47
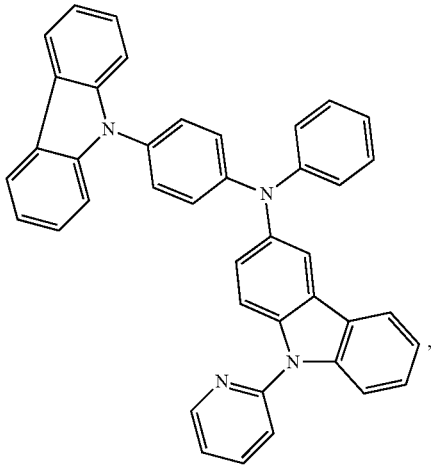

Compound 49
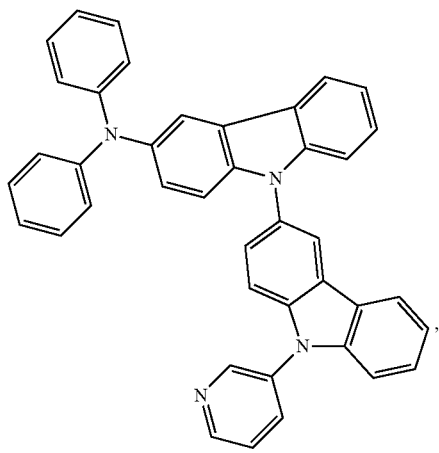
Compound 50
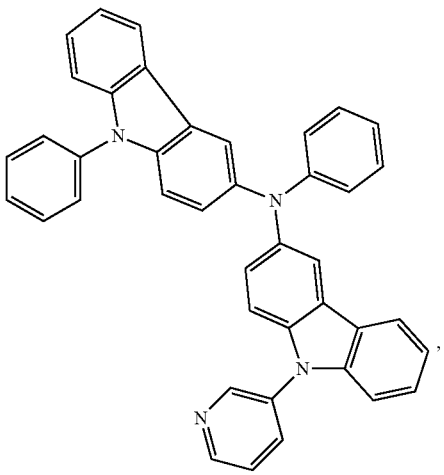
Compound 52
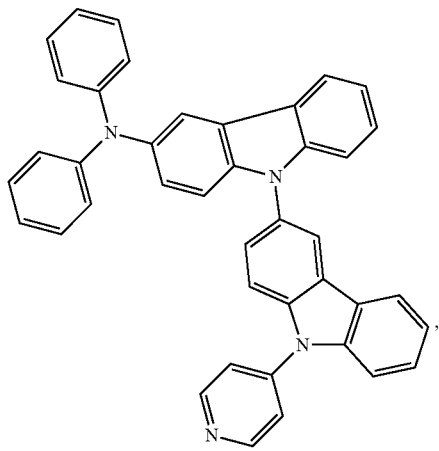
Compound 53
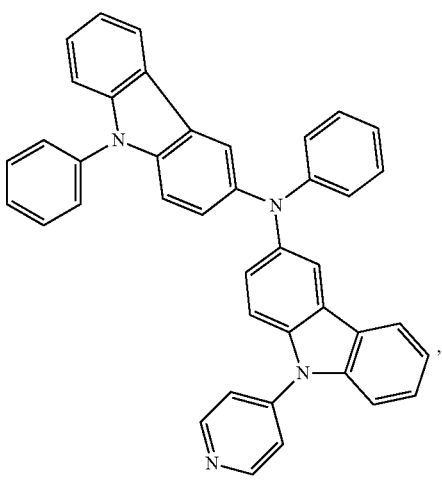
Compound 55
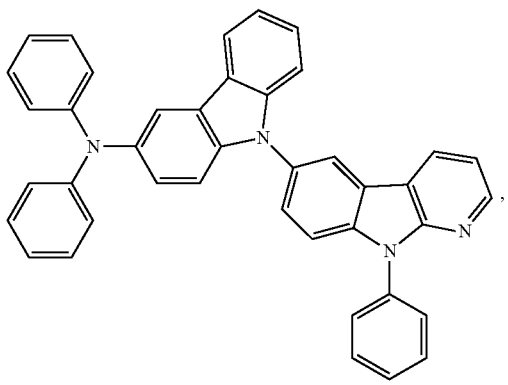
Compound 56
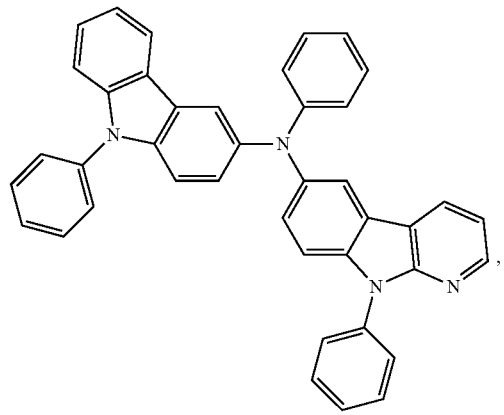

-continued

Compound 58

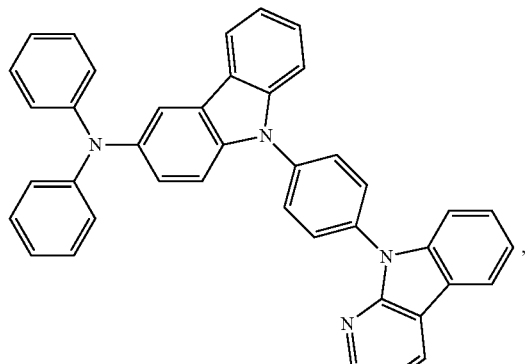

Compound 60

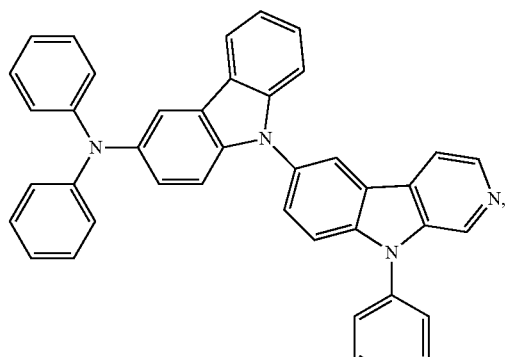

Compound 61

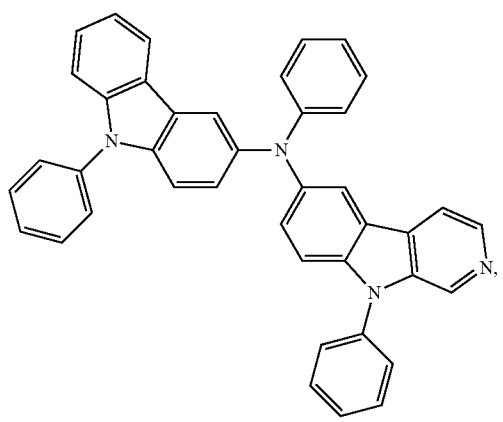

Compound 63

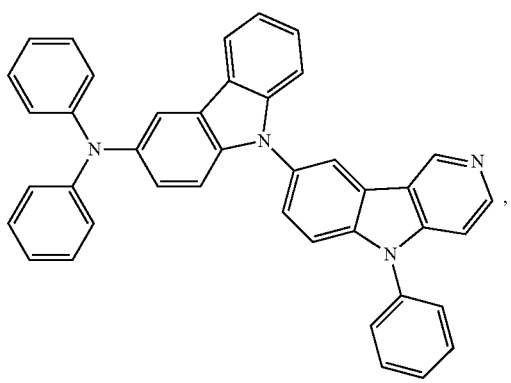

-continued

Compound 65

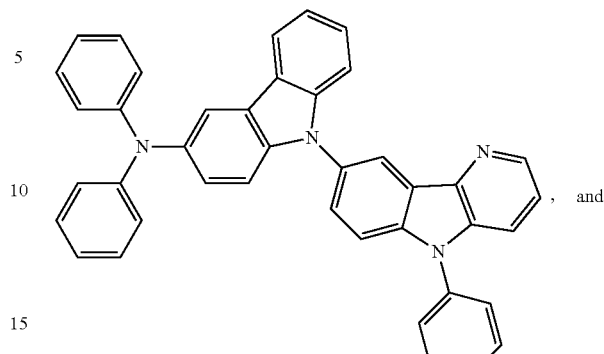

, and

Compound 66

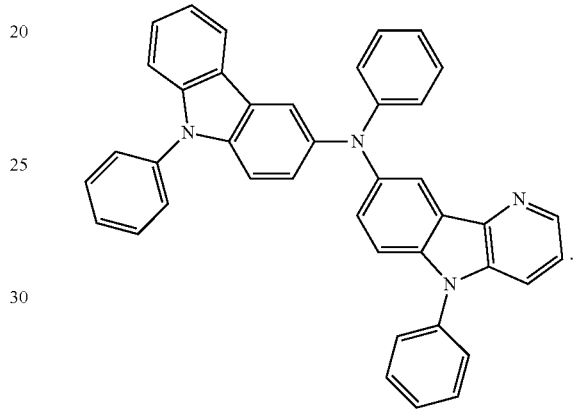

18. The first device of claim 1, wherein the emissive layer further comprises a first phosphorescent emitting material.

19. The first device of claim 18, wherein the emissive layer further comprises a second phosphorescent emitting material.

20. The first device of claim 18, wherein first emissive dopant emits a white light at room temperature when a voltage is applied across the organic light emitting device.

21. The first device of claim 20, wherein the first emissive dopant emits a blue light having a peak wavelength between about 400 nm to about 500 nm.

22. The first device of claim 20, the first emissive dopant emits a yellow light having a peak wavelength between about 530 nm to about 580 nm.

23. The first device of claim 1, wherein the first device comprises a second organic light-emitting device;
wherein the second organic light emitting device is stacked on the first organic light emitting device.

24. The first device of claim 1, wherein the first device is a consumer product.

25. The first device of claim 1, wherein the first device is an organic light-emitting device.

26. The first device of claim 1, wherein the first device comprises a lighting panel.

* * * * *

UNITED STATES PATENT AND TRADEMARK OFFICE
CERTIFICATE OF CORRECTION

PATENT NO.         : 9,190,623 B2                                            Page 1 of 1
APPLICATION NO.    : 13/682504
DATED              : November 17, 2015
INVENTOR(S)        : Raymond Kwong et al.

It is certified that error appears in the above-identified patent and that said Letters Patent is hereby corrected as shown below:

In the Claims:

Claim 9, Column 16, Lines 64-65, delete

"wherein rings $Ar^2$, and $Ar^3$ are phenyl."

and insert

-- wherein rings $Ar^1$, $Ar^2$, and $Ar^3$ are phenyl. --

Signed and Sealed this
Fifteenth Day of March, 2016

Michelle K. Lee
*Director of the United States Patent and Trademark Office*